(12) United States Patent
Ueda et al.

(10) Patent No.: US 7,075,594 B2
(45) Date of Patent: Jul. 11, 2006

(54) LIQUID CRYSTAL DISPLAY DEVICE WITH SIDE LIGHT SHIELDING LAYERS AND METHOD FOR PRODUCING THE SAME

(75) Inventors: Tohru Ueda, Fukuyama (JP);
Kazuhiko Inoguchi, Nara (JP);
Yoshinori Higami, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 97 days.

(21) Appl. No.: 10/614,243

(22) Filed: Jul. 8, 2003

(65) Prior Publication Data

US 2004/0008295 A1 Jan. 15, 2004

(30) Foreign Application Priority Data

Jul. 9, 2002 (JP) ............................... 2002-200578

(51) Int. Cl.
*G02F 1/136* (2006.01)
(52) U.S. Cl. ......................................... 349/44; 349/138
(58) Field of Classification Search .................. 349/44; 257/59, 72; 438/30
See application file for complete search history.

(56) References Cited

U.S. PATENT DOCUMENTS 5,506,165 A * 4/1996 Sato ............................ 438/30
5,784,132 A * 7/1998 Hashimoto .................... 349/44
5,811,866 A * 9/1998 Hirata ......................... 257/435
5,847,792 A * 12/1998 Kobayashi et al. .......... 349/110
6,083,826 A * 7/2000 Kim et al. ................... 438/631
6,449,022 B1 * 9/2002 Fukata et al. ................. 349/44
6,518,081 B1 * 2/2003 Fukata et al. ................. 438/34
6,583,830 B1 6/2003 Yasukawa et al.
6,587,165 B1 * 7/2003 Hashimoto et al. ........... 349/44

FOREIGN PATENT DOCUMENTS

| EP | 0 997 769 A2 | 5/2000 |
| JP | 2000-356787 | 12/2000 |
| JP | 2001-242443 | 9/2001 |
| KR | 2000-0071625 | 11/2000 |

OTHER PUBLICATIONS

Korean Office Action dated Jun. 23, 2005.
KR 2002-0026192 dated Apr. 6, 2002 (U.S. counterpart 6,583,830 list above).

* cited by examiner

*Primary Examiner*—Andrew Schechter
*Assistant Examiner*—Richard Kim
(74) *Attorney, Agent, or Firm*—Nixon & Vanderhye P.C.

(57) ABSTRACT

A liquid crystal display device includes an active matrix substrate; a counter substrate; and a liquid crystal layer interposed between the active matrix substrate and the counter substrate. The active matrix substrate includes a plate; a thin film transistor provided on the plate; and a side light shielding layer for covering at least a portion of a side surface of the thin film transistor.

26 Claims, 43 Drawing Sheets

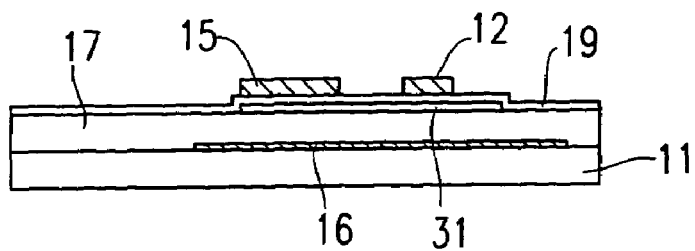
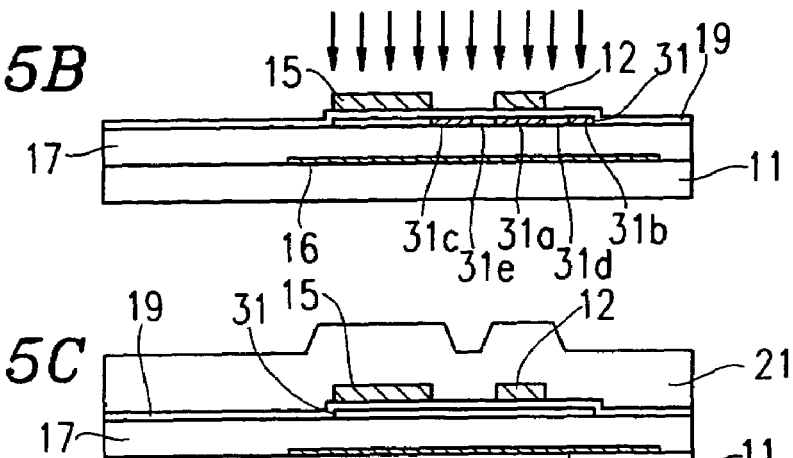
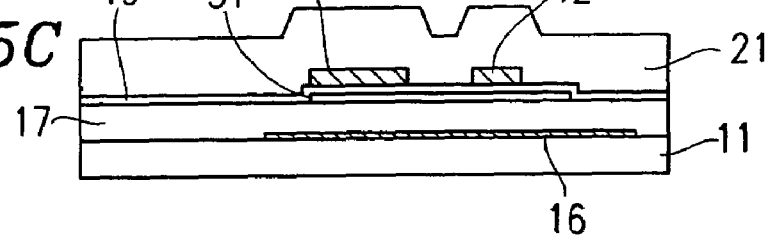
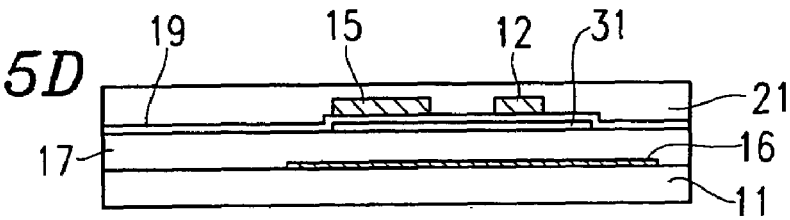
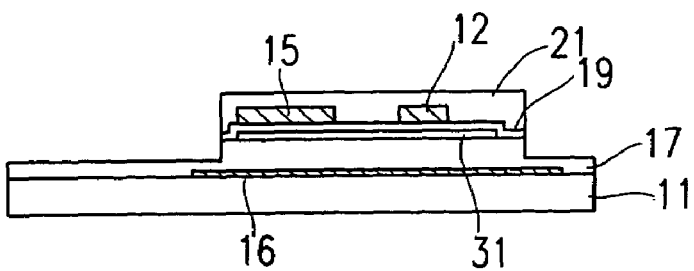
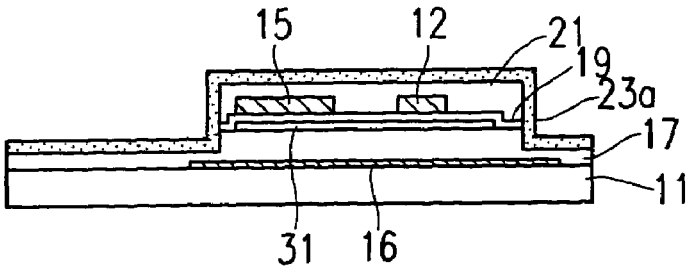

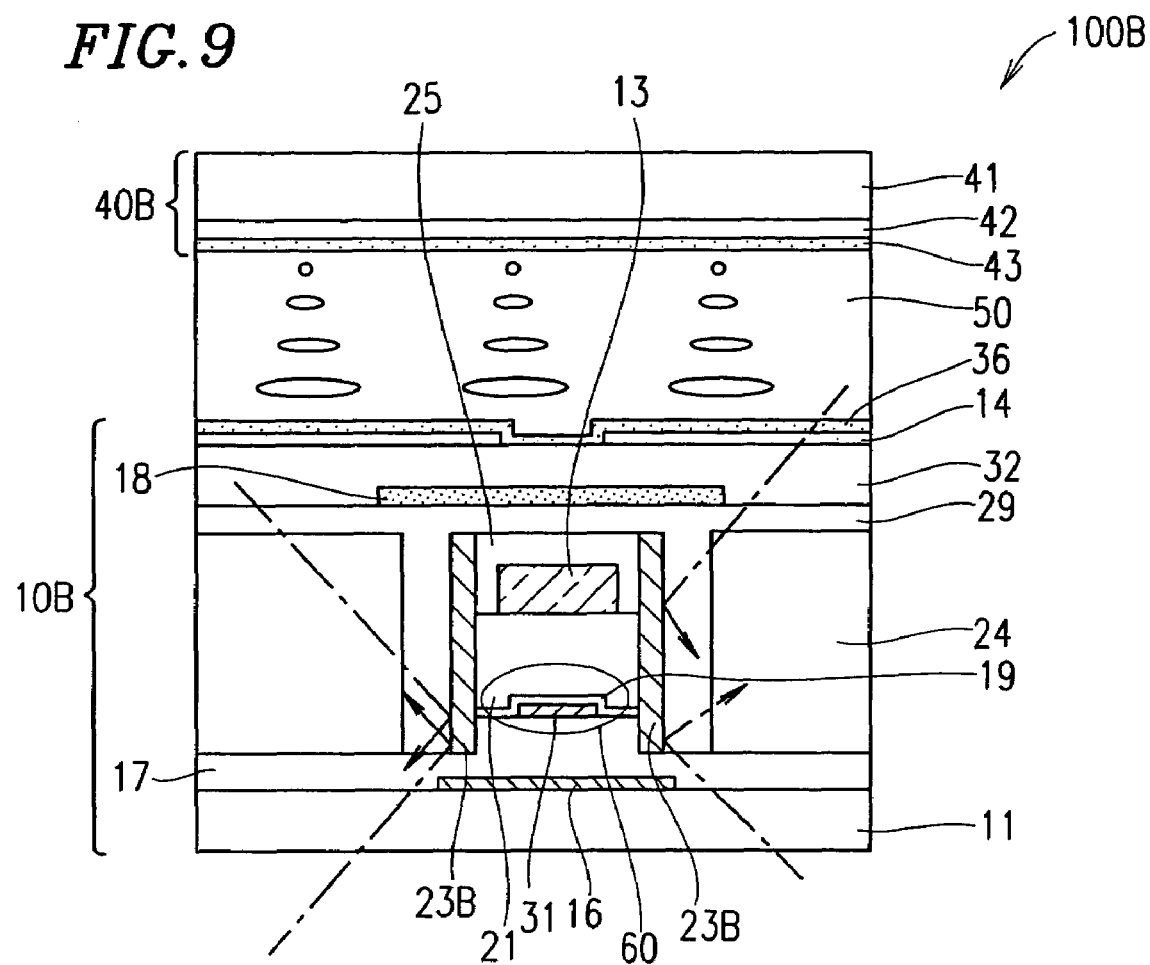

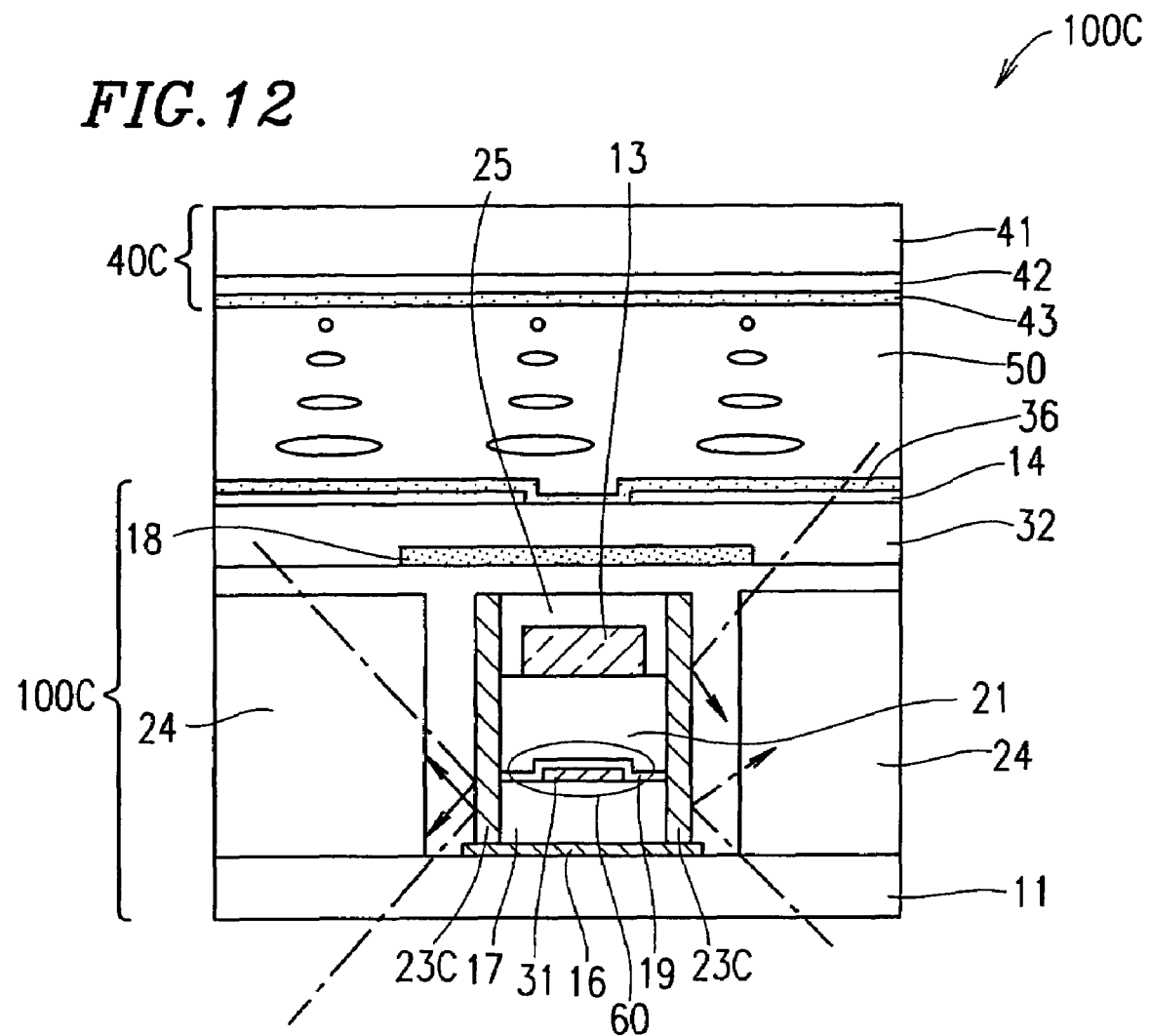

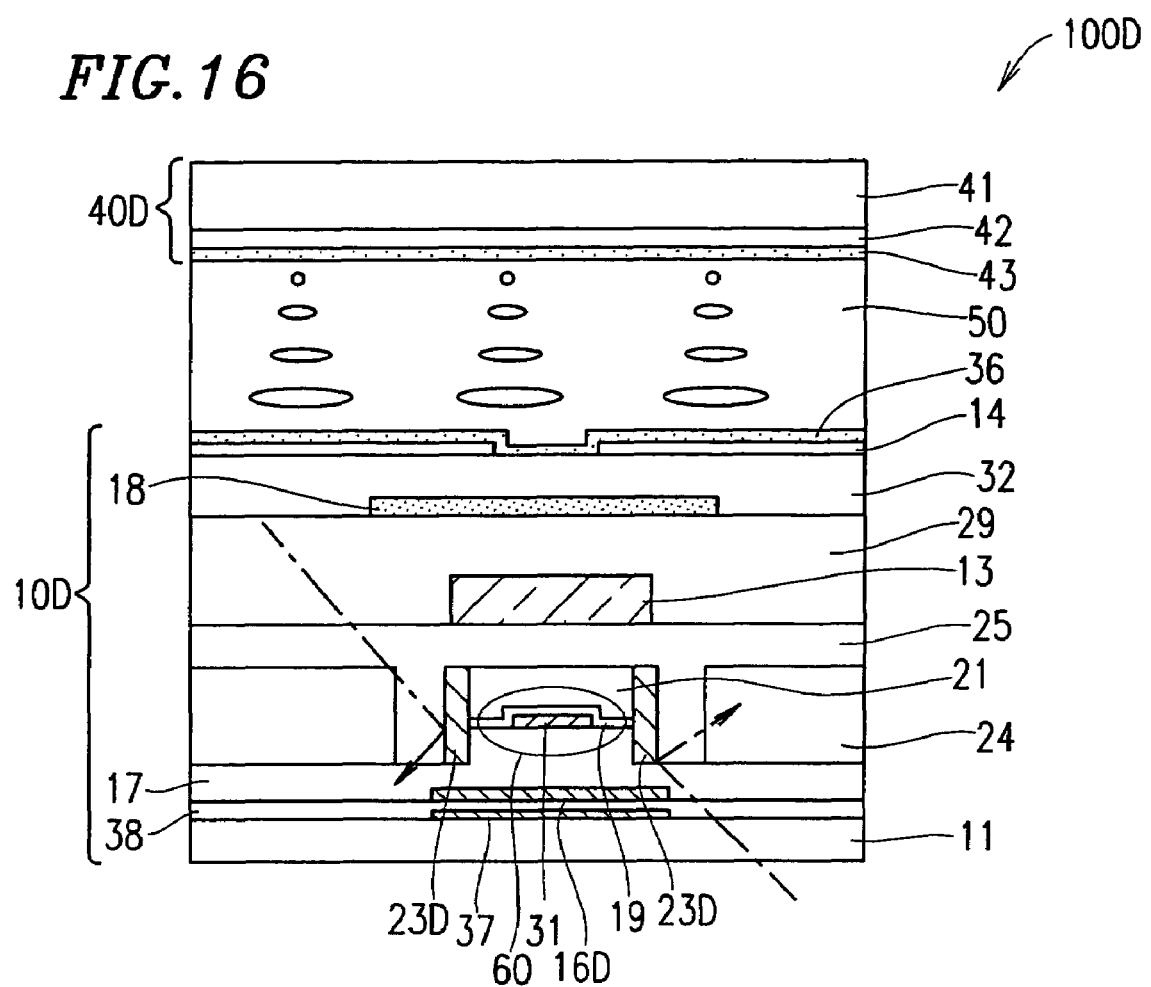

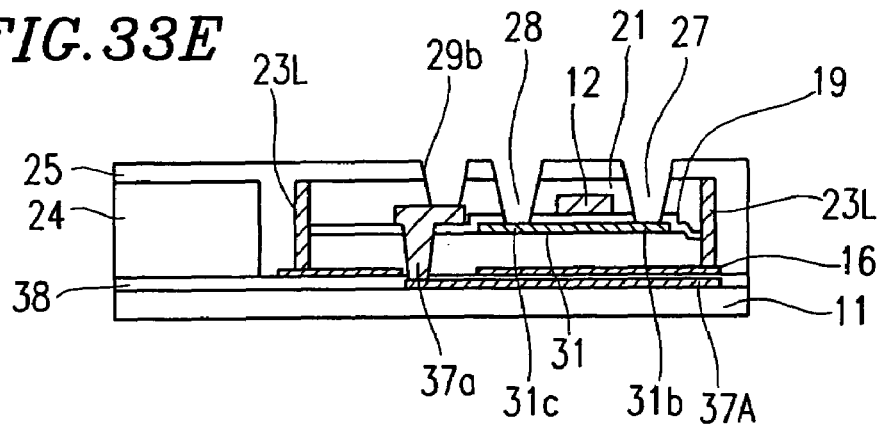
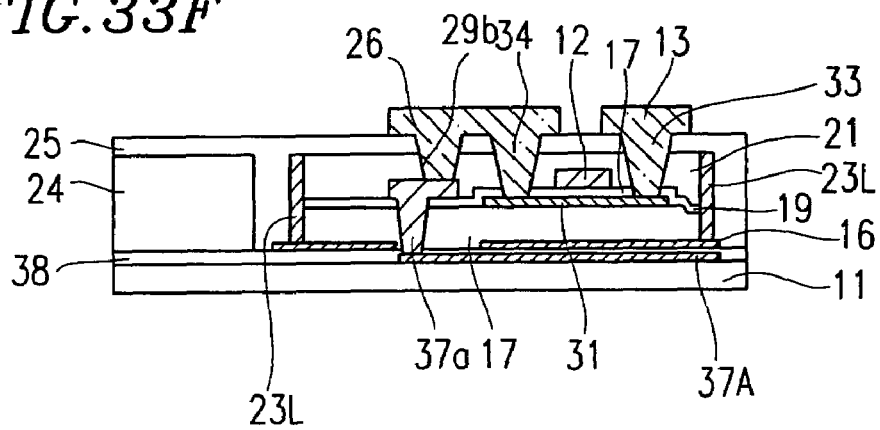
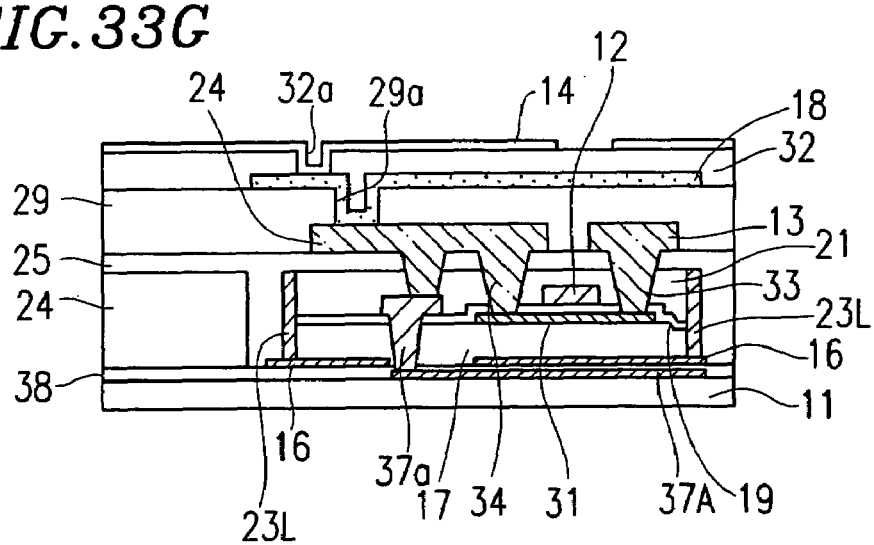

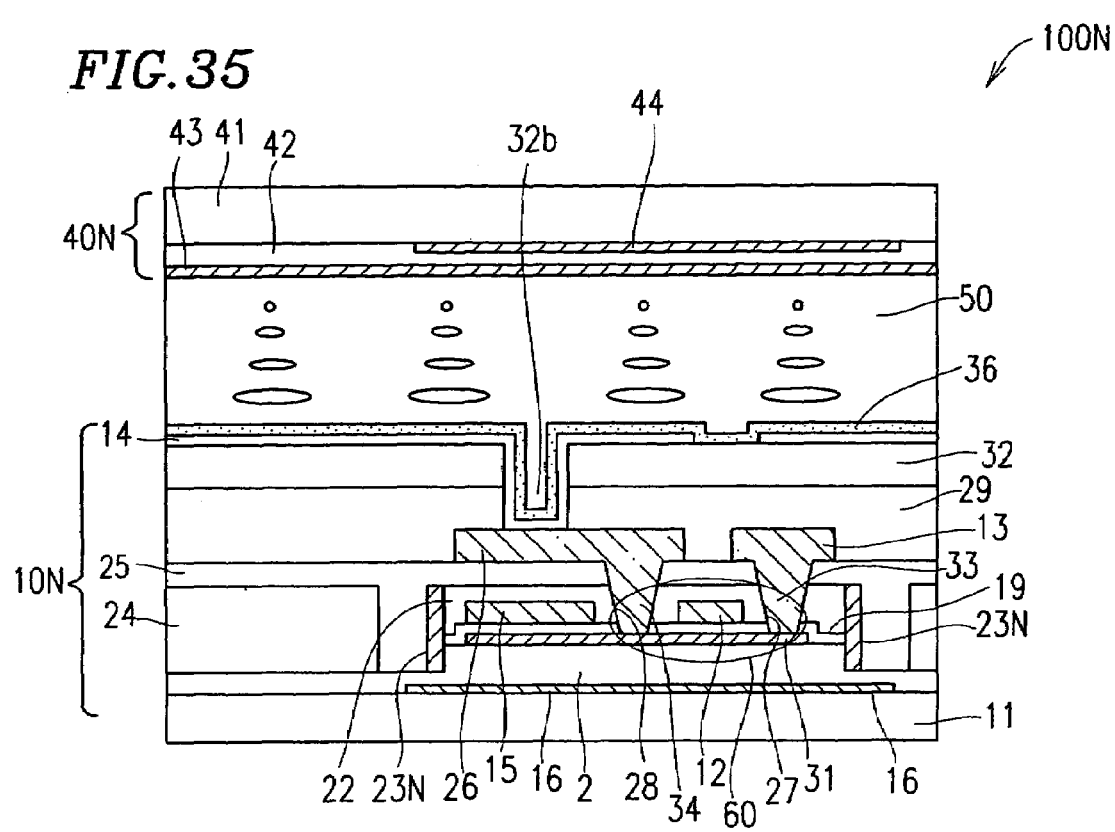

LIQUID CRYSTAL DISPLAY DEVICE WITH SIDE LIGHT SHIELDING LAYERS AND METHOD FOR PRODUCING THE SAME

BACKGROUND OF THE INVENTION

1. Field of the Invention

The present invention relates to a liquid crystal display device and a method for producing the same.

2. Description of the Related Art

One known type of liquid crystal display device is an active matrix liquid crystal display device including an active matrix substrate including a plurality of pixel electrodes arranged in a matrix and a counter substrate including a counter electrode. The active matrix substrate and the counter substrate are located so as to hold a liquid crystal layer therebetween. In such a liquid crystal display device, the active matrix substrate usually has thin film transistors (TFT) respectively for applying a voltage to the pixel electrodes.

Such an active matrix liquid crystal display device is often used as one element of a projector apparatus. However, when a liquid crystal display device is used for a projector apparatus, the liquid crystal display device is exposed to a high intensity of light.

When the TFTs provided on the active matrix substrate of the liquid crystal display device are exposed to the high intensity of light, there is an undesirable possibility that a leak current is generated in the TFTs. When this occurs, the quality of images displayed by the liquid crystal display device may be lowered due to, for example, reduction of contrast of the liquid crystal display device and generation of crosstalk.

In order to solve these problems, it is known to provide a light shielding layer on the active matrix substrate so as to prevent light from being incident on the TFTs.

For example, Japanese Laid-Open Publication No. 2001-242443 discloses a liquid crystal display device which includes an active matrix substrate including an upper light shielding layer above the TFTs and below the pixel electrodes and a lower light shielding layer below the TFTs.

With reference to FIGS. 37A through 39, a conventional liquid crystal display device 1000 will be described. The following description will be presented regarding an area of a liquid crystal display device corresponding to one TFT for the sake of simplicity.

FIGS. 37A and 37B are each a schematic plan view of a portion of an active matrix substrate 110 of the liquid crystal display device 1000 where one gate line 112 and one signal line 113 cross each other.

FIGS. 37A and 37B each show only one gate line 112 and one signal line 113, but the active matrix substrate 110 includes a plurality of gate lines 112 and a plurality of signal lines 113.

The plurality of gate lines 112 are generally provided above a transparent plate 111 (FIG. 38) of the active matrix substrate 110 and parallel to each other. The plurality of signal lines 113 are generally provided above the transparent plate 111 and parallel to each other. The gate lines 112 and the signal lines 113 generally cross each other.

FIGS. 37A and 37B represent the same liquid crystal display device 1000 such that the positions of light shielding layers are clear as explained below.

In FIG. 37A, an upper light shielding layer 118 provided above a TFT 160 is hatched so as to clearly show the position thereof. The upper light shielding layer 118 acts to prevent light from being incident on the TFT 160 from above the active matrix substrate 110.

In FIG. 37B, a lower light shielding layer 116 provided below the TFT 160 is dotted so as to clearly show the position thereof. The lower light shielding layer 116 acts to prevent light from being incident on the TFT 160 from below the active matrix substrate 110.

As shown in FIG. 37A, the upper light shielding layer 118 is provided so as to cover a first contact hole 127, the gate line 112, the signal line 113, a portion of a polycrystalline silicon (Si) layer 131, a portion of a capacitance electrode 115 and a portion of the TFT 160.

As shown in FIG. 37B, the lower light shielding layer 116 is provided so as to cover a portion of the gate line 112, the signal line 113, the first contact hole 127, a second contact hole 128, a third contact hole 129a, a fourth contact hole 132a, the polycrystalline silicon (Si) layer 131, and the TFT 160.

As described above, the active matrix substrate 110 includes the plurality of gate lines 112 and the plurality of signal lines 113 crossing each other perpendicularly.

In an area surrounded by two gate lines 112 and two signal lines 113, a pixel electrode 114 is provided.

The capacitance electrode 115 is provided in the vicinity of the gate line 112 so as to be parallel to the gate line 112. The capacitance electrode 115 is formed such that a width of the capacitance electrode 115 is larger than the width of the gate line 112.

The polycrystalline silicon layer 131 of n-type used as a part of the TFT 160 is provided below a portion of the signal line 113 which crosses the gate line 112. The width of the polycrystalline silicon layer 131 is smaller than the width of the signal line 113. The polycrystalline silicon layer 131 includes a channel region 131a, a lightly doped drain (LDD) region (N⁻) 131d provided between the channel region 131a and the first contact hole 127, and a lightly doped drain (LDD) region (N⁻) 131e provided between the channel region 131a and the second contact hole 128.

The polycrystalline silicon layer 131 extends along the signal line 113 so as to cross the gate line 112. The polycrystalline silicon layer 131 has a branch portion extending so as to be below the capacitance electrode 115. The branch portion below the capacitance electrode 115 has a width smaller than the width of the capacitance electrode 115.

The lower light shielding layer 116 is provided below the polycrystalline silicon layer 131. The width of the lower light shielding layer 116 is larger than the width of the polycrystalline silicon layer 131. The lower light shielding layer 116 is provided so as to cover the polycrystalline silicon layer 131 from below and to cover the gap between the capacitance electrode 115 and the gate line 112 in the vicinity thereof.

In the first contact hole 127, a source electrode 133 of the TFT 160 is provided.

In the second contact hole 128, a drain electrode 134 of the TFT 160 is provided. FIG. 38 is a schematic cross-sectional view of the liquid crystal display device 1000 taken along line A—A of FIGS. 37A and 37B, and FIG. 39 is a schematic cross-sectional view of the liquid crystal display device 1000 taken along line B—B of FIGS. 37A and 37B.

As shown in FIGS. 38 and 39, the liquid crystal display device 1000 includes the active matrix substrate 110 and a counter substrate 140, and a liquid crystal layer 150 interposed between the active matrix substrate 110 and the counter substrate 140.

The counter substrate 140 includes a transparent plate 141 formed of quartz glass, a transparent electrode 142 provided on the transparent plate 141, and an alignment layer 143 provided on the transparent electrode 142.

The active matrix substrate 110 includes the transparent plate 111 formed of quartz glass.

The lower light shielding layer 116 is provided on the transparent plate 111, and a first interlayer insulating layer 117 is provided on the transparent plate 111 so as to cover the lower light shielding layer 116.

The polycrystalline silicon layer 131 is provided on the first interlayer insulating layer 117, and a second interlayer insulating layer (gate insulating layer) 119 is provided on the first interlayer insulating layer 117 so as to cover the polycrystalline silicon layer 131.

The gate line 112 and the capacitance electrode 115 are provided on the second interlayer insulating layer 119.

A third interlayer insulating layer 121 is provided on the second interlayer insulating layer 119 so as to cover the gate line 112 and the capacitance electrode 115.

The first contact hole 127 and the second contact hole 128 are formed in the second interlayer insulating layer 119 and the third interlayer insulating layer 121.

The first contact hole 127 is filled with a conductive material which is the same as the material of the signal line 113 so as to form the source electrode 133 of the TFT 160. The source electrode 133 electrically connects the signal line 113 and a source region of the polycrystalline silicon layer 131.

The signal line 113 is provided on the third interlayer insulating layer 121 in a prescribed pattern.

The second contact hole 128 is filled with a conductive which is the same as the material of a connecting electrode 126 so as to form the drain electrode 134 of the TFT 160. The drain electrode 134 electrically connects the connecting electrode 126 and a drain region of the polycrystalline silicon layer 131.

The connecting electrode 126 is formed on the third interlayer insulating layer 121 in a rectangular pattern.

A first flat layer 125 is provided on the third interlayer insulating layer 121 so as to cover the signal lines 113 and the connecting electrode 126. The upper light shielding layer 118 (black matrix) is provided on the first flat layer 125. The upper light shielding layer is formed of a conductive material.

The third contact hole 129a is formed in the first flat layer 125 covering the connecting electrode 126. The upper light shielding layer 118 is electrically connected to the connecting electrode 126 via the third contact hole 129a.

A second flat layer 129 is provided on the first flat layer 125 so as to cover the upper light shielding layer 118.

The fourth contact hole 132a is formed in the second flat layer 129 in the vicinity of the third contact hole 129a.

The plurality of pixel electrodes 114 are provided on the second flat layer 129, and each pixel electrode 114 is connected to the upper light shielding layer 118 via the fourth contact hole 132a.

An alignment layer 136 is provided on the second flat layer 129 so as to cover the plurality of pixel electrodes 114.

The active matrix substrate 110 and the counter substrate 140 are located such that alignment layer 136 of the active matrix substrate 110 and the alignment layer 143 of the counter substrate 140 are opposed to each other with a prescribed distance therebetween. The liquid crystal layer 150 is provided between the alignment layer 136 and the alignment layer 143. Thus, the liquid crystal display device 1000 is completed.

The liquid crystal display device 1000 is produced in the following manner.

First, on the transparent plate 111 formed of quartz glass, a polycrystalline silicon layer doped with P (phosphorus) and a WSi layer are sequentially formed and patterned, thereby forming the lower light shielding layer 116.

Next, an $SiO_2$ layer is formed by, for example, CVD on the entire surface of the transparent plate 111 so as to cover the lower light shielding layer 116, thereby forming the first interlayer insulating layer 117.

A polycrystalline silicon layer is formed by, for example, CVD on the entire surface of the first interlayer insulating layer 117, and patterned into a prescribed shape, thereby forming the polycrystalline silicon layer 131.

Another $SiO_2$ layer is formed on the entire surface of the first interlayer insulating layer 117 by, for example, CVD so as to cover the polycrystalline silicon layer 131, and patterned as prescribed, thereby forming the second interlayer insulating layer (gate insulating layer) 119.

A polycrystalline silicon layer doped with P and a WSi layer are sequentially formed on the entire surface of the first interlayer insulating layer 117 so as to cover the second interlayer insulating layer 119, and patterned as prescribed, thereby forming the gate line 112 and the capacitance electrode 115. The capacitance electrode 115 is for a storage capacitance device.

Then, an $SiO_2$ layer, for example, is formed on the entire surface of the second interlayer insulating layer 119 so as to cover the resultant laminate by, for example, CVD, thereby forming the third interlayer insulating layer 121.

Prescribed portions of the second interlayer insulating layer 119 and the third interlayer insulating layer 121 are etched, thereby forming the first contact hole 127 and the second contact hole 128.

The formation of the first contact hole 127 and the second contact hole 128 in the second interlayer insulating layer 119 and the third interlayer insulating layer 121 exposes a portion of the polycrystalline silicon layer 131 from the first contact hole 127 and the second contact hole 128.

A WSi layer or an Al layer and a WSi layer are sequentially formed on the third interlayer insulating layer 121 so as to cover the resultant laminate, and patterned as prescribed, thereby forming the source electrode 133 and the drain electrode 134 of the TFT 160, the connecting electrode 126 and the signal line 113.

Then, an $SiO_2$ layer is formed by, for example, atmospheric pressure CVD on the entire surface of the third interlayer insulating layer 121 so as to cover the resultant laminate. An SiN layer, for example, is formed by, for example, plasma CVD on the $SiO_2$ layer, and patterned as prescribed.

An $SiO_2$ layer is formed by, for example, plasma CVD using TEOS (tetraethylorthosilicate) as a material gas so as to cover the patterned SiN layer. At this point, the thickness of the $SiO_2$ layer is, for example, about 2500 nm.

The $SiO_2$ layer is polished by CMP (chemical mechanical polishing) to a thickness of, for example, 2200 nm, and thus flattened. The post-flattening step level can be 0.5 µm or less, or even 0.1 µm or less depending on the conditions.

A prescribed portion of the flattened $SiO_2$ layer is etched, thereby forming the first flat layer 125 having the third contact hole 129a.

Then, a Ti layer is formed by, for example, vapor deposition or sputtering on the first flat layer 125 so as to cover the fourth contact hole 132a, and patterned as prescribed, thereby forming the upper light shielding layer 118. The upper light shielding layer 118 is conductive.

Then, the second flat layer 129 is formed by SOG (spin-on-glass) on intermediate layer (not shown) so as to cover the upper light shielding layer 118. The second flat layer 129 may be formed by CMP. The intermediate layer is formed of an SiO$_2$ layer by plasma CVD using, for example, TEOS as a material gas.

A prescribed portion of the second flat layer 129 is etched, thereby forming the fourth contact hole 132*a*.

An ITO layer is formed on the entire surface of the second flat layer 129 so as to cover the fourth contact hole 132*a* to a thickness of, for example, about 70 nm, and patterned as prescribed, thereby forming pixel electrodes 114.

In this manner, the active matrix substrate 110 is produced.

The counter substrate 140 is formed by forming the transparent electrode 142 on the entire surface of the transparent plate 141, and then forming the alignment layer 143 on the entire surface of the transparent electrode 142.

The active matrix substrate 110 and the counter substrate 140 are located such that the alignment layers 136 and 143 thereof are opposed to each other with a prescribed distance therebetween. A liquid crystal layer 150 is provided between the alignment layers 136 and 143. Thus, the liquid crystal display device 1000 is produced.

In the liquid crystal display device 1000 having such a structure, the upper light shielding layer 118 shields light from being incident on the TFT 160 of the active matrix substrate 110 after being incident on and passing through the counter substrate 140. The lower light shielding layer 116 shields light from being incident on the TFT 160 after being incident on a bottom surface of the transparent plate 111 of the active matrix substrate 110 and passing through the transparent plate 111, and also light from being incident on the TFT 160 after passing through the transparent plate 111 and reflected by the optical system (not shown).

In order for the upper light shielding layer 118 and the lower light shielding layer 116 to shield light from being incident on the TFT 160 with certainty, the upper light shielding layer 118 and the lower light shielding layer 116 are formed so as to be larger than the TFT 160.

However, when the upper light shielding layer 118 and the lower light shielding layer 116 become larger, the area of the opening regions of the liquid crystal layer 150 through which the light is transmitted becomes smaller, which reduces the numerical aperture.

When the sizes of the upper light shielding layer 118 and the lower light shielding layer 116 are set to be appropriate for obtaining a sufficient numerical aperture, light obliquely incident on the active matrix substrate 110, light incident on the bottom surface of the transparent plate 111, light reflected by the optical system and the like cannot be shielded with certainty. In addition, light is multiple-reflected between the upper light shielding layer 118 above the TFT 160 and the lower light shielding layer 116 below the TFT 160, which may undesirably result in light being incident on the TFT 160.

SUMMARY OF THE INVENTION

According to one aspect of the invention, a liquid crystal display device includes an active matrix substrate; a counter substrate; and a liquid crystal layer interposed between the active matrix substrate and the counter substrate. The active matrix substrate includes a plate; a thin film transistor provided on the plate; and a side light shielding layer for covering at least a portion of a side surface of the thin film transistor.

In one embodiment of the invention, the active matrix substrate further includes a semiconductor layer. The thin film transistor includes a part of the semiconductor layer.

In one embodiment of the invention, the thin film transistor includes a gate electrode, a source electrode, and a drain electrode. The active matrix substrate further includes a pixel electrode, a gate line acting as the gate electrode of the thin film transistor, and a signal line connected to the source electrode of the thin film transistor.

In one embodiment of the invention, the active matrix substrate further includes an insulating layer provided on the plate and having a stepped portion having a side wall substantially perpendicular to the plate; the semiconductor layer is provided on the stepped portion of the insulating layer; and the side light shielding layer is provided along the side wall of the stepped portion of the insulating layer.

In one embodiment of the invention, the active matrix substrate further includes a lower light shielding layer provided below the thin film transistor.

In one embodiment of the invention, the side light shielding layer is in contact with the lower light shielding layer.

In one embodiment of the invention, the active matrix substrate further includes an upper light shielding layer provided on the thin film transistor.

In one embodiment of the invention, the side light shielding layer is provided so as to cover a side surface of the gate line.

In one embodiment of the invention, the side light shielding layer is provided so as to cover a side surface of the signal line.

In one embodiment of the invention, the active matrix substrate further includes an additional capacitance electrode.

In one embodiment of the invention, the additional capacitance electrode is provided below the lower light shielding layer.

In one embodiment of the invention, the additional capacitance electrode is provided between the lower light shielding layer and the thin film transistor.

In one embodiment of the invention, the additional capacitance electrode is connected to the thin film transistor.

In one embodiment of the invention, the side light shielding layer is in contact with the additional capacitance electrode.

In one embodiment of the invention, the thin film transistor has an LDD structure.

In one embodiment of the invention, the side light shielding layer is formed of polycrystalline silicon.

In one embodiment of the invention, the side light shielding layer is formed of metal or metal silicide.

In one embodiment of the invention, the side light shielding layer has a two-component structure including metal or metal silicide and polycrystalline silicon.

According to another aspect of the invention, a method for producing a liquid crystal display device including an active matrix substrate, a counter substrate, and a liquid crystal layer interposed between the active matrix substrate and the counter substrate is provided. The method includes the steps of forming a thin film transistor on a plate of the active matrix substrate; and forming a side light shielding layer for covering at least a portion of a side surface of the thin film transistor.

In one embodiment of the invention, the step of forming the thin film transistor includes the step of forming a semiconductor layer used as a part of the thin film transistor.

In one embodiment of the invention, the method further includes the step of forming a first insulating layer on the plate, the first insulating layer having a stepped portion having a side wall substantially perpendicular to the plate. The step of forming the semiconductor layer includes the step of forming the semiconductor layer on the stepped portion of the first insulating layer. The step of forming the side light shielding layer includes the step of forming the side light shielding layer along the side wall of the stepped portion of the first insulating layer.

In one embodiment of the invention, the step of forming the side light shielding layer includes the steps of forming a layer of a material of the side light shielding layer so as to cover the stepped portion of the first insulating layer, and partially removing the layer by dry etching.

In one embodiment of the invention, the method further includes the steps of forming a second insulating layer on the semiconductor layer, and flattening a surface of the second insulating layer before the stepped portion of the first insulating layer is formed.

In one embodiment of the invention, the step of flattening the surface of the second insulating layer includes the step of flattening the second insulating layer by chemical mechanical polishing.

Thus, the invention described herein makes possible the advantages of providing a liquid crystal display device for shielding light, for example, from being obliquely incident on an active matrix substrate, from being incident on a bottom surface of the active matrix substrate and reflected by the optical system, and from being incident on a TFT after being multiple-reflected between an upper light shielding layer above the TFT and a lower light shielding layer below the TFT (i.e., from being laterally incident on the TFT), without reducing the numerical aperture; and a method for producing the same.

These and other advantages of the present invention will become apparent to those skilled in the art upon reading and understanding the following detailed description with reference to the accompanying figures.

BRIEF DESCRIPTION OF THE DRAWINGS

FIGS. 5A through 5K are schematic cross-sectional views illustrating steps for producing an active matrix substrate of the liquid crystal display device according to the first example;

FIG. 9 is a schematic cross-sectional view of the liquid crystal display device according to a second example of the present invention;

FIG. 12 is a schematic cross-sectional view of a liquid crystal display device as a modification of the second example of the present invention;

FIG. 16 is a schematic cross-sectional view of the liquid crystal display device shown in FIGS. 15A and 15B taken along line A—A of FIGS. 15A and 15B;

FIGS. 33A through 33G are schematic cross-sectional views illustrating steps for producing an active matrix substrate of the liquid crystal display device according to the seventh example;

FIG. 35 is a schematic cross-sectional view of a liquid crystal display device according to an eighth example of the present invention;

DESCRIPTION OF THE PREFERRED EMBODIMENTS

Hereinafter, the present invention will be described by way of illustrative examples with reference to the accompanying drawings.

In this specification, when describing a layer formed on another layer, the term "on" does not necessarily mean that the layers are in contact with one another.

In this specification, the description is presented regarding an area of a liquid crystal display device corresponding to one TFT for the sake of simplicity.

EXAMPLE 1

Figure 1A:
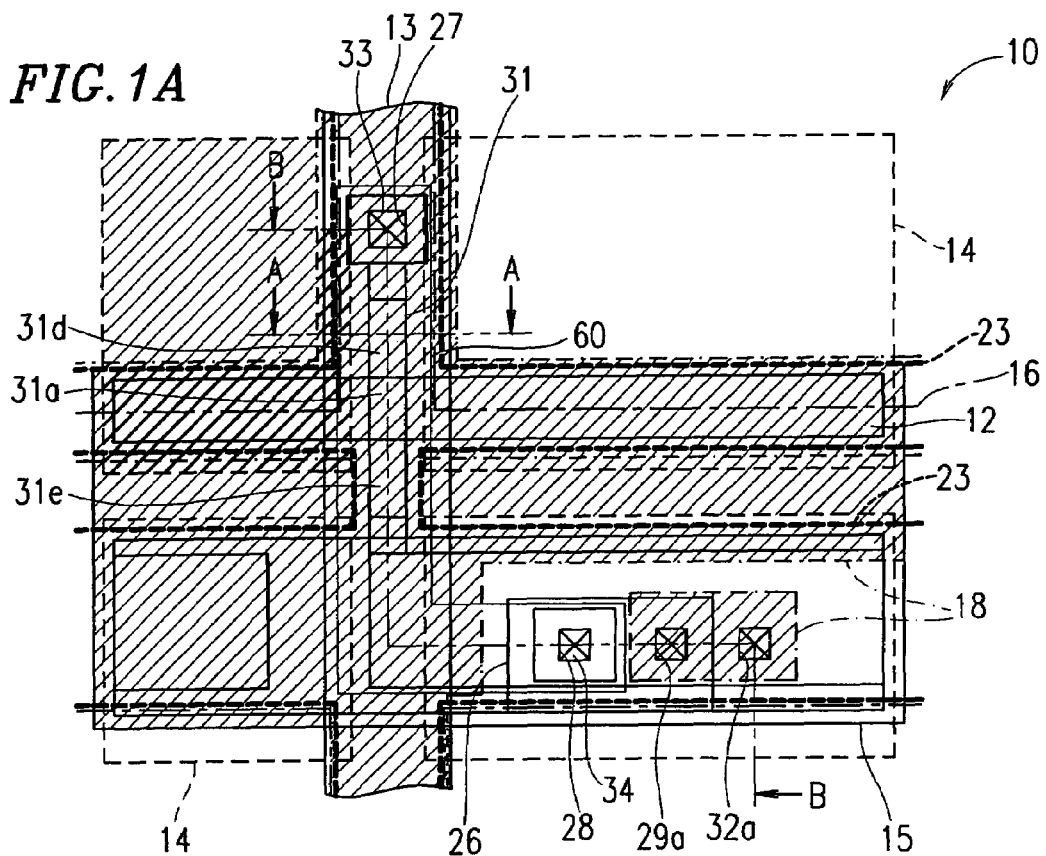
FIGS. 1A and 1B are each a schematic plan view of a portion of an active matrix substrate of a liquid crystal display device according to a first example of the present invention, where one gate line and one signal line cross each other.
Figure 1B:
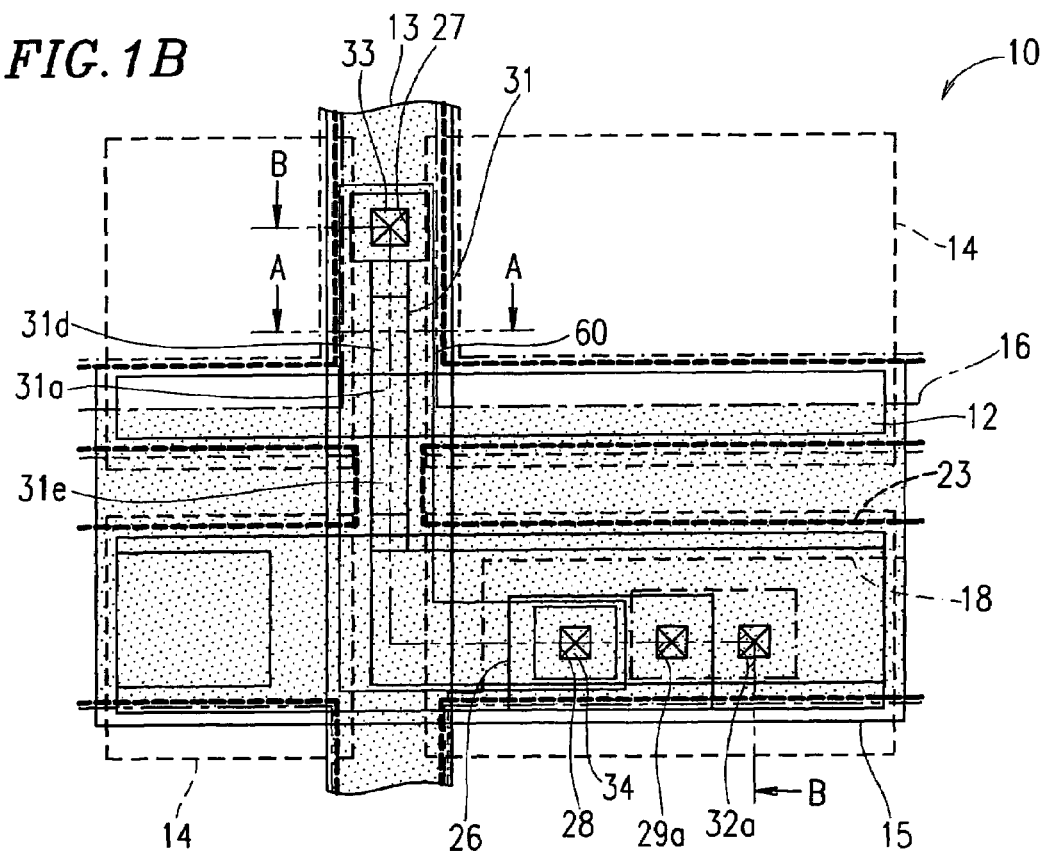

FIGS. 1A and 1B are each a schematic plan view of a portion of an active matrix substrate 10 of a liquid crystal display device 100, according to a first example of the present invention, where one gate line 12 and one signal line 13 cross each other.

FIGS. 1A and 1B each show only one gate line 12 and one signal line 13, but the active matrix substrate 10 includes a plurality of gate lines 12 and a plurality of signal lines 13 crossing each other perpendicularly.

The plurality of gate lines 12 are provided above a transparent plate 11 (FIG. 2) of the active matrix substrate 10 and parallel to each other. The plurality of signal lines 13 are provided above the transparent plate 11 and parallel to each other. The gate lines 12 and the signal lines 13 cross each other.

FIGS. 1A and 1B represent the same liquid crystal display device 100 such that the positions of light shielding layers are clear as explained below.

In FIG. 1A, an upper light shielding layer 18 provided above a TFT 60 is hatched so as to clearly show the position thereof. The upper light shielding layer 18 acts to prevent light from being incident on the TFT 60 from above the active matrix substrate 10.

In FIG. 1B, a lower light shielding layer 16 provided below the TFT 60 is dotted so as to clearly show the position thereof. The lower light shielding layer 16 acts to prevent light from being incident on the TFT 60 from below the active matrix substrate 10.

As shown in FIG. 1A, the upper light shielding layer 18 is provided so as to cover a first contact hole 27, the gate line 12, the signal line 13, a portion of a polycrystalline silicon (Si) layer 31, a portion of a capacitance electrode 15 and a portion of the TFT 60.

As shown in FIG. 1B, the lower light shielding layer 16 is provided so as to cover a portion of the gate line 12, the signal line 13, the first contact hole 27, a second contact hole 28, a third contact hole 29a, a fourth contact hole 32a, the polycrystalline silicon (Si) layer 31, and the TFT 60.

As described above, the active matrix substrate 10 includes the plurality of gate lines 12 and the plurality of signal lines 13.

In an area surrounded by two gate lines 12 and two signal lines 13, a pixel electrode 14 is provided.

The capacitance electrode 15 is provided in the vicinity of the gate line 12 so as to be parallel to the gate line 12. The capacitance electrode 15 is formed such that a width of the capacitance electrode 15 is larger than the width of the gate line 12.

The polycrystalline silicon layer 31 of n-type used as a part of the TFT 60 is provided below a portion of the signal line 13 which crosses the gate line 12. The polycrystalline silicon layer 31 is a type of semiconductor layer. The polycrystalline silicon layer 31 has an LDD (lightly doped drain) structure. The width of the polycrystalline silicon layer 31 is smaller than the width of the signal line 13. The polycrystalline silicon layer 31 includes a channel region 31a, a lightly doped drain (LDD) region (N⁻) 31d provided between the channel region 31a and the first contact hole 27, and a lightly doped drain (LDD) region (N⁻) 31e provided between the channel region 31a and the second contact hole 28.

The polycrystalline silicon layer 31 extends along the signal line 13 so as to cross the gate line 12. The polycrystalline silicon layer 31 has a branch portion extending so as to be below the capacitance electrode 15. The branch portion below the capacitance electrode 15 has a width smaller than the width of the capacitance electrode 15.

The lower light shielding layer 16 is provided below the polycrystalline silicon layer 31. The width of the lower light shielding layer 16 is larger than the width of the polycrystalline silicon layer 31. The lower light shielding layer 16 is provided so as to cover the polycrystalline silicon layer 31 from below and to cover the gap between the capacitance electrode 15 and the gate line 12 in the vicinity thereof.

In the first contact hole 27, a source electrode 33 of the TFT 60 is provided.

In the second contact hole 28, a drain electrode 34 of the TFT 60 is provided.

A portion of the gate line 12 crossing the TFT 60 acts as a gate electrode of the TFT 60.

In FIGS. 1A and 1B, side light shielding layers 23 are represented by bold dashed line. As shown in FIGS. 1A and 1B, the side light shielding layers 23 are provided along the gate line 12 and the signal line 13.

Figure 2:
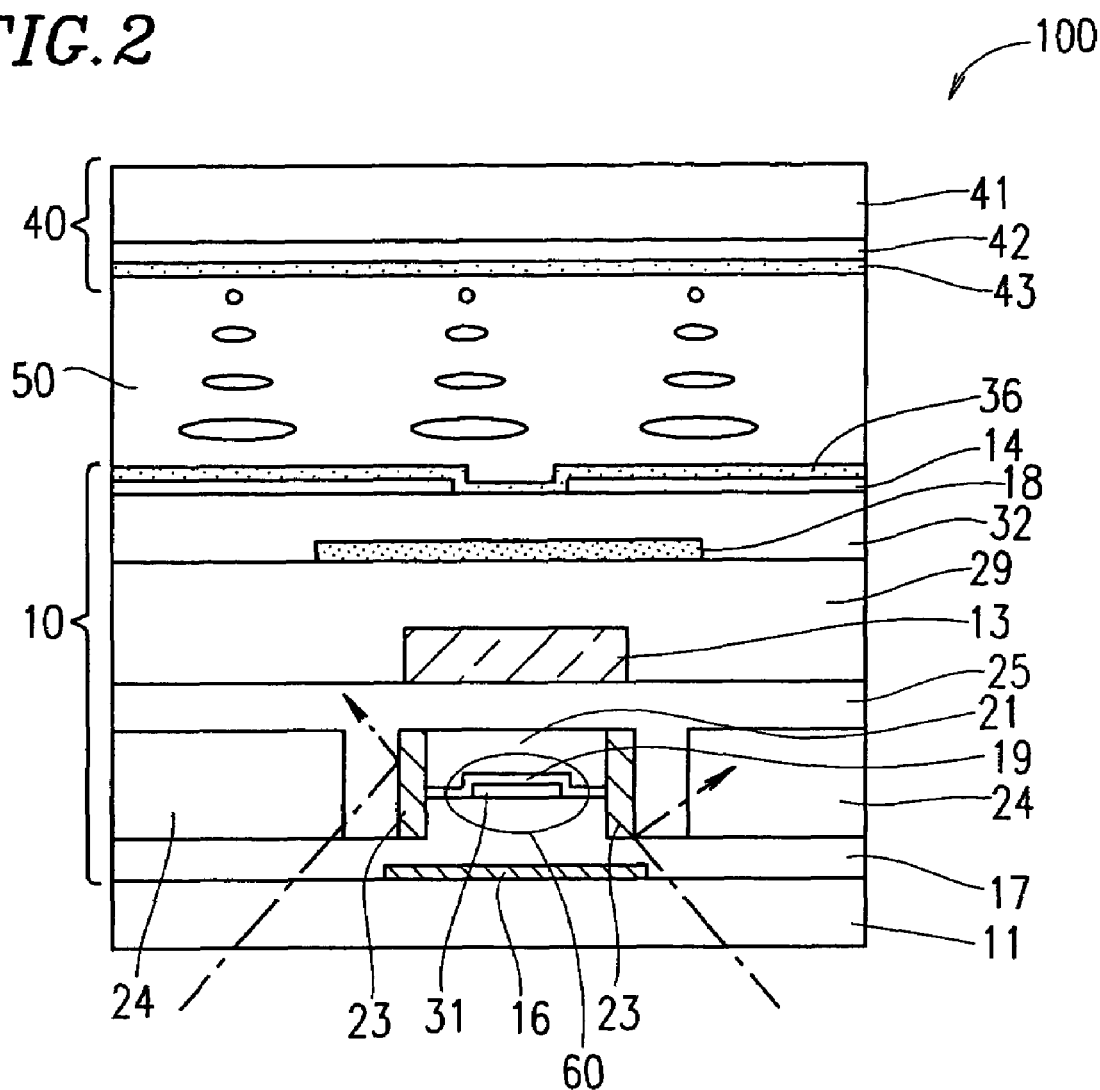
FIG. 2 is a schematic cross-sectional view of the liquid crystal display device shown in FIGS. 1A and 1B taken along line A—A of FIGS. 1A and 1B.
Figure 3:
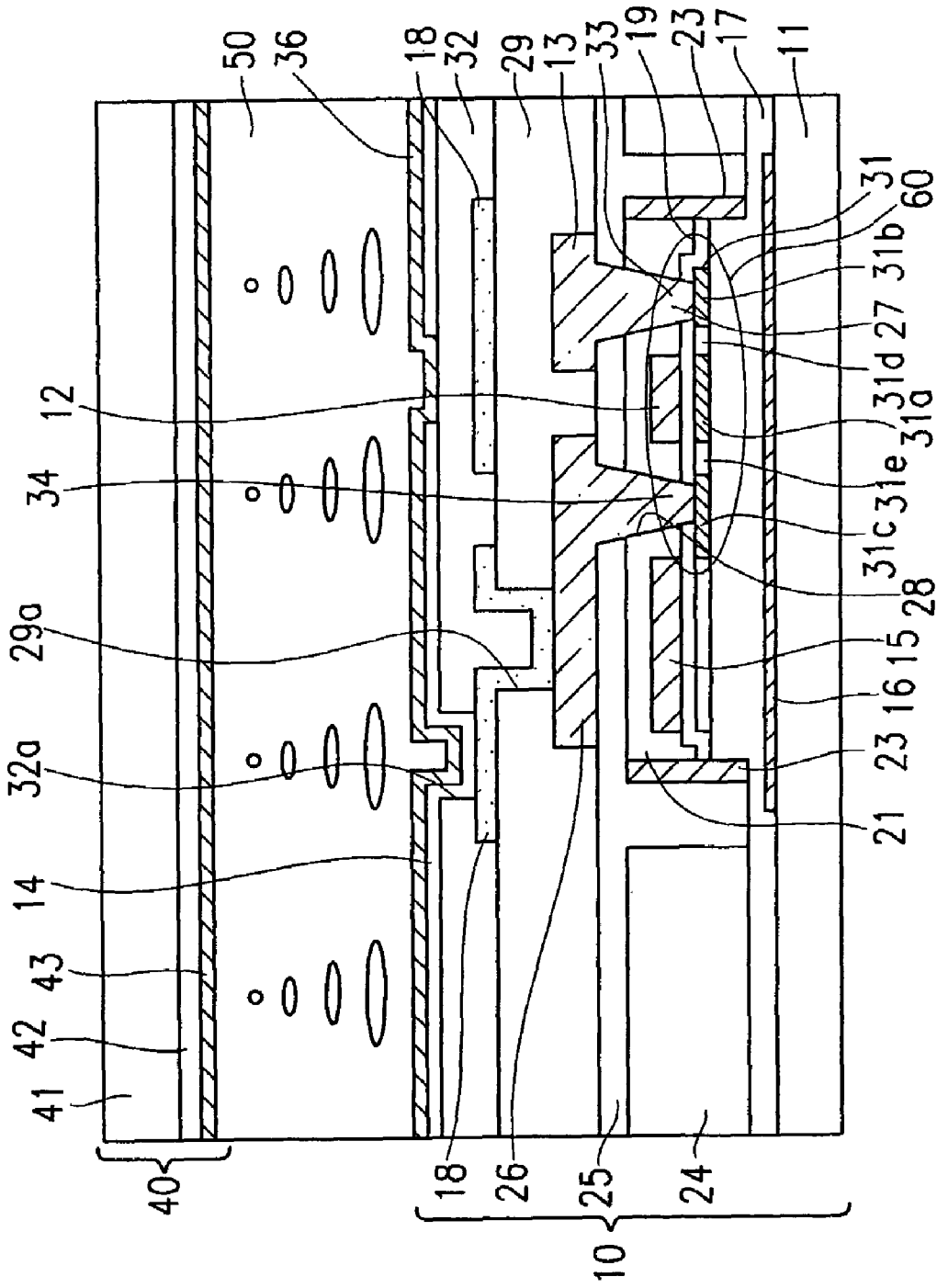
FIG. 3 is a schematic cross-sectional view of the liquid crystal display device shown in FIGS. 1A and 1B taken along line B—B of FIGS. 1A and 1B.

FIG. 2 is a schematic cross-sectional view of the liquid crystal display device 100 taken along line A—A of FIGS. 1A and 1B, and FIG. 3 is a schematic cross-sectional view of the liquid crystal display device 100 taken along line B—B of FIGS. 1A and 1B.

As shown in FIGS. 2 and 3, the liquid crystal display device 100 includes the active matrix substrate 10 and a counter substrate 40, and a liquid crystal layer 50 interposed between the active matrix substrate 10 and the counter substrate 40.

The counter substrate 40 includes a transparent plate 41 formed of quartz glass, a transparent electrode 42 provided on the transparent plate 41, and an alignment layer 43 provided on the transparent electrode 42. The transparent plate 41 acts as the base plate of the counter substrate 40.

The active matrix substrate 10 includes the transparent plate 11 formed of quartz glass. The transparent plate 11 acts as the base plate of the active matrix substrate 10.

The lower light shielding layer 16 is provided on the transparent plate 11, and a first interlayer insulating layer 17 is provided on the transparent plate 11 so as to cover the lower light shielding layer 16.

The first interlayer insulating layer 17 includes a stepped portion having a larger thickness than the remaining portion thereof. The stepped portion is above a central portion of the lower light shielding layer 16, i.e., except for two edge portions of the lower light shielding layer 16. The stepped portion has walls which are substantially perpendicular to the transparent plate 11. The stepped portion extends along the signal line 13.

The polycrystalline silicon layer 31 is provided on the stepped portion of the first interlayer insulating layer 17. More specifically, the polycrystalline silicon layer 31 is provided on a central portion of the stepped portion of the first interlayer insulating layer 17 in the width direction of the signal line 13. A second interlayer insulating layer (gate insulating layer) 19 is provided on the stepped portion of the first interlayer insulating layer 17 so as to cover the polycrystalline silicon layer 31.

The gate line 12 and the capacitance electrode 15 are provided on the second interlayer insulating layer 19.

A third interlayer insulating layer 21 is provided on the second interlayer insulating layer 19 so as to cover the gate line 12 and the capacitance electrode 15.

A portion of the polycrystalline silicon layer 31 below the gate line 12 is the channel region 31a of the TFT 60 having an LDD structure.

The polycrystalline silicon layer 31 includes the channel region 31a acting as a channel of the TFT 60, a source region 32b of the TFT 60, a drain region 31c of the TFT 60, the lightly doped drain (LDD) region (N⁻) 31d between the channel region 31a and the source region 31b, and the lightly doped drain (LDD) region (N⁻) 31e between the channel region 31a and the drain region 31c.

The third interlayer insulating layer 21 has a flat top surface. Side surfaces of the second interlayer insulating layer 19 and side surfaces of the third interlayer insulating layer 21 are aligned with and continuous to the side surfaces of the stepped portion of the first interlayer insulating layer 17. These side surfaces are substantially perpendicular to the transparent plate 11.

The side surfaces of the first interlayer insulating layer 17, the second interlayer insulating layer 19 and the third interlayer insulating layer 21 are covered with the side light shielding layers 23.

The side light shielding layers 23 are patterned into a prescribed shape, so as to be along side edges of the polycrystalline silicon layer 31 and side edges of the gate line 12 (as represented by bold dashed line in FIGS. 1A and 1B). Thus, the side light shielding layers 23 are provided so as to cover side surfaces of the TFT 60.

The top surface of the side light shielding layers 23 is at the same level as and continuous to the top surface of the interlayer insulating layer 21 and is substantially flat.

Dummy insulating layers 24 are provided on the first interlayer insulating layer 17 except for the stepped portion. The dummy insulating layers 24 are provided at an appropriate distance from the side light shielding layers 23.

The top surface of the dummy layers 24 is substantially at the same level as the top surfaces of the third interlayer insulating layer 21 and the side light shielding layers 23, and is substantially flat.

A fourth interlayer insulating layer 25 is provided so as to cover the dummy insulating layers 24, the third interlayer insulating layer 21 and the side light shielding layers 23.

The fourth interlayer insulating layer 25 is also provided between the dummy insulating layers 24 and the side light shielding layers 23. The top surface of the fourth interlayer insulating layer 25 is entirely flat.

The first contact hole 27 and the second contact hole 28 are formed in the second interlayer insulating layer 19, the third interlayer insulating layer 21, and the fourth interlayer insulating layer 25.

The first contact hole 27 is filled with a conductive which is the same as the material of the signal line 13 so as to form the source electrode 33 of the TFT 60. The source electrode 33 electrically connects the signal line 13 and the source region 31b of the polycrystalline silicon layer 31.

The signal line 13 is provided on the fourth interlayer insulating layer 25 in a prescribed pattern.

The second contact hole 28 is filled with a conductive which is the same as the material of a connecting electrode 26 so as to form the drain electrode 34 of the TFT 60. The drain electrode 34 electrically connects the connecting electrode 26 and the drain region 31c of the polycrystalline silicon layer 31.

The connecting electrode 26 is formed on the fourth interlayer insulating layer 25 in a rectangular pattern.

A fifth interlayer insulating layer 29 is provided on the fourth interlayer insulating layer 25 so as to cover the signal line 13 and the connecting electrode 26. A third contact hole 29a is provided in the fifth interlayer insulating layer 29 so as to expose the connecting electrode 26. The top surface of the fifth interlayer insulating layer 29 is entirely flat.

The upper light shielding layer 18 which is patterned as prescribed is provided on the fifth interlayer insulating layer 29. The upper light shielding layer 18 is formed of a conductive material.

The upper light shielding layer 18 is electrically connected to the connecting electrode 26 via the third contact hole 29a.

A sixth interlayer insulating layer 32 is provided on the fifth interlayer insulating layer 29 so as to cover the upper light shielding layer 18.

A fourth contact hole 32a is provided in the sixth interlayer insulating layer 32 in the vicinity of the third contact hole 29a.

The pixel electrodes 14 are provided on the sixth interlayer insulating layer 32 in a prescribed pattern. Each of the pixel electrodes 14 is connected to the upper light shielding layer 18 via the fourth contact hole 32a.

Each pixel electrode 14 is provided between two adjacent signal lines 13 and two adjacent gate lines 12. The pixel electrodes 14 overlap with the gate line 12 and the capacitance electrode 15, such that an interval between two adjacent pixel electrodes 14 is between a gate line 12 and a corresponding capacitance electrode 15.

An alignment layer 36 is provided on the sixth interlayer insulating layer 32 so as to cover the plurality of pixel electrodes 14.

The active matrix substrate 10 and the counter substrate 40 are located such that alignment layer 36 of the active matrix substrate 10 and the alignment layer 43 of the counter substrate 40 are opposed to each other with a prescribed distance therebetween. A liquid crystal layer 50 is provided between the alignment layer 36 and the alignment layer 43. Thus, the liquid crystal display device 100 is completed.

Figure 4:
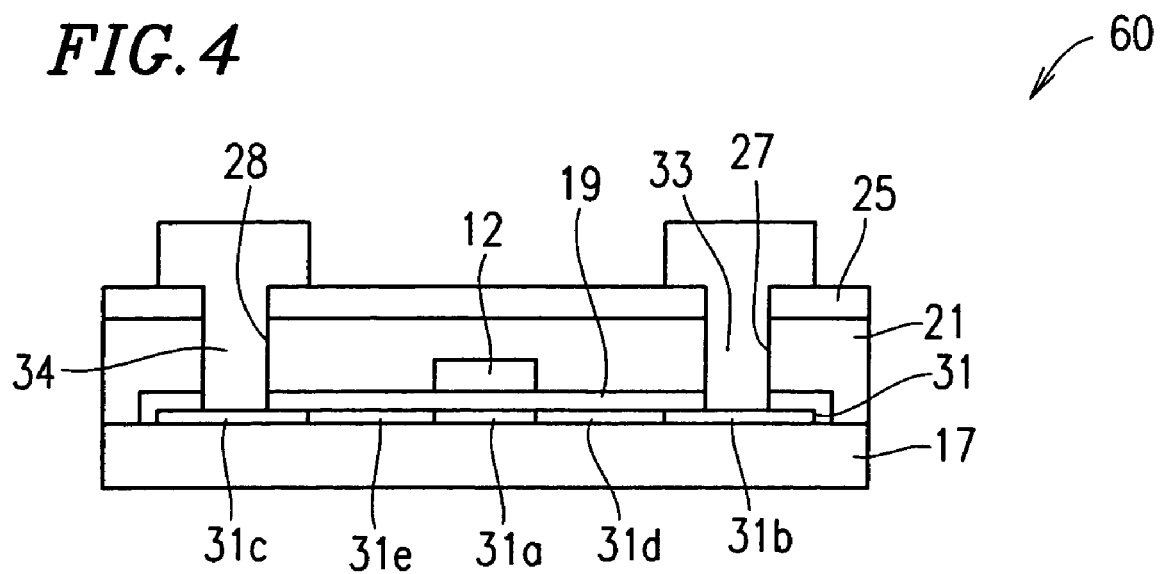
FIG. 4 is a schematic cross-sectional view illustrating a structure of a TFT included in the liquid crystal display device according to the first example of the present invention.

FIG. 4 shows a schematic structure of the TFT 60 provided in the active matrix substrate 10. The polycrystalline silicon layer 31 provided on the first interlayer insulating layer 17 is covered with the second interlayer insulating layer 19.

The gate line 12 is provided on a portion of the second interlayer insulating layer 19 which is a substantially central portion of the polycrystalline silicon layer 31. In the area of the polycrystalline silicon layer 31 corresponding to the gate line 12, the channel region 31a is provided.

On the first interlayer insulating layer 17, the third interlayer insulating layer 21 and the fourth interlayer insulating layer 25 are sequentially provided so as to cover the gate line 12 and the second interlayer insulating layer 19. Two portions of the polycrystalline silicon layer 31 distanced from the center of the polycrystalline silicon layer 31 respectively act as the source region 31b and the drain region 31c.

The first contact hole 27 and the second contact hole 28 are formed in the third interlayer insulating layer 21 and the fourth interlayer insulating layer 25. The first contact hole 27 is formed at a position corresponding 5 to the source region 31b. The second contact hole 28 is formed at a position corresponding to the drain region 31c. The source electrode 33 is provided in the first contact hole 27, and the drain electrode 34 is provided in the second contact hole 28.

Regarding the polycrystalline silicon layer 31, the LDD region (N⁻) 31d is located between the channel region 31a and the source region 31b, and the LDD region (N⁻) 31e is located between the channel region 31a and the drain region 31c.

The TFT 60 includes the polycrystalline silicon layer 31 (the channel region 31a, the source region 31b, the drain region 31c, the LDD regions 31d and 31e), a part of the gate line 12, the second interlayer insulating layer 19, the source electrode 33 and the drain electrode 34.

FIGS. 5A through 5K are schematic cross-sectional views illustrating steps for producing the active matrix substrate 10 of the liquid crystal display device 100 shown in FIGS. 1 through 3. The cross-sectional views of FIGS. 5A through 5K correspond to the cross-sectional view of FIG. 3.

First, on the transparent plate 11 formed of quartz glass (FIG. 5A), a polycrystalline silicon layer doped with P (phosphorus) is formed to a thickness of 50 nm, and then a WSi layer is formed to a thickness of 100 nm. The polycrystalline silicon layer and the WSi layer are patterned, thereby forming the lower light shielding layer 16 as shown in FIG. 5A.

Next, an $SiO_2$ layer is formed by CVD on the entire surface of the transparent plate 11 to a thickness of, for example, 400 nm so as to cover the lower light shielding layer 16, thereby forming the first interlayer insulating layer 17 as shown in FIG. 5A.

A polycrystalline silicon layer is formed by CVD on the entire surface of the first interlayer insulating layer 17 to a thickness of, for example, 50 nm, and patterned as prescribed, thereby forming the polycrystalline silicon layer 31 above the lower light shielding layer 16. The polycrystalline silicon layer 31 is used as a part of the TFT 60. The polycrystalline silicon layer 31 is formed such that a bottom surface thereof is covered with the lower shielding layer 16.

The second interlayer insulating layer (gate insulating layer) 19 formed of $SiO_2$ is formed by CVD on the entire surface of the first interlayer insulating layer 17 to a thickness of, for example, 80 nm so as to cover the polycrystalline silicon layer 31 (FIG. 5A).

A polycrystalline silicon layer doped with P and a WSi layer are sequentially formed on the entire surface of the second interlayer insulating layer 19, each to a thickness of, for example, 150 nm, and patterned as prescribed, thereby forming the gate line 12 and the capacitance electrode 15 (FIG. 5A). The capacitance electrode 15 is for a storage capacitance device.

As shown in FIG. 5B, impurities are implanted by ion implantation into the polycrystalline silicon layer 31 (acting as a part of the TFT 60) using the gate line 12 and the capacitance electrode 15 as a mask. For example, P is implanted at a dose of about $1 \times 10^{13}$ cm$^{-2}$.

Impurities are implanted by ion implantation into regions of the polycrystalline silicon layer 31 using the resist layer (not shown) as a mask, thereby forming the source region 31b and the drain region 31c. For example, P is implanted at dose of about $3 \times 10^{15}$ cm$^{-2}$. Thus, in addition to the source region 31b and the drain region 31c, the LDD region 31d is formed between the channel region 31a and the source region 31b, and the LDD region 31e is formed between channel region 31a and the drain region 31c.

As shown in FIG. 5C, an $SiO_2$ layer is formed by plasma CVD using TEOS (tetraethylorthosilicate) as a material gas on the entire surface of the second interlayer insulating layer 19 so as to cover the gate line 12 and the capacitance electrode 15 (both having a height of about 500 nm from the second interlayer insulating layer 19). The $SiO_2$ layer is formed to a thickness of, for example, about 600 nm, i.e., a larger thickness than the thickness of the gate line 12 and the capacitance electrode 15.

As shown in FIG. 5D, the $SiO_2$ layer is polished by CMP (chemical mechanical polishing) until the thickness of the $SiO_2$ layer on the gate line 12 becomes, for example, 200 nm, and thus flattened, thereby forming the third interlayer insulating layer 21.

For example, the CMP is performed using a polishing cloth (for example, "IC-1400-050A2" (trade name)), a CMP polishing cloth (for example, "supreme RN-H24PJ" (trade name)) and a slurry (for example, "Semi-Sperse 12®" (trade name), which is diluted two-fold from "Semi-Sperse 25®" from Cabot Corporation), at a polishing solution flow rate of 150 sccm, a polishing head pressure of 8 psi, a carrier rotation rate of 32 rpm, and a platen rotation rate of 28 rpm.

As shown in FIG. 5E, portions of the third interlayer insulating layer 21, portions of the second interlayer insulating layer 19 and portions of the first interlayer insulating layer 17, which are above the edges of the lower shielding layer 16 and outside the lower shielding layer 16, are removed by general photolithography and anisotropic dry etching. Thus, a stepped portion having walls substantially perpendicular to the transparent plate 11 is formed. The height of the walls is about 800 nm.

Figure 5G:
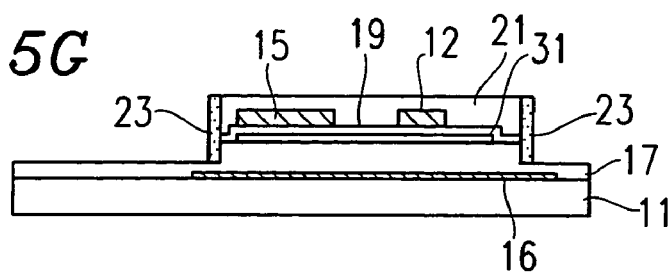

As shown in FIG. 5F, a polycrystalline silicon layer doped with P and a WSi layer are sequentially formed on the resultant laminate, each to a thickness of about 100 nm, thereby forming a laminate layer 23a. As shown in FIG. 5G, the laminate layer 23a is etched by anisotropic dry etching, thereby leaving the laminate layer 23a only on the walls of the stepped portion as the side light shielding layers 23.

Figure 5H:
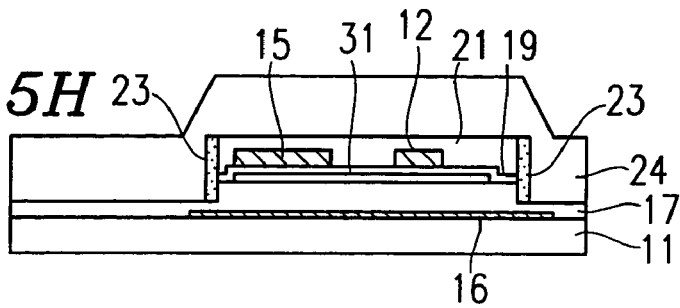
Figure 5I:
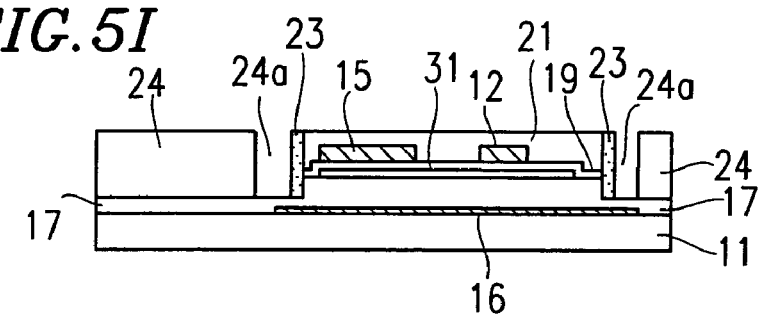

As shown in FIG. 5H, an SiO₂ layer is formed by plasma CVD using TEOS as a material gas on the resultant laminate. The SiO₂ layer is formed to a uniform thickness of about 800 nm, which is about the same as the height of the side light shielding layers 23. Then, the SiO₂ layer is patterned, thereby forming the dummy insulating layers 24 (FIG. 5I). Above the edges of the lower shielding layer 16, grooves 24a are formed between each dummy insulating layer 24 and the corresponding side light shielding layer 23, thereby exposing the first interlayer insulating layer 17.

Figure 5J:
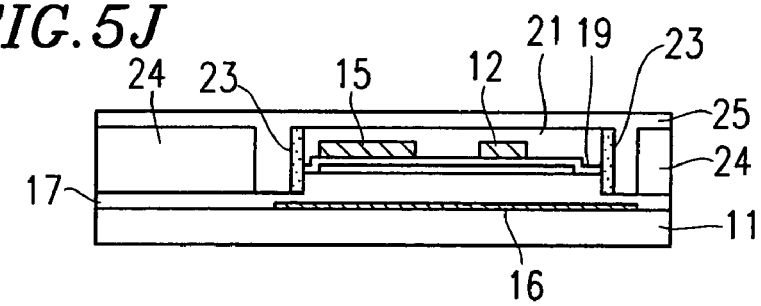

As shown in FIG. 5J, an SiO₂ layer is formed by plasma CVD using TEOS as a material gas to a thickness of, for example, about 1.5 μm on the resultant laminate. The SiO₂ layer is provided so as to fill the grooves 24a between the dummy insulating layers 24 and the side light shielding layers 23. The SiO₂ layer is flattened, thereby forming the fourth interlayer insulating layer 25.

Figure 5K:
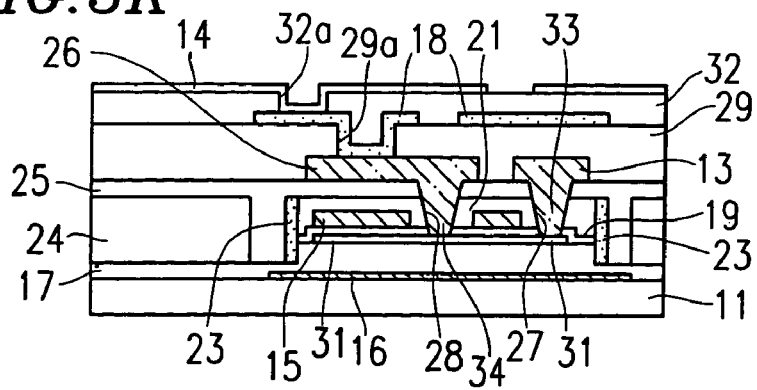

Prescribed portions of the third interlayer insulating layer 21 and the second interlayer insulating layer 19 are etched, thereby forming the first contact hole 27 and the second contact hole 28 both of which reach the polycrystalline silicon layer 31 (FIG. 5K).

Then, a TiW layer having a thickness of 150 nm, an Al layer having a thickness of 400 nm, and a TiW layer having a thickness of 100 nm are sequentially formed on the resultant laminate. These layers are also provided so as to fill the first contact hole 27 and the second contact hole 28, thereby forming the source electrode 33 of the TFT 60 in the first contact hole 27 and forming the drain electrode 34 of the TFT 60 in the second contact hole 28. The TiW layer, the Al layer and the TiW layer formed on the fourth interlayer insulating layer 25 are patterned as prescribed, thereby forming the connecting electrode 26 connected to the drain electrode 34 and the signal line 13 connected to the source electrode 33 on the fourth interlayer insulating layer 25.

The fifth interlayer insulating layer 29 is formed by plasma CVD using TEOS as a material gas on the resultant laminate. The fifth interlayer insulating layer 29 is formed such that the thickness of the fifth interlayer insulating layer 29 on the signal line 13 is, for example, about 800 nm. The fifth interlayer insulating layer 29 is polished by CMP until the thickness of the fifth interlayer insulating layer 29 on the signal line 13 becomes, for example, about 500 nm and thus flattened.

A prescribed portion of the fifth interlayer insulating layer 29 is etched, thereby forming a third contact hole 29a which reaches the connecting electrode 26.

Then, a TiW layer having a thickness of about 125 nm is formed by, for example, vapor deposition or sputtering on the resultant laminate, so as to be on the fifth interlayer insulating layer 29 and so as to fill the third contact hole 29a. The TiW layer is then patterned, thereby forming the upper light shielding layer 18 connected to the connecting electrode 26 via the third contact hole 29a. The upper light shielding layer 18 is conductive.

The sixth interlayer insulating layer 32 having a thickness of, for example, 500 nm is formed by plasma CVD using TEOS as a material gas on the resultant laminate. The sixth interlayer insulating layer 32 is polished by CMP to a thickness of, for example, 200 nm and thus flattened.

A prescribed portion of the sixth interlayer insulating layer 32 is etched, thereby forming the fourth contact hole 32a which reaches the upper light shielding layer 18.

An ITO layer having a thickness of, for example, 100 nm is formed on the entire surface of the resultant laminate, and patterned as prescribed, thereby forming the plurality of pixel electrodes 14 which are arranged in a matrix.

As shown in FIGS. 2 and 3, the alignment layer 36 is formed on the sixth interlayer insulating layer 32 so as to cover all the pixel electrodes 14.

In this manner, the active matrix substrate 10 is produced.

The counter substrate 40 is formed by forming the transparent electrode 42 on the entire surface of the transparent plate 41, and then forming the alignment layer 43 on the entire surface of the transparent electrode 42.

The active matrix substrate 10 and the counter substrate 40 are located such that the alignment layers 36 and 43 thereof are opposed to each other with a prescribed distance therebetween. The liquid crystal layer 50 is provided between the alignment layers 36 and 43. Thus, the liquid crystal display device 100 is produced.

In the liquid crystal display device 100 having such a structure, the side light shielding layers 23 are provided on both sides of the TFT 60, substantially perpendicularly to the transparent plate 11. More specifically, the side light shielding layers 23 are provided on both sides of the polycrystalline silicon layer 31 used as a part of the TFT 60. Accordingly, for example, light obliquely incident on the active matrix substrate 10 through the transparent plate 11 from below the active matrix substrate 10 (indicated by chain line in FIG. 2), and the light reflected by the optical system (not shown), are shielded by the side light shielding layers 23, and therefore are not incident on the polycrystalline silicon layer 31. Owing to such a structure, generation of leak current in the channel region 31a, which is caused by light incident on the polycrystalline silicon layer 31, is prevented with certainty.

The side light shielding layers 23 also shield light from being incident on the polycrystalline silicon layer 31 through the edges of the upper light shielding layer 18 or the lower light shielding layer 16. The side light shielding layers 23 further shield light from being incident on the polycrystalline silicon layer 31 after being multiple-reflected between the upper light shielding layer 18 above the TFT 60 and the lower light shielding layer 16 below the TFT 60. Owing to such a structure, generation of leak current in the TFT 60 is prevented with certainty.

The lower light shielding layer 16, the upper light shielding layer 18, and the side light shielding layers 23 may be formed of polycrystalline silicon. Polycrystalline silicon is easy to process and generally used in semiconductor devices, and high temperature and low temperature polycrystalline silicon liquid crystal devices. The lower light shielding layer 16, the upper light shielding layer 18, and the side light shielding layers 23 may be each formed of metal or metal silicide or a two-component structure of metal or metal silicide and polycrystalline silicon. In this case, the light shielding property of the lower light shielding layer 16, the upper light shielding layer 18, and the side light shielding layers 23 can be improved. Usable metals include W, Mo, Pt, Pd, Ti, Cr and compounds thereof.

The transmittance of the lower light shielding layer 16, the upper light shielding layer 18, and the side light shielding layers 23 is, with respect to light having a wavelength of 400 nm to 500 nm, preferably 50% or less, and more preferably 10% or less, in order to reduce the generation of light leak current in the TFT 60.

The thickness of each of the lower light shielding layer 16, the upper light shielding layer 18, and the side light shielding layers 23 is preferably 10 to 1000 nm, and more preferably 100 to 400 nm.

The lower light shielding layer 16, the upper light shielding layer 18, and the side light shielding layers 23 may be the same or different in material, transmittance and thickness.

As described above, the side light shielding layers 23 are formed by (i) partially removing the third interlayer insulating layer 21, the second interlayer insulating layer 19 and the first interlayer insulating layer 17 to form a stepped portion, (ii) next, forming a layer to be formed into the side light shielding layers 23, and then (iii) processing the layer by dry etching, thereby leaving the layer on the walls of the stepped portion.

It is preferable to, before the stepped portion is formed, flatten the surface of the third interlayer insulating layer 21 for the following reason. Where there is a stepped portion in an area other than the areas in which the side light shielding layers 23 are to be formed, the side light shielding layer is formed along the stepped portion. Specifically, the third interlayer insulating layer 21 is preferably flattened by CMP.

The side light shielding layers 23 are provided to be substantially perpendicular to the transparent plate 11 above the side edges of the lower light shielding layer 16 with the first interlayer insulating layer 17 being interposed therebetween. Therefore, the side light shielding layers 23 are electrically floating. The present invention is not limited to such a structure.

Figure 6:
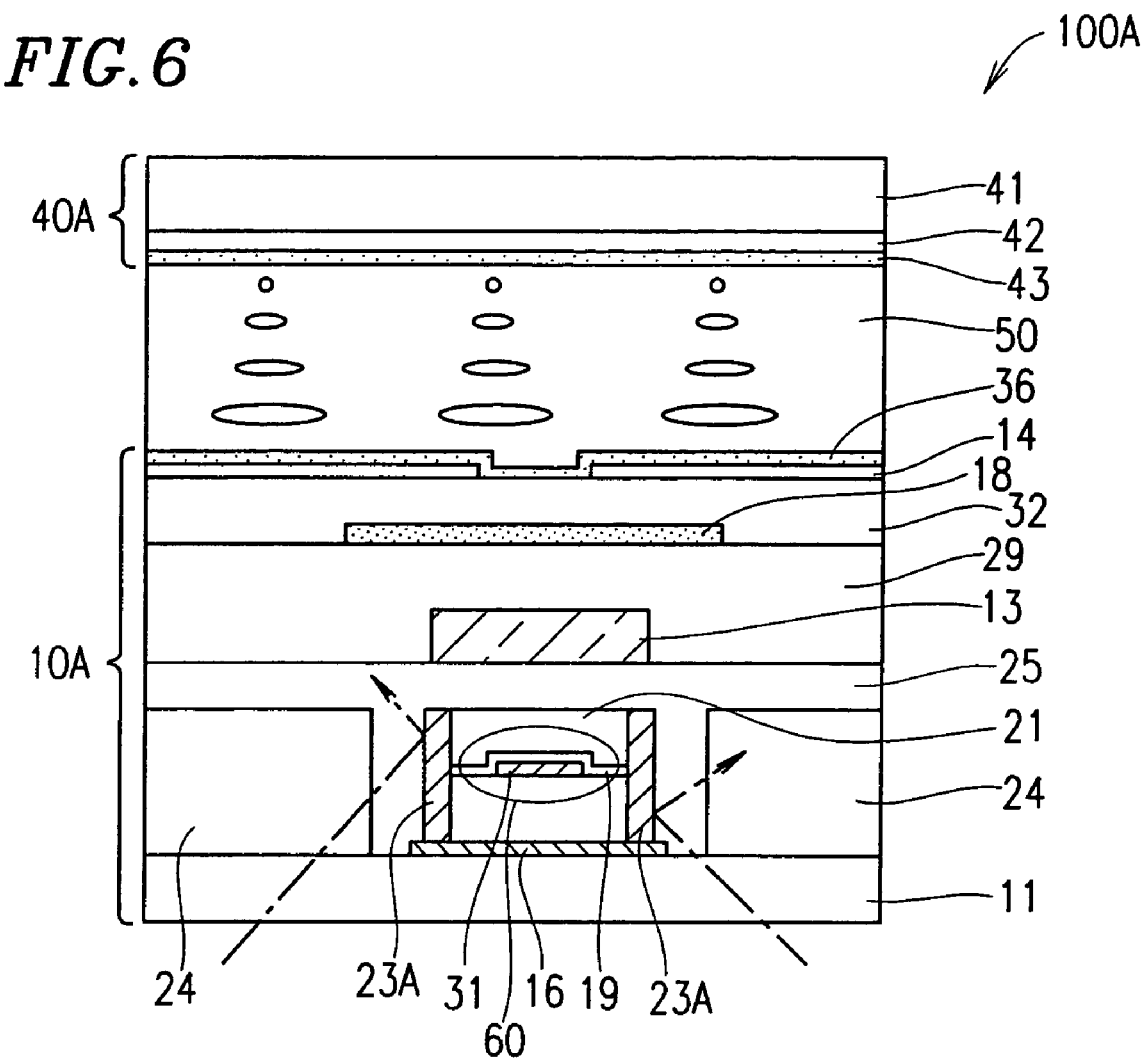
FIG. 6 is a schematic cross-sectional view of a liquid crystal display device as a modification of the first example of the present invention.
Figure 7:
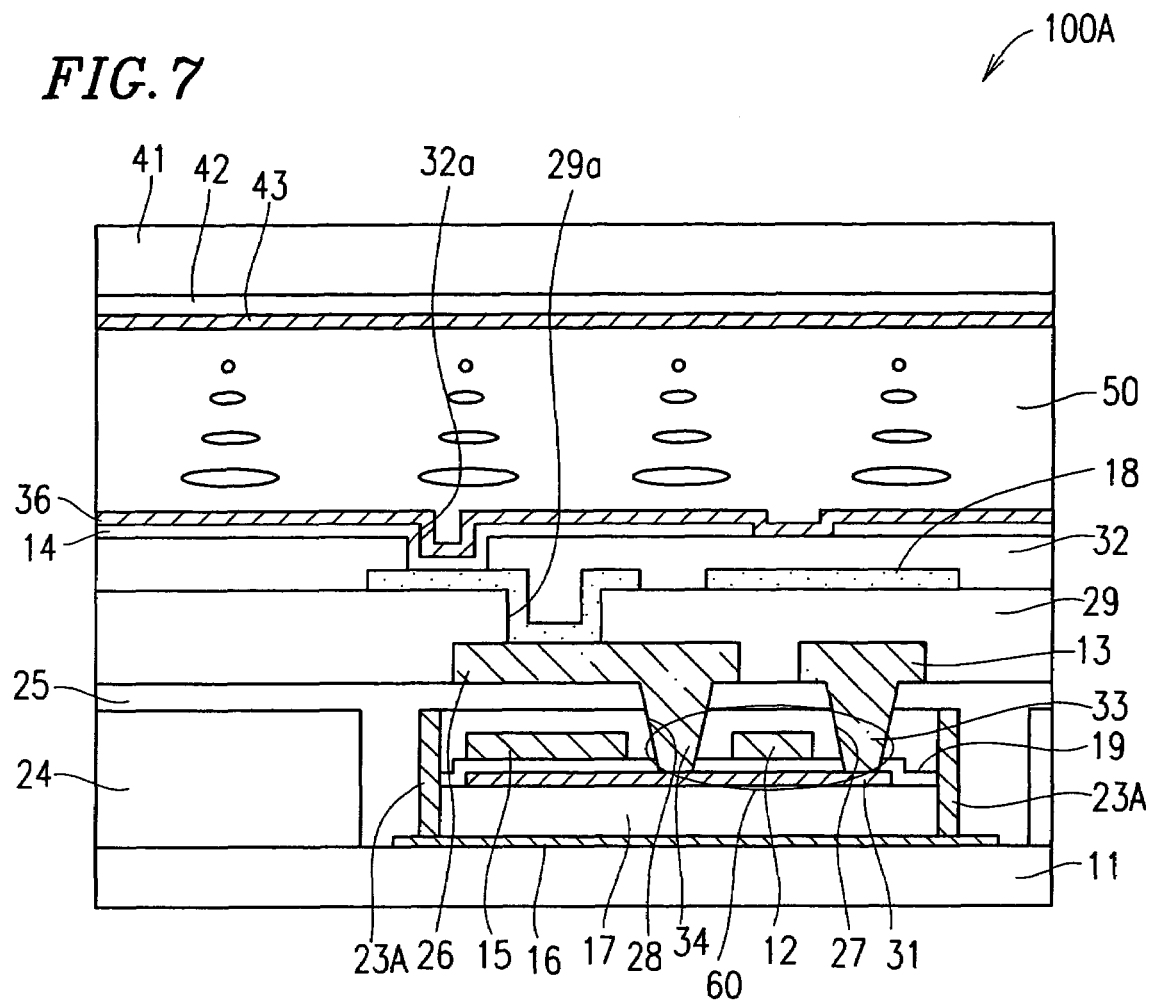
FIG. 7 is a schematic cross-sectional view of the liquid crystal display device shown in FIG. 6.

FIG. 6 is a schematic cross-sectional view of a liquid crystal display device 100A as a modification of the first example of the present invention. FIG. 6 corresponds to FIG. 2. FIG. 7 is a schematic cross-sectional view of the liquid crystal display device 100A shown in FIG. 6. FIG. 7 corresponds to FIG. 3.

As shown in FIGS. 6 and 7, in the liquid crystal display device 100A, side light shielding layers 23A are in contact with side edges of the lower light shielding layer 16 and are substantially perpendicular to the transparent plate 11. Since at least one side light shielding layer 23A is in contact with the side edge(s) of the lower light shielding layer 16, the side light shielding layer 23A is electrically fixed to the same potential as the surface of the lower light shielding layer 16. As a result, change in the characteristics of the TFT 60, which may be caused by the parasitic capacitances in the side light shielding layer 23A and areas in the vicinity thereof, is suppressed.

The liquid crystal display device 100A having such a structure is produced by the method described above with reference to FIGS. 5A through 5K except for the following point. In the step shown in FIG. 5E, the partial removal of the third interlayer insulating layer 21, the second interlayer insulating layer 19 and the first interlayer insulating layer 17 is performed until the side edges of the lower light shielding layer 16 are exposed.

Figure 8A:
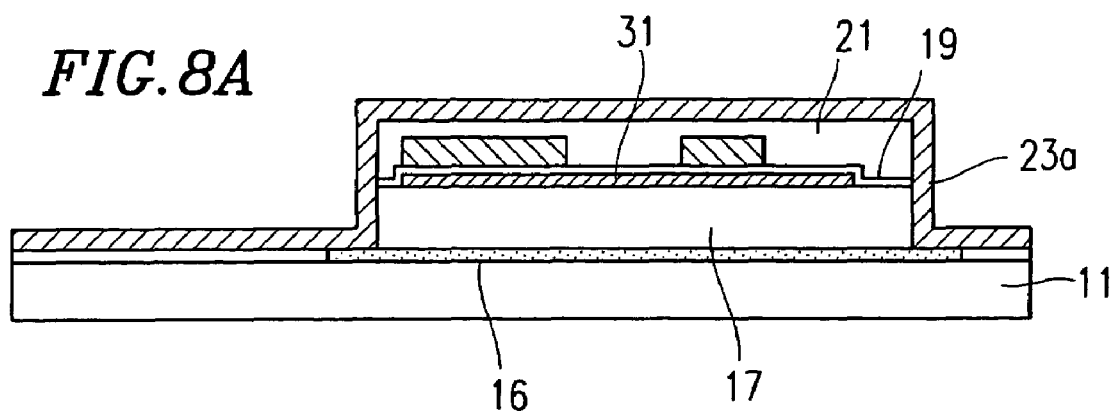
FIGS. 8A and 8B are schematic cross-sectional views illustrating steps for producing an active matrix substrate of the liquid crystal display device shown in FIGS. 6 and 7.
Figure 8B:
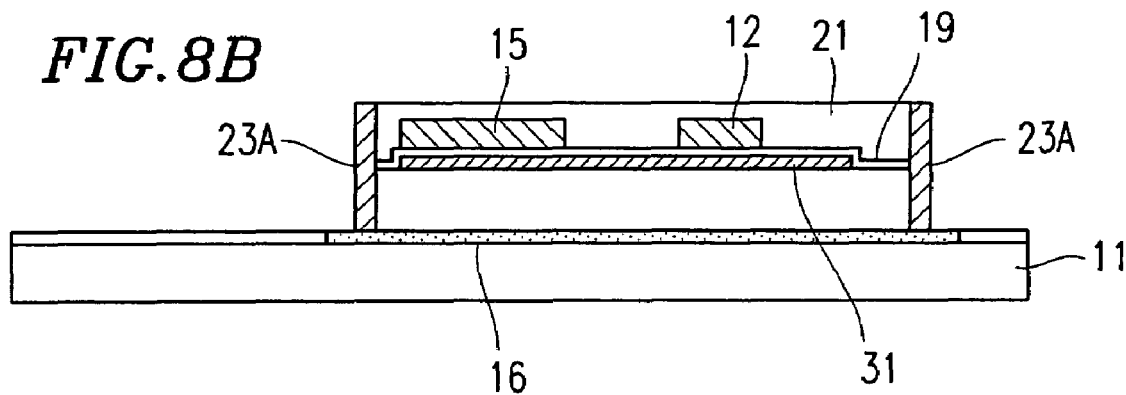

FIGS. 8A and 8B are schematic cross-sectional views illustrating steps for producing an active matrix substrate 10A of the liquid crystal display device 100A shown in FIGS. 6 and 7. The cross-sectional views of FIGS. 8A and 8B respectively correspond to FIGS. 5F and 5G.

As shown in FIG. 8A, a polycrystalline silicon layer doped with P and a WSi layer are sequentially formed on the resultant laminate, each to a thickness of about 100 nm, thereby forming a laminate layer 23a. As shown in FIG. 8B, the laminate layer 23a is etched by anisotropic dry etching, thereby leaving the laminate layer 23a only on the walls of the stepped portion as the side light shielding layers 23A.

After this, the liquid crystal display device 100A including the active matrix substrate 10A is produced by the method described above.

EXAMPLE 2

In the first example, the side light shielding layers are provided so as to cover the side surfaces of the polycrystalline silicon layer and the gate line which is provided above the polycrystalline silicon layer. The present invention is not limited to such a structure. The side light shielding layers may be provided so as to also cover the side surfaces of the signal line provided above the polycrystalline silicon layer.

In a second example of the present invention, a liquid crystal display device in which the side light shielding layer for covering the side surfaces of the signal line provided above the polycrystalline silicon layer, in addition to the side surfaces of the polycrystalline silicon layer and the gate line provided above the polycrystalline silicon layer will be described.

Figure 10:
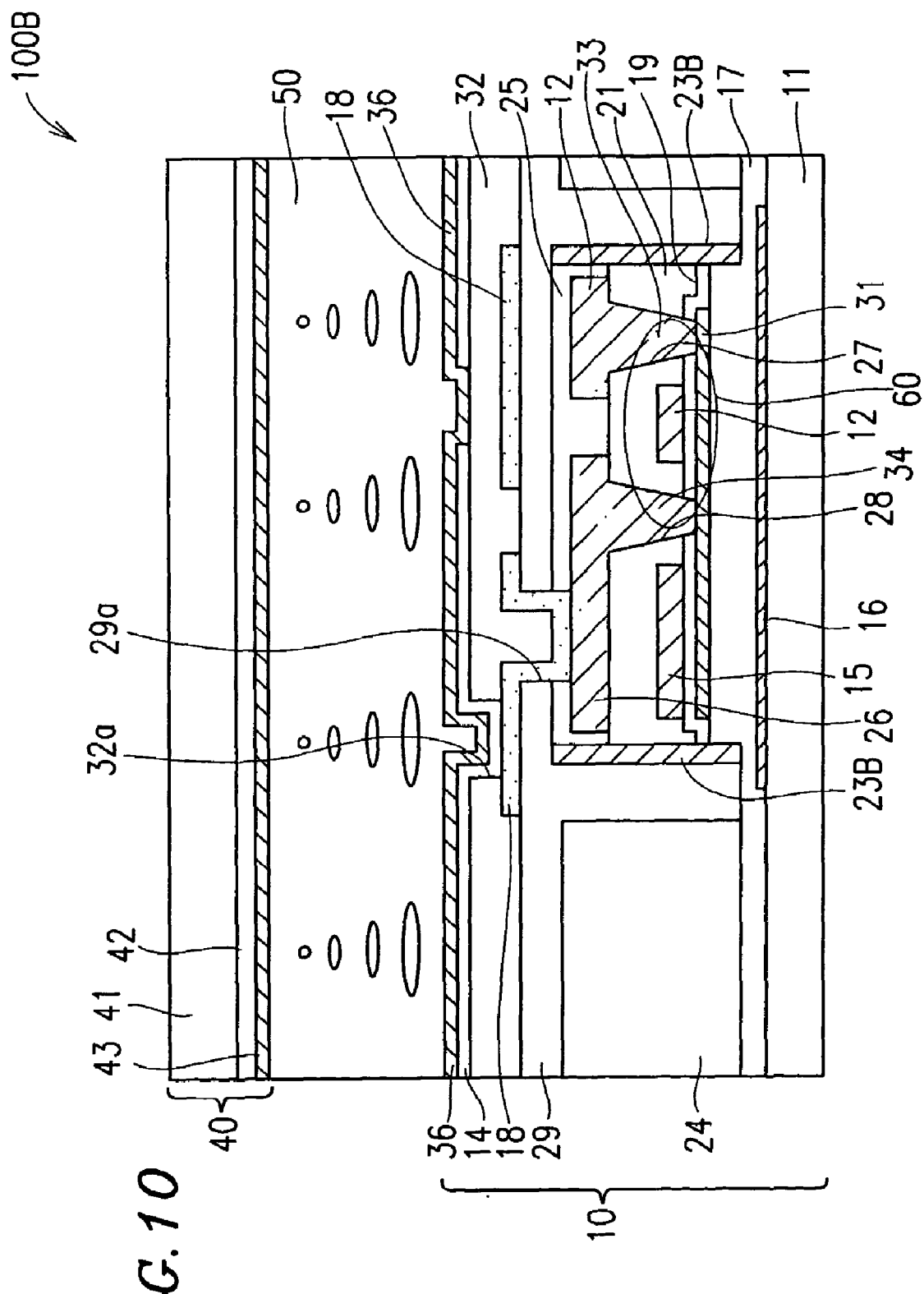
FIG. 10 is a schematic cross-sectional view of the liquid crystal display device shown in FIG. 9.

FIG. 9 is a schematic cross-sectional view of a liquid crystal display device 100B according to the second example of the present invention. FIG. 9 corresponds to FIG. 2. FIG. 10 is a schematic cross-sectional view of the liquid crystal display device 100B shown in FIG. 9. FIG. 10 corresponds to FIG. 3.

The liquid crystal display device 100B has substantially the same structure as that of the liquid crystal display device 100 described in the first example, except that side light shielding layers 23B cover the side surfaces of the signal line 13 provided above the polycrystalline silicon layer 31 in addition to the side surfaces of the polycrystalline silicon layer 31 and the gate line 12 provided above the polycrystalline silicon layer 31.

FIGS. 11A through 11J are schematic cross-sectional views illustrating steps for producing an active matrix substrate 10B of the liquid crystal display device 100B shown in FIGS. 9 and 10. The liquid crystal display device 100B is produced as follows.

First, on the transparent plate 11 formed of quartz glass (FIG. 11A), a polycrystalline silicon layer doped with P (phosphorus) is formed to a thickness of 50 nm, and then a WSi layer is formed to a thickness of 100 nm. The polycrystalline silicon layer and the WSi layer are patterned, thereby forming the lower light shielding layer 16 as shown in FIG. 11A.

Figure 11A:
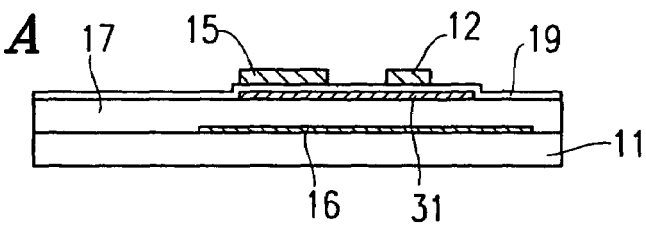
FIGS. 11A through 11J are schematic cross-sectional views illustrating steps for producing an active matrix substrate of the liquid crystal display shown in FIGS. 9 and 10.

Next, an $SiO_2$ layer is formed by CVD on the entire surface of the transparent plate 11 to a thickness of, for example, 400 nm so as to cover the lower light shielding layer 16, thereby forming the first interlayer insulating layer 17 as shown in FIG. 11A.

A polycrystalline silicon layer is formed by CVD on the entire surface of the first interlayer insulating layer 17 to a thickness of, for example, 50 nm, and patterned as prescribed, thereby forming the polycrystalline silicon layer 31 above the lower light shielding layer 16. The polycrystalline silicon layer 31 is used as a part of the TFT 60.

The second interlayer insulating layer (gate insulating layer) 19 formed of $SiO_2$ is formed by CVD on the entire surface of the first interlayer insulating layer 17 to a thickness of, for example, 80 nm so as to cover the polycrystalline silicon layer 31 (FIG. 11A).

A polycrystalline silicon layer doped with P and a WSi layer are sequentially formed on the entire surface of the second interlayer insulating layer 19, each to a thickness of, for example, 150 nm, and patterned as prescribed, thereby forming the gate line 12 and the capacitance electrode 15 (FIG. 11A). The capacitance electrode 15 is for a storage capacitance device.

Impurities are implanted by ion implantation into the polycrystalline silicon layer 31 (acting as a part of the TFT 60) using the gate line 12 and the capacitance electrode 15 as a mask. For example, P is implanted at a dose of about $1 \times 10^{13}$ cm$^{-2}$.

Impurities are implanted by ion implantation into regions of the polycrystalline silicon layer 31 using the resist layer (not shown) as a mask, thereby forming the source region 31b and the drain region 31c. For example, P is implanted at dose of about $3 \times 10^{15}$ cm$^{-2}$. Thus, in addition to the source region 31b and the drain region 31c, the LDD region 31d is formed between the channel region 31a and the source region 31b, and the LDD region 31e is formed between the channel region 31a and the drain region 31c.

Figure 11B:
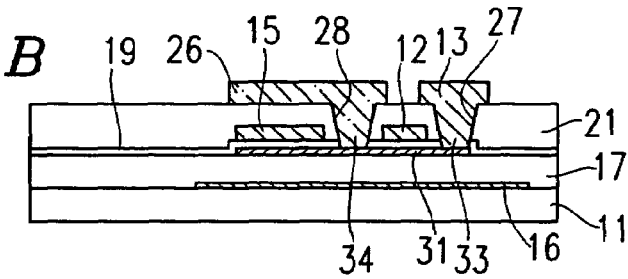
Figure 11C:
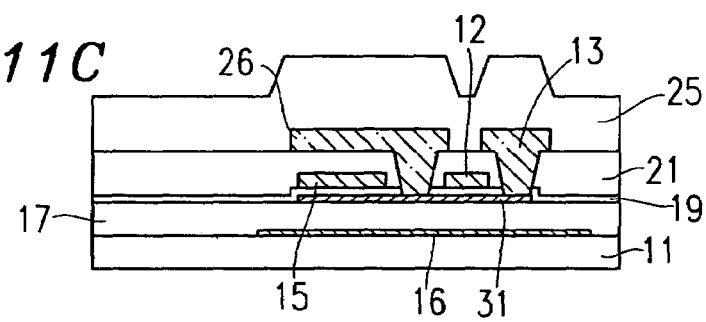

As shown in FIG. 11B, an SiO$_2$ layer is formed by plasma CVD using TEOS as a material gas on the entire surface of the second interlayer insulating layer 19 to a thickness of, for example, 600 nm so as to cover the gate line 12 and the capacitance electrode 15.

Then, the SiO$_2$ layer is polished by CMP to have a thickness on the gate line 12 of, for example, 200 nm, and thus flattened, thereby forming a third interlayer insulating layer 21.

Prescribed portions of the third interlayer insulating layer 21 and prescribed portions of the second interlayer insulating layer 19 are etched, thereby forming the first contact hole 27 reaching the source region 31b of the polycrystalline silicon layer 31 and the second contact hole 28 reaching the drain region 31c of the polycrystalline silicon layer 31 (FIG. 11B).

Then, a TiW layer having a thickness of 150 nm, an Al layer having a thickness of 400 nm, and a TiW layer having a thickness of 100 nm are sequentially formed on the resultant laminate, and patterned as prescribed, thereby forming the source electrode 33 in the first contact hole 27 and forming the drain electrode 34 in the second contact hole 28. The connecting electrode 26 and the signal line 13 are also formed on the third interlayer insulating layer 21.

Figure 11D:
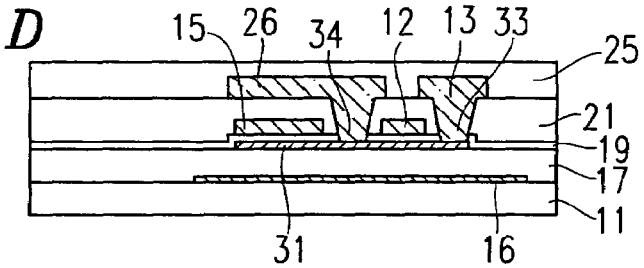

The fourth interlayer insulating layer 25 is formed by plasma CVD using TEOS as a material gas on the resultant laminate, such that the thickness of the fourth interlayer insulating layer 25 on the signal line 13 is, for example, a thickness of 800 nm, which is greater than the thickness of the signal line 13. The fourth interlayer insulating layer 25 is polished by CMP until the thickness of the fourth interlayer insulating layer 25 on the signal line 13 becomes about 600 nm, thereby flattening the fourth interlayer insulating layer 25 (FIG. 11D).

Figure 11E:
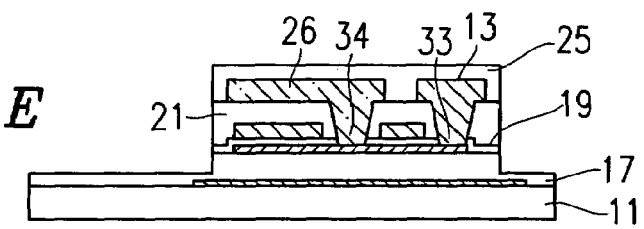

As shown in FIG. 11E, portions of the fourth interlayer insulating layer 25, portions of the third interlayer insulating layer 21, portions of the second interlayer insulating layer 19 and portions of the first interlayer insulating layer 17, which are above the side edges of the lower shielding layer 16 and outside the lower shielding layer 16, are removed by general photolithography and anisotropic dry etching. Thus, a stepped portion having walls substantially perpendicular to the transparent plate 11 is formed. The height of the walls is about 1.8 μm.

Figure 11F:
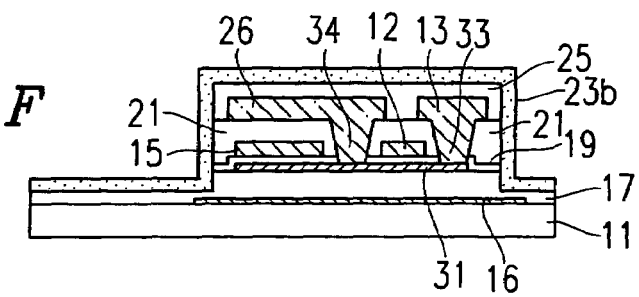
Figure 11G:
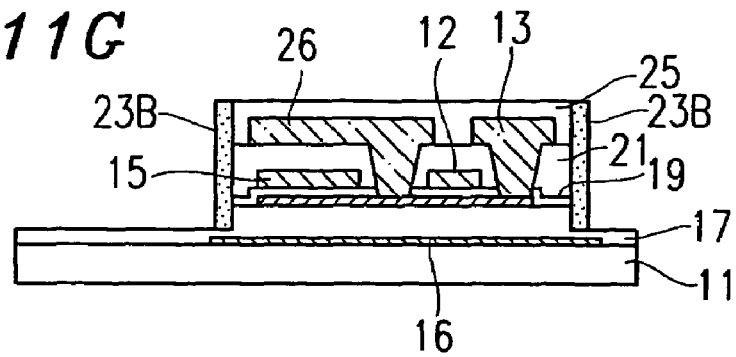

As shown in FIG. 11F, a TiW layer 23b having a thickness of 150 nm is formed and processed by anisotropic dry etching, thereby leaving the TiW layer 23b on the walls of the stepped portion. As shown in FIG. 11G, the side light shielding layers 23B for covering the side surfaces of the signal line 13 in addition to the side surfaces of the polycrystalline silicon layer 31 and the gate line 12 are formed.

Figure 11H:
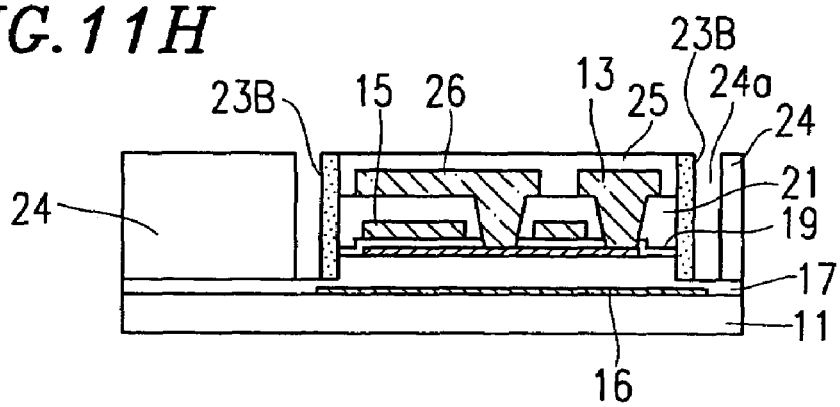

An insulating layer formed of SiO$_2$ is formed by plasma CVD using TEOS as a material gas on the resultant laminate to a thickness of about 1.8 μm, which is about the same as the height of the stepped portion. Then, the insulating layer is patterned, thereby forming the dummy insulating layers 24 (FIG. 11H). Grooves 24a are made between each dummy insulating layer 24 and the corresponding side light shielding layer 23B, thereby exposing the first interlayer insulating layer 17.

Figure 11I:
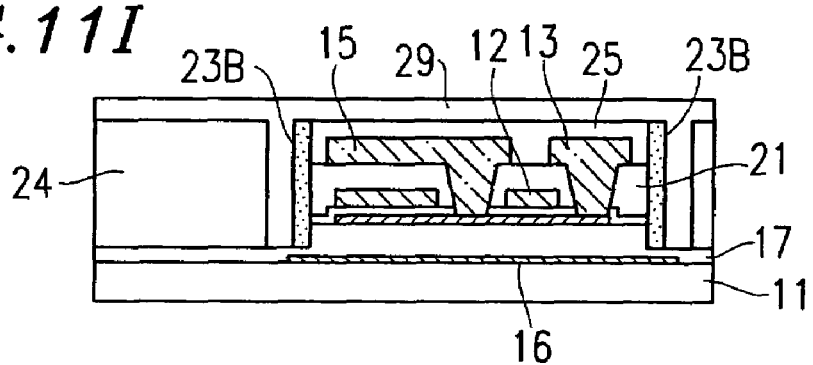

An SiO$_2$ layer is formed by plasma CVD using TEOS as a material gas on the resultant laminate until the thickness of the SiO$_2$ layer on the surface of the dummy insulating layers 24 and the fourth interlayer insulating layer 25 becomes, for example, 1.5 μm. The SiO$_2$ layer is also provided in the grooves 24a between the dummy insulating layers 24 and the side light shielding layers 23B. The SiO$_2$ layer is processed by anisotropic dry etching until the SiO$_2$ layer has a prescribed thickness. Thus, the fifth interlayer insulating layer 29 having a flat surface is formed (FIG. 11I). The fifth interlayer insulating layer 29 may be flattened by CMP.

A prescribed portion of the fifth interlayer insulating layer 29 and a prescribed portion of the fourth interlayer insulating layer 25 are removed by etching, thereby forming the third contact hole 29a.

Then, a TiW layer having a thickness of about 125 nm is formed by, for example, vapor deposition or sputtering on the resultant laminate, and patterned, thereby forming the upper light shielding layer 18. The upper light shielding layer 18 is provided so as to be on the fifth interlayer insulating layer 29 and so as to fill the third contact hole 29a. The upper light shielding layer 18 is conductive, and is connected to the connecting electrode 26 via the third contact hole 29a.

An insulating layer is formed by plasma CVD using TEOS as a material gas on the resultant laminate to a thickness of, for example, 500 nm. The insulating layer is polished by CMP until the thickness of the insulating layer becomes, for example, about 200 nm, thereby forming the sixth interlayer insulating layer 32 having a flat surface.

A prescribed portion of the sixth interlayer insulating layer 32 is etched, thereby forming the fourth contact hole 32a.

Figure 11J:
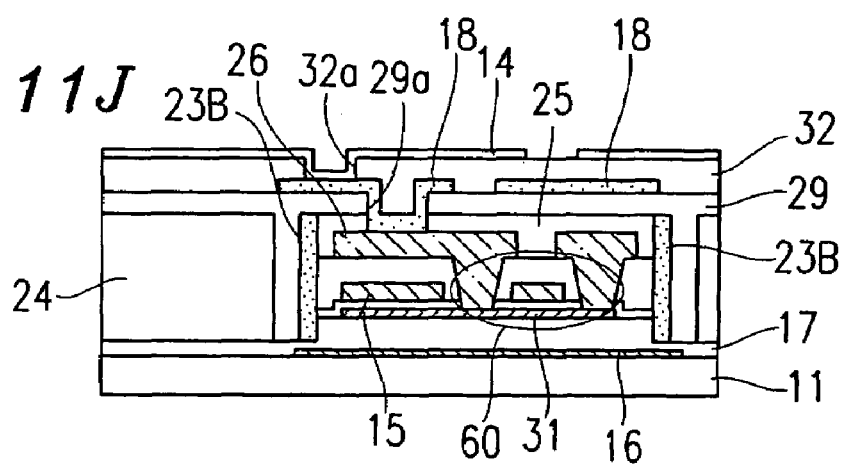

An ITO layer having a thickness of, for example, 100 nm is formed on the resultant laminate, and patterned as prescribed, thereby forming the plurality of pixel electrodes 14 which are arranged in a matrix (FIG. 11J). Each of the pixel electrodes 14 is connected to the upper light shielding layer 18 via the fourth contact hole 32a.

The alignment layer 36 is formed on the sixth interlayer insulating layer 32 so as to cover all the pixel electrodes 14.

In this manner, the active matrix substrate 10B including the side light shielding layers 23B for covering the side surfaces of the signal line 13 above the polycrystalline silicon layer 31 in addition to the side surfaces of the polycrystalline silicon layer 31 and the gate line 12 above the polycrystalline silicon layer 31 is produced.

The active matrix substrate 10B and the counter substrate 40B are located such that the alignment layers 36 and 43 thereof are opposed to each other with a prescribed distance therebetween. The liquid crystal layer 50 is provided between the alignment layers 36 and 43. Thus, the liquid crystal display device 100B is produced.

In the second example, the side light shielding layers 23B are provided to be substantially perpendicular to the transparent plate 11 above the side edges of the lower light shielding layer 16 with the first interlayer insulating layer 17 being interposed therebetween. Therefore, the side light shielding layers 23B are electrically floating. The present invention is not limited to such a structure.

Figure 13:
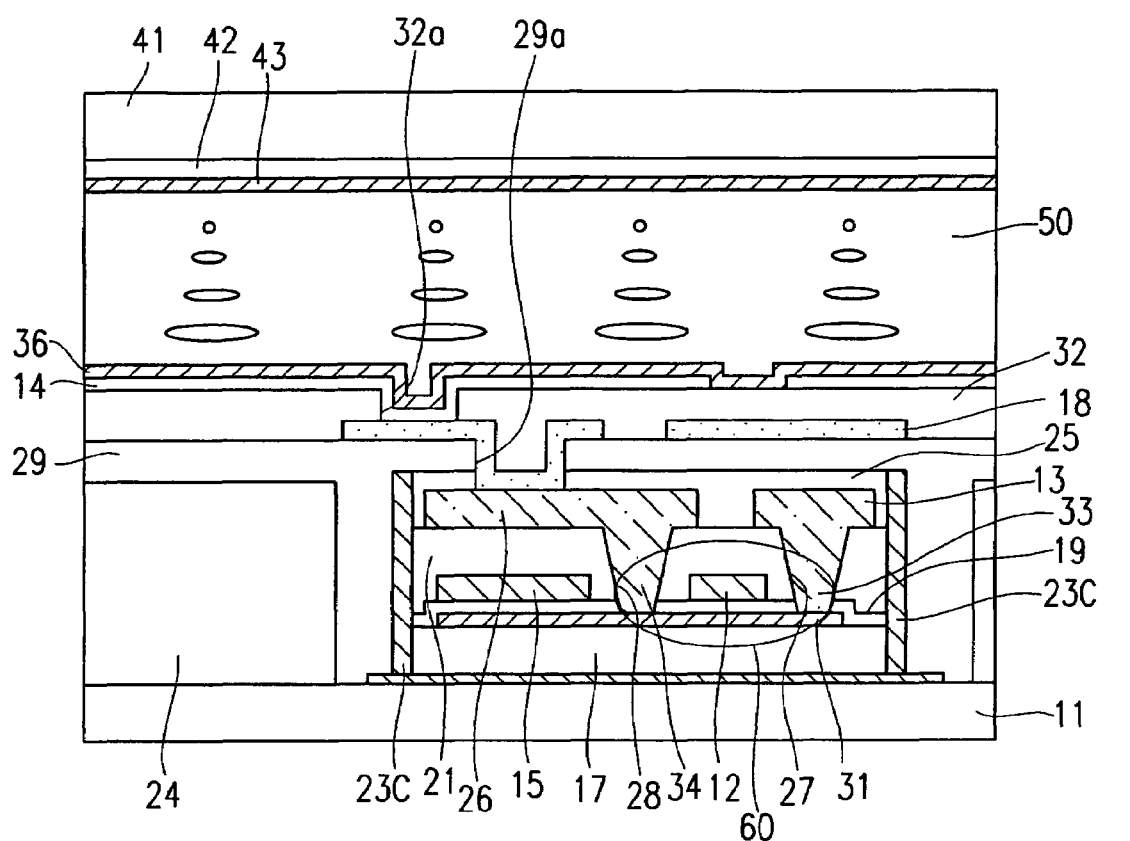
FIG. 13 is a schematic cross-sectional view of the liquid crystal display device shown in FIG. 12.

FIG. 12 is a schematic cross-sectional view of a liquid crystal display device 100C as a modification of the second example of the present invention. FIG. 12 corresponds to FIG. 2. FIG. 13 is a schematic cross-sectional view of the liquid crystal display device 100C shown in FIG. 12. FIG. 13 corresponds to FIG. 3.

As shown in FIGS. 12 and 13, in the liquid crystal display device 100C, side light shielding layers 23C are in contact with side edges of the lower light shielding layer 16 and are substantially perpendicular to the transparent plate 11. Since at least one side light shielding layer 23C is in contact with the side edge(s) of the lower light shielding layer 16, the side light shielding layer 23C is electrically fixed to the same potential as the surface of the lower light shielding layer 16. As a result, change in the characteristics of the TFT 60, which may be caused by the parasitic capacitances in side light shielding layer 23C and areas in the vicinity thereof, is suppressed.

The liquid crystal display device 100C having such a structure is produced by the method described above with reference to FIGS. 11A through 11J except for the following point. In the step shown in FIG. 11E, the partial removal of the fifth interlayer insulating layer 25, the third interlayer insulating layer 21, the second interlayer insulating layer 19 and the first interlayer insulating layer 17 is performed until the side edges of the lower light shielding layer 16 are exposed.

Figure 14A:
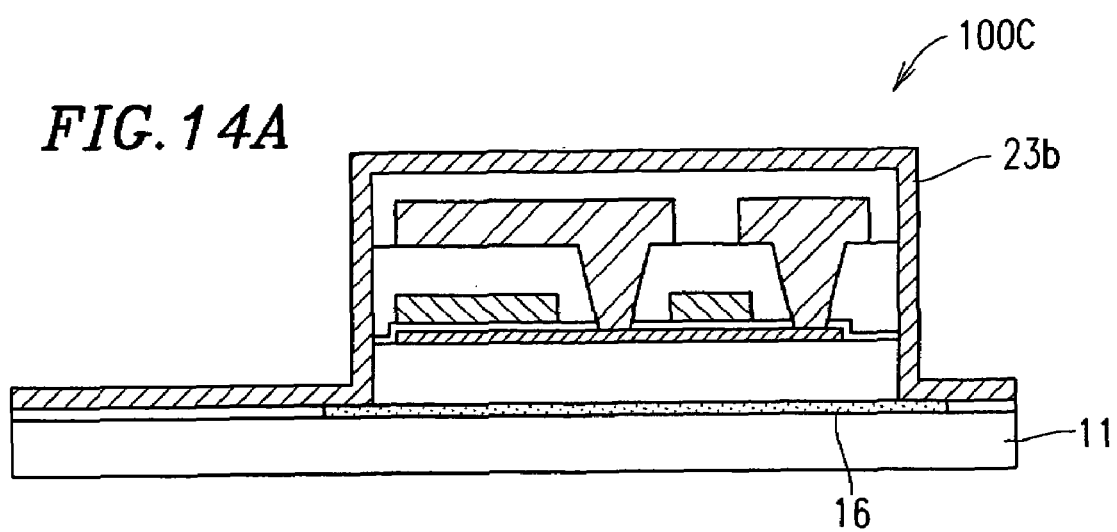
FIGS. 14A and 14B are cross-sectional views illustrating steps for producing an active matrix substrate of the liquid crystal display device shown in FIGS. 12 and 13.
Figure 14B:
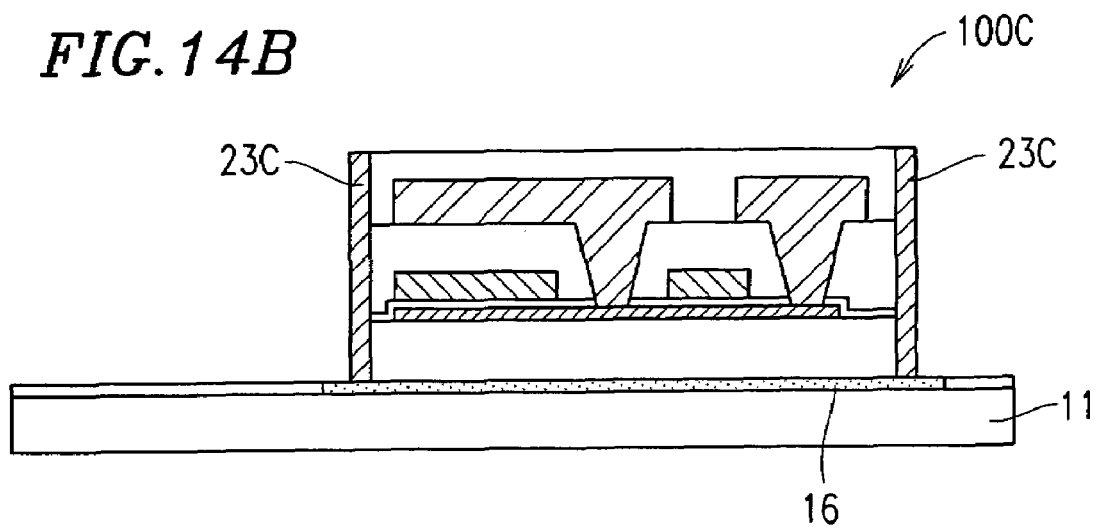

FIGS. 14A and 14B are schematic cross-sectional views illustrating steps for producing an active matrix substrate 10C of the liquid crystal display device 100C shown in FIGS. 12 and 13. The cross-sectional views of FIGS. 14A and 14B respectively correspond to FIGS. 11F and 11G.

As shown in FIG. 14A, a TiW layer 23b having a thickness of 150 nm is formed on the laminate corresponding to FIG. 11E, and processed by anisotropic dry etching, thereby leaving the TiW layer 23b on the walls of the stepped portion. Thus, the side light shielding layer 23C for covering the side surfaces of the signal line 13 in addition to the side surfaces of the polycrystalline silicon layer 31 and the gate line 12 is formed.

After this, the liquid crystal display device 100C including the active matrix substrate 10C is produced by the method described above.

EXAMPLE 3

In the first and second examples, the capacitance electrode is provided above the polycrystalline silicon layer. The present invention is not limited to such a structure. The capacitance electrode may be provided below the polycrystalline silicon layer.

In a third example of the present invention, a liquid crystal display device in which an additional capacitance electrode is provided below the polycrystalline silicon layer, i.e., below the TFT will be described.

Figure 15A:
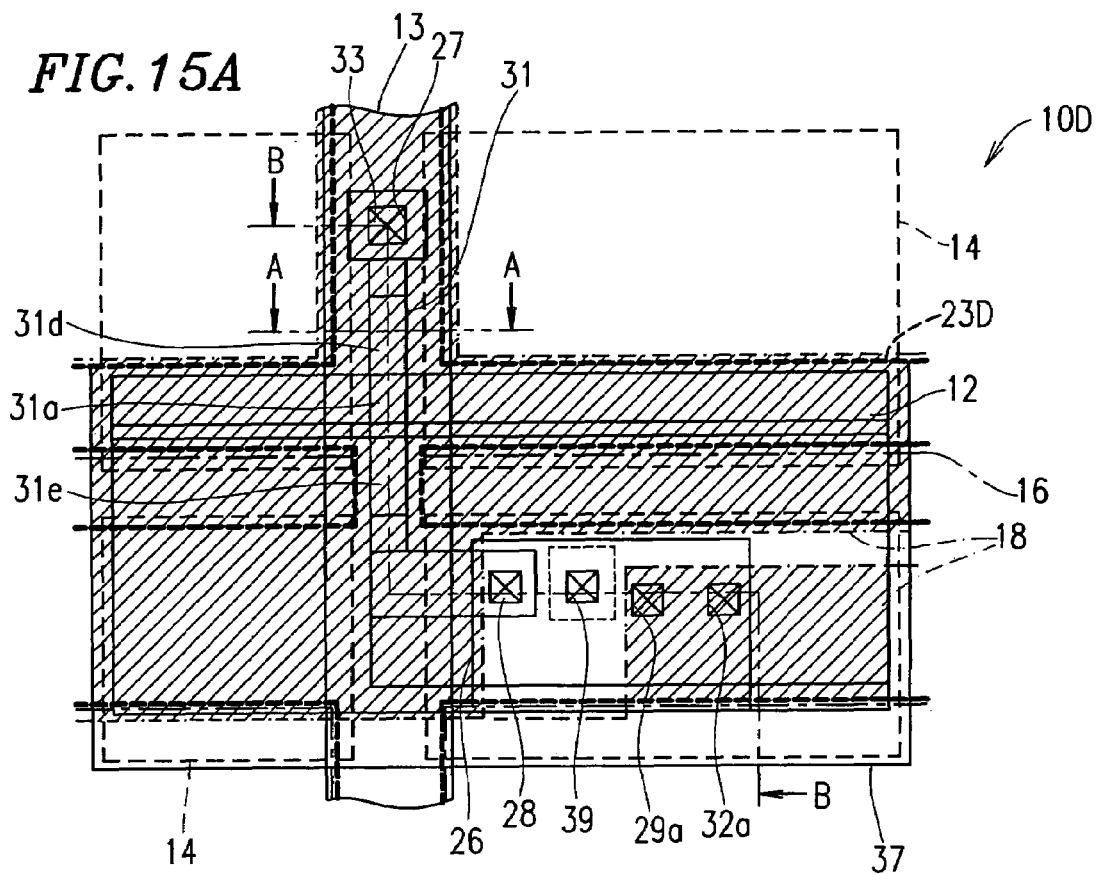
FIGS. 15A and 15B are each a schematic plan view of a portion of an active matrix substrate of a liquid crystal display device according to a third example of the present invention, where one gate line and one signal line cross each other.
Figure 15B:
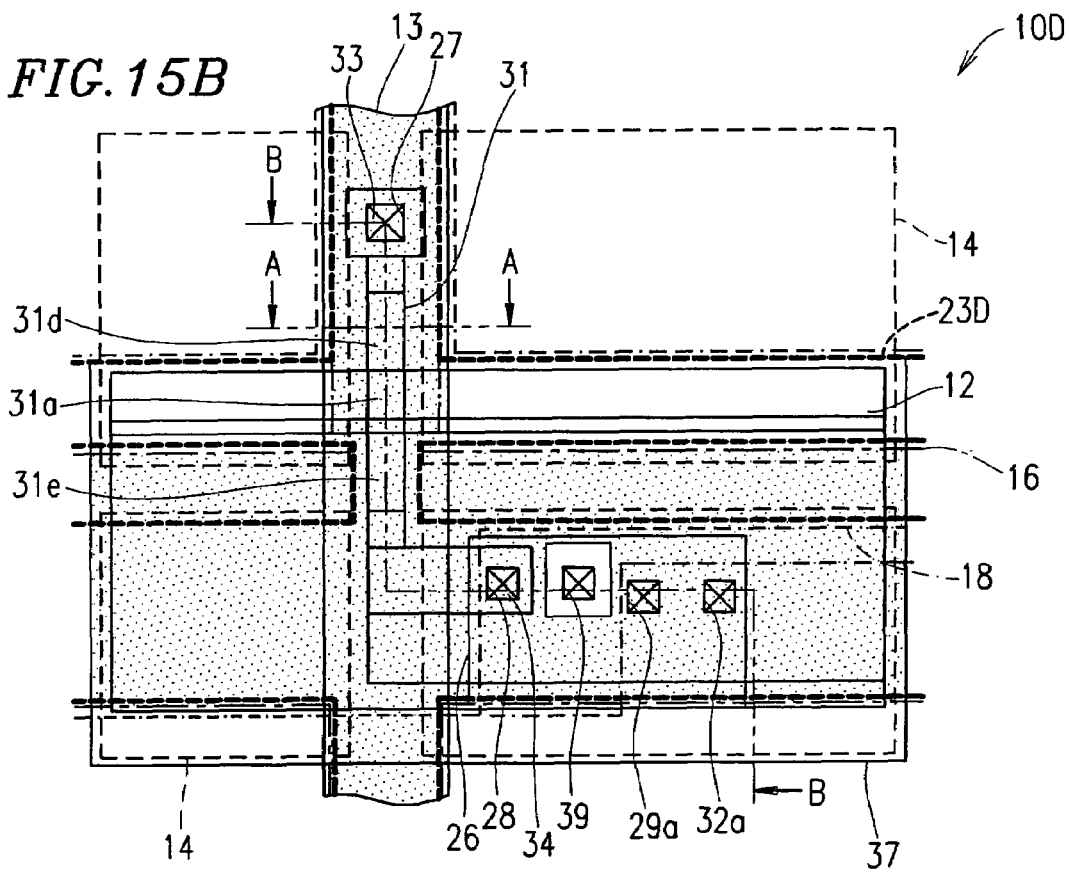

FIGS. 15A and 15B are each a schematic plan view of a portion of an active matrix substrate 10D of a liquid crystal display device 100D according to the third example of the present invention, where one gate line 12 and one signal line 13 cross each other.

FIGS. 15A and 15B represent the same liquid crystal display device 100D such that the positions of light shielding layers are clear as explained below.

The liquid crystal display device 100D has substantially the same structure as that of the liquid crystal display device 100 described in the first example, except that an additional capacitance electrode 37 is provided below the lower light shielding layer 16 and the connecting electrode 26 is connected to the additional capacitance electrode 37 via the fifth contact hole 39.

In FIG. 15A, the upper light shielding layer 18 provided above the TFT 60 is hatched so as to clearly show the position thereof. The upper light shielding layer 18 acts to prevent light from being incident on the TFT 60 from above the active matrix substrate 10D.

In FIG. 15B, a lower light shielding layer 16 provided below the TFT 60 is dotted so as to clearly show the position thereof. The lower light shielding layer 16 acts to prevent light from being incident on the TFT 60 from below the active matrix substrate 10D.

As shown in FIG. 15A, the upper light shielding layer 18 is provided so as to cover the first contact hole 27, the gate line 12, the signal line 13, a portion of the polycrystalline silicon (Si) layer 31, a portion of the additional capacitance electrode 37 and a portion of the TFT 60.

As shown in FIG. 15B, the lower light shielding layer 16 is provided so as to cover a portion of the gate line 12, the signal line 13, the first contact hole 27, the second contact hole 28, the third contact hole 29a, the fourth contact hole 32a, the polycrystalline silicon (Si) layer 31, and the TFT 60.

Figure 17:
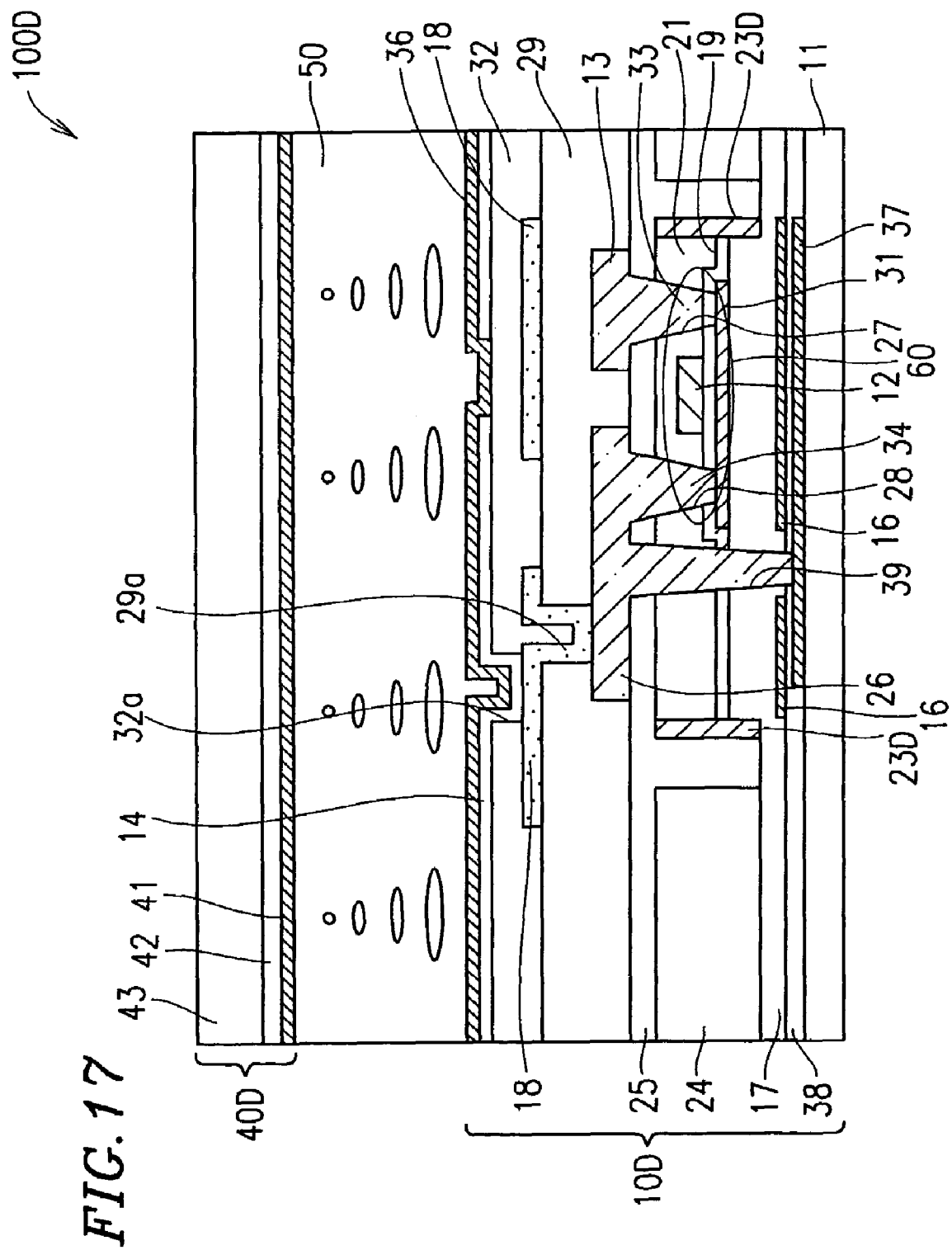
FIG. 17 is a schematic cross-sectional view of the liquid crystal display device shown in FIGS. 15A and 15B taken along line B—B of FIGS. 15A and 15B.

FIG. 16 is a schematic cross-sectional view of the liquid crystal display device 100D taken along line A—A of FIGS. 15A and 15B, and FIG. 17 is a schematic cross-sectional view of the liquid crystal display device 100D taken along line B—B of FIGS. 15A and 15B.

In the active matrix substrate 10D, the capacitance electrode 15 is not provided on the side of the gate line 12 above the polycrystalline silicon layer 31, but the additional capacitance electrode 37 is provided in a prescribed pattern on the transparent plate 11.

The additional capacitance electrode 37 is provided so as to cover a bottom surface of the signal line 13 and also the entire bottom surface of the gate line 12. The additional capacitance electrode 37 is covered with a capacitance insulating layer 38 provided on the entire surface of the transparent plate 11. The lower light shielding layer 16 is patterned as prescribed on the capacitance insulating layer 38.

The lower light shielding layer 16 is covered with the first interlayer insulating layer 17 like in the active matrix substrate 10 in the first example.

On the stepped portion of the first interlayer insulating layer 17 which covers the lower light shielding layer 16, the polycrystalline silicon layer 31 used as a part of the TFT 60 is patterned as prescribed. As shown in FIGS. 15A and 15B, a portion of the polycrystalline silicon layer 31 which is branched to be parallel to the gate line 12 is shorter and narrower than that of the polycrystalline silicon layer 31 in the first example shown in FIGS. 1A and 1B.

The second interlayer insulating layer (gate insulating layer) 19 is provided on the stepped portion of the first interlayer insulating layer 17 so as to cover the polycrystalline silicon layer 31.

The gate line 12 is patterned as prescribed on the second interlayer insulating layer 19, and the gate line 12 is covered with the third interlayer insulating layer 21 provided on the second interlayer insulating layer 19.

The side surfaces of the second interlayer insulating layer 19 and side surfaces of the third interlayer insulating layer 21 are aligned with and continuous to the side surfaces of the stepped portion of the first interlayer insulating layer 17 as in the first example. These side surfaces are substantially perpendicular to the transparent plate 11.

The side surfaces of the first interlayer insulating layer 17, the second interlayer insulating layer 19 and the third interlayer insulating layer 21 are covered with side light shielding layers 23D.

The side light shielding layers 23D are patterned as prescribed so as to be along side edges of the polycrystalline silicon layer 31 and side edges of the gate line 12 (as represented by bold dashed line in FIGS. 15A and 15B). The top surface of the side light shielding layers 23D is at the same level as and continuous to the top surface of the third interlayer insulating layer 21 and is substantially flat.

The dummy insulating layers 24 are provided on the first interlayer insulating layer 17 except for the stepped portion. The dummy insulating layers 24 are provided at an appropriate distance from the side light shielding layers 23D.

The top surface of the dummy layers 24 is substantially at the same level as the top surfaces of the third interlayer insulating layer 21 and the side light shielding layers 23D, and is substantially flat.

The fourth interlayer insulating layer 25 is provided so as to cover the dummy insulating layers 24, the third interlayer insulating layer 21 and the side light shielding layers 23D.

The fourth interlayer insulating layer 25 is also provided between the dummy insulating layers 24 and the side light shielding layers 23. The top surface of the fourth interlayer insulating layer 25 is entirely flat.

The first contact hole 27 and the second contact hole 28 are formed in the second interlayer insulating layer 19, the third interlayer insulating layer 21, and the fourth interlayer insulating layer 25.

The first contact hole 27 is filled with a conductive which is the same as the material of the signal line 13 so as form the source electrode 33 of the TFT 60. The source electrode 33 electrically connects the signal line 13 and the source region 31b of the polycrystalline silicon layer 31.

The signal line 13 is provided on the fourth interlayer insulating layer 25 in a prescribed pattern.

The second contact hole 28 is filled with a conductive which is the same as the material of a connecting electrode 26 so as to form the drain electrode 34 of the TFT 60. The drain electrode 34 electrically connects the connecting electrode 26 and the drain region 31c of the polycrystalline silicon layer 31.

The connecting electrode 26 is formed on the fourth interlayer insulating layer 25 in a rectangular pattern, so as to overlap with a part of the polycrystalline silicon layer 31 and a part of the additional capacitance electrode 37.

The fifth contact hole 39 is formed in the capacitance insulating layer 38, the first interlayer insulating layer 17, the second interlayer insulating layer 19, the third interlayer insulating layer 21, and the fourth interlayer insulating layer 25.

The fifth contact hole 39 is filled with a conductive which is the same as the material of the connecting electrode 26, so that the connecting electrode 26 and the additional capacitance electrode 37 are electrically connected to each other.

The liquid crystal display device 100D has substantially the same structure as that of the liquid crystal display device 100 described in the first example with reference to FIGS. 1 through 3, except for the above-described points.

The liquid crystal display device 100D is produced in the following manner.

FIGS. 18A through 18G are schematic cross-sectional views illustrating steps for producing an active matrix substrate 10D of the liquid crystal display device 100D shown in FIGS. 15 through 17. The cross-sectional views of FIGS. 18A through 18G correspond to the cross-sectional view of FIG. 17.

Figure 18A:
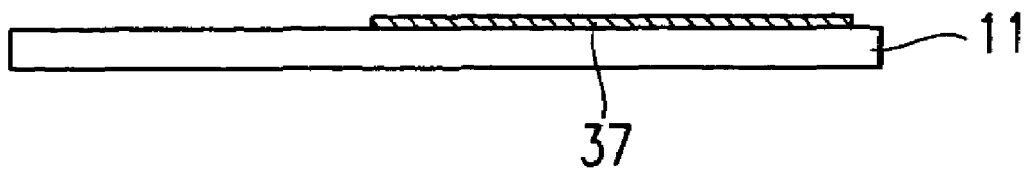
FIGS. 18A through 18G are schematic cross-sectional views illustrating steps for producing an active matrix substrate of the liquid crystal display device according to the third example.

First, on the transparent plate 11 (FIG. 18A), a polycrystalline silicon layer doped with P (phosphorus) is formed to a thickness of, for example, 100 nm, and patterned as prescribed, thereby forming the additional capacitance electrode 37 as shown in FIG. 18A.

Figure 18B:
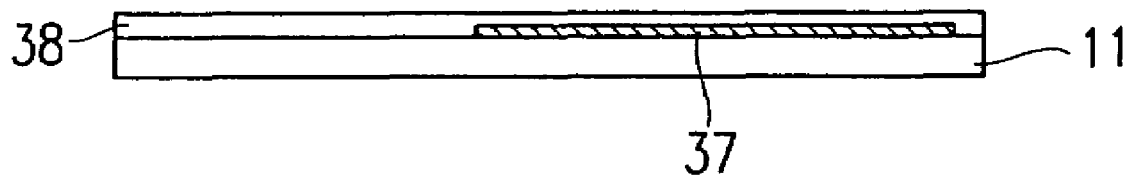

Then, as shown in FIG. 18B, the capacitance insulating layer 38 formed of $SiO_2$ is formed by, for example, CVD on the entire surface of the transparent plate 11 to a thickness of, for example, 50 nm so as to cover the additional capacitance electrode 37.

Figure 18C:
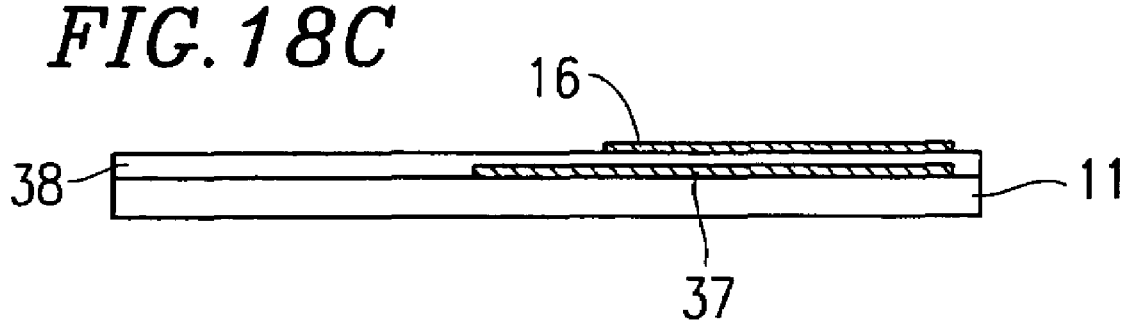

A polycrystalline silicon layer doped with P is formed on the entire surface of the capacitance insulating layer 38 to a thickness of, for example, 50 nm, and then a WSi layer is formed to a thickness of 100 nm. These layers are patterned as prescribed, thereby forming the lower light shielding layer 16 as shown in FIG. 18C.

Figure 18D:
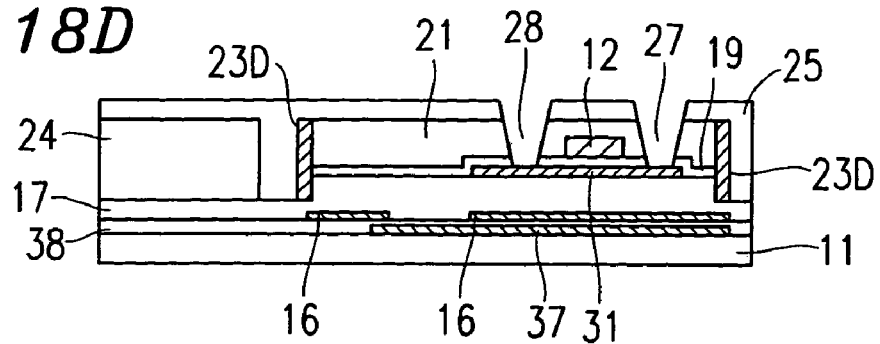

Then, the first interlayer insulating layer 17 formed of $SiO_2$ is formed by CVD on the entire surface of the capacitance insulating layer 38 to a thickness of, for example, 400 nm (FIG. 18D).

The polycrystalline silicon layer 31 is formed by CVD on the first interlayer insulating layer 17 to a thickness of 50 nm and patterned as prescribed.

The steps thereafter are the same as those of producing the liquid crystal display device 100 in the first example up to the step shown in FIG. 5J, except that the capacitance electrode 15 is not formed.

As shown in FIG. 5J, the fourth interlayer insulating layer 25 formed of $SiO_2$ is formed to a thickness of, for example, 1.5 µm. Then, as shown in FIG. 18D, prescribed portions of the fourth interlayer insulating layer 25, the third interlayer insulating layer 21 and the second interlayer insulating layer 19 are etched away, thereby forming the first contact hole 27 reaching the source region 31b of the polycrystalline silicon layer 31 and the second contact hole 28 reaching the drain region 31c of the polycrystalline silicon layer 31.

Figure 18E:
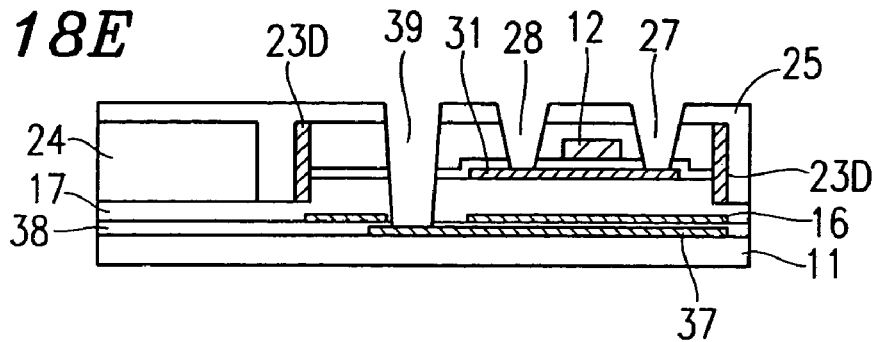
Figure 18F:
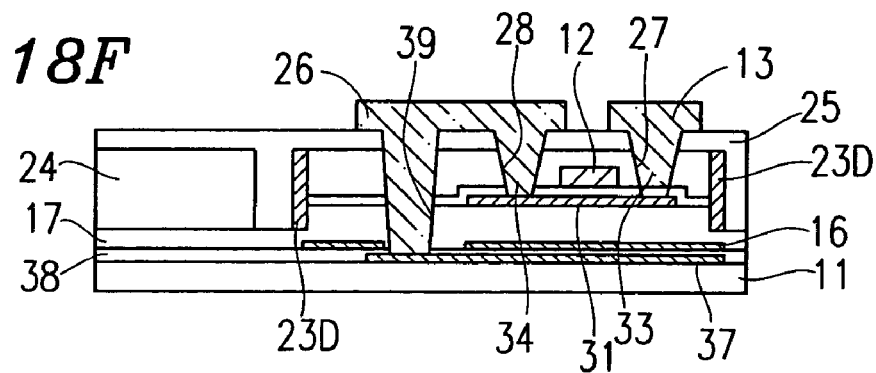

As shown in FIG. 18E, prescribed portions of the fourth interlayer insulating layer 25, the third interlayer insulating layer 21, the second interlayer insulating layer 19, the first interlayer insulating layer 17 and the capacitance insulating layer 38 are etched away, thereby forming the fifth contact hole 39 reaching a portion of the additional capacitance electrode 37 not overlapping with the polycrystalline silicon layer 31.

Then, a TiW layer having a thickness of 150 nm, an Al layer having a thickness of 400 nm, and a TiW layer having a thickness of 100 nm are sequentially formed on the resultant laminate. These layers are also provided so as to fill the first contact hole 27, the second contact hole 28, and the fifth contact hole 39. Thus, the source electrode 33 is formed in the first contact hole 27, and the drain electrode 34 is formed in the second contact hole 28. In addition, a connection portion electrically connected to the additional capacitance electrode 37 is formed in the fifth contact hole 39.

The TiW layer, the Al layer and the TiW layer formed on the fourth interlayer insulating layer 25 are patterned as prescribed, thereby forming the connecting electrode 26 and the signal line 13 on the fourth interlayer insulating layer 25. The connecting electrode 26 is connected to the drain electrode 34 and the connecting portion, and the signal line 13 is connected to the source electrode 33.

The fifth interlayer insulating layer 29 is formed on the resultant laminate and flattened. A prescribed portion of the fifth interlayer insulating layer 29 is etched away, thereby forming the third contact hole 29a reaching the connecting electrode 26.

A TiW layer having a thickness of 125 nm is formed on the fifth interlayer insulating layer 29 so as to fill the third contact hole 29a and patterned, thereby forming the upper light shielding layer 18. The upper light shielding layer 18 is conductive and is connected to the connecting electrode 26 via the third contact hole 29a.

Then, the sixth interlayer insulating layer 32 having a thickness of, for example, 500 nm is formed on the resultant laminate by plasma CVD using TEOS as a material gas, and flattened.

A prescribed portion of the sixth interlayer insulating layer 32 is etched away, thereby forming the fourth contact hole 32a reaching the conductive upper light shielding layer 18.

Figure 18G:
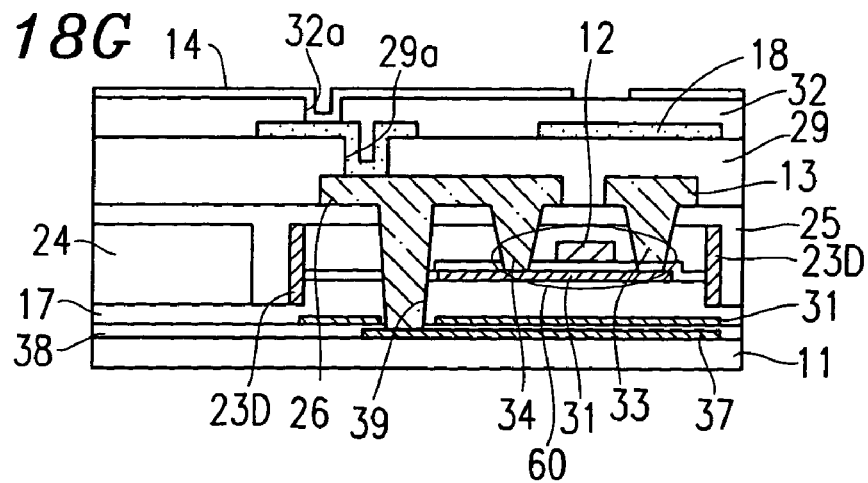

As shown in FIG. 18G, an ITO layer having a thickness of, for example, 100 nm is formed on the entire surface of the resultant laminate, and patterned as prescribed, thereby forming the plurality of pixel electrodes 14 which are arranged in a matrix.

The alignment layer 36 is provided so as to cover the sixth interlayer insulating layer 32 so as to cover all the pixel electrodes 14.

In this manner, the active matrix substrate 10D is produced. The active matrix substrate 10D and the counter substrate 40 are located such that the alignment layers 36 and 43 thereof are opposed to each other with a prescribed distance therebetween. The liquid crystal layer 50 is provided between the alignment layers 36 and 43. Thus, the liquid crystal display device 100D is produced.

In the third example, the side light shielding layers 23D are provided to be substantially perpendicular to the transparent plate 11 above the side edges of the lower light shielding layer 16 with the first interlayer insulating layer 17 being interposed therebetween. Therefore, the side light shielding layers 23D are electrically floating. The present invention is not limited to such a structure.

Figure 19:
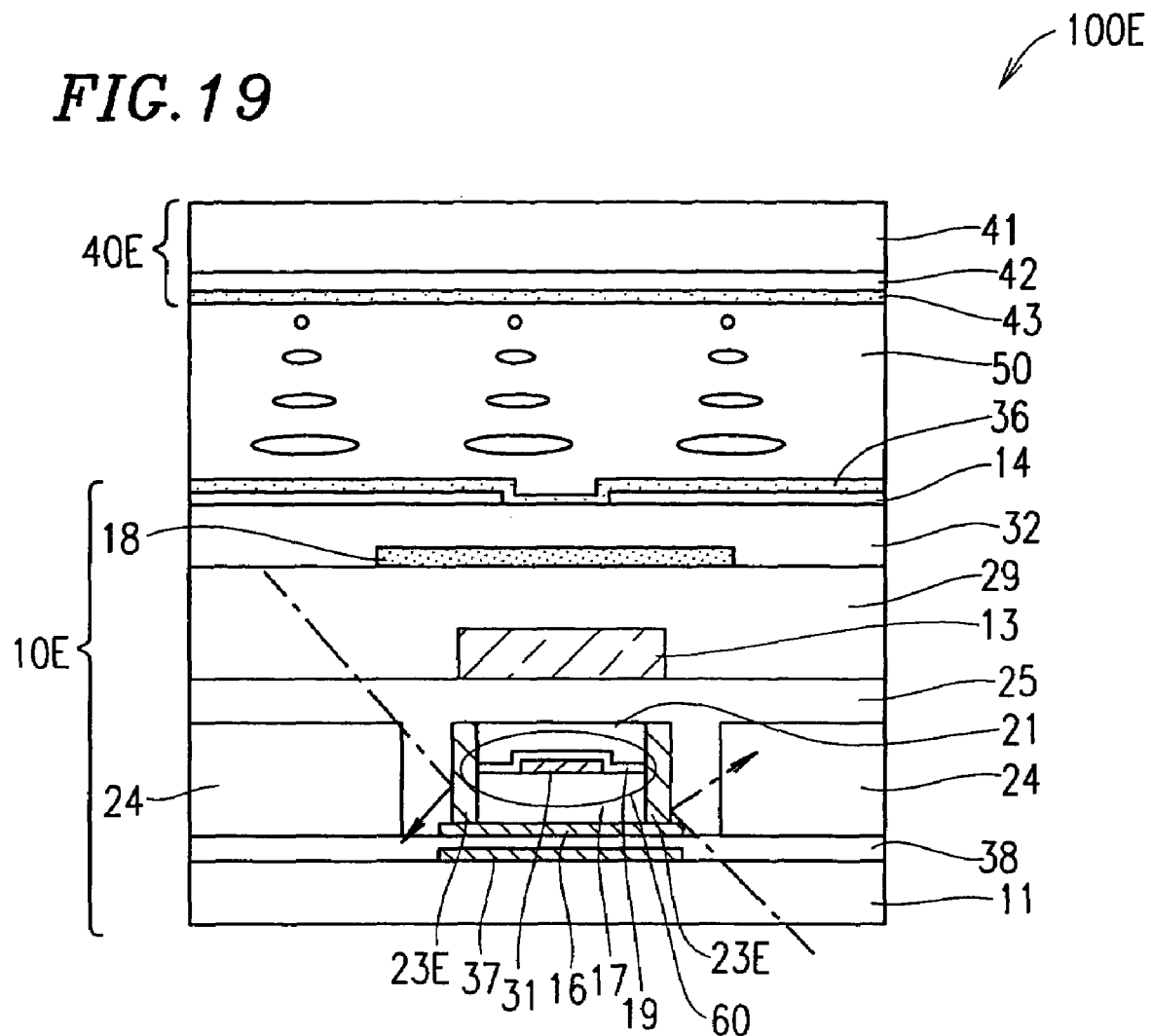
FIG. 19 is a schematic cross-sectional view of a liquid crystal display device as a modification of the third example of the present invention.
Figure 20:
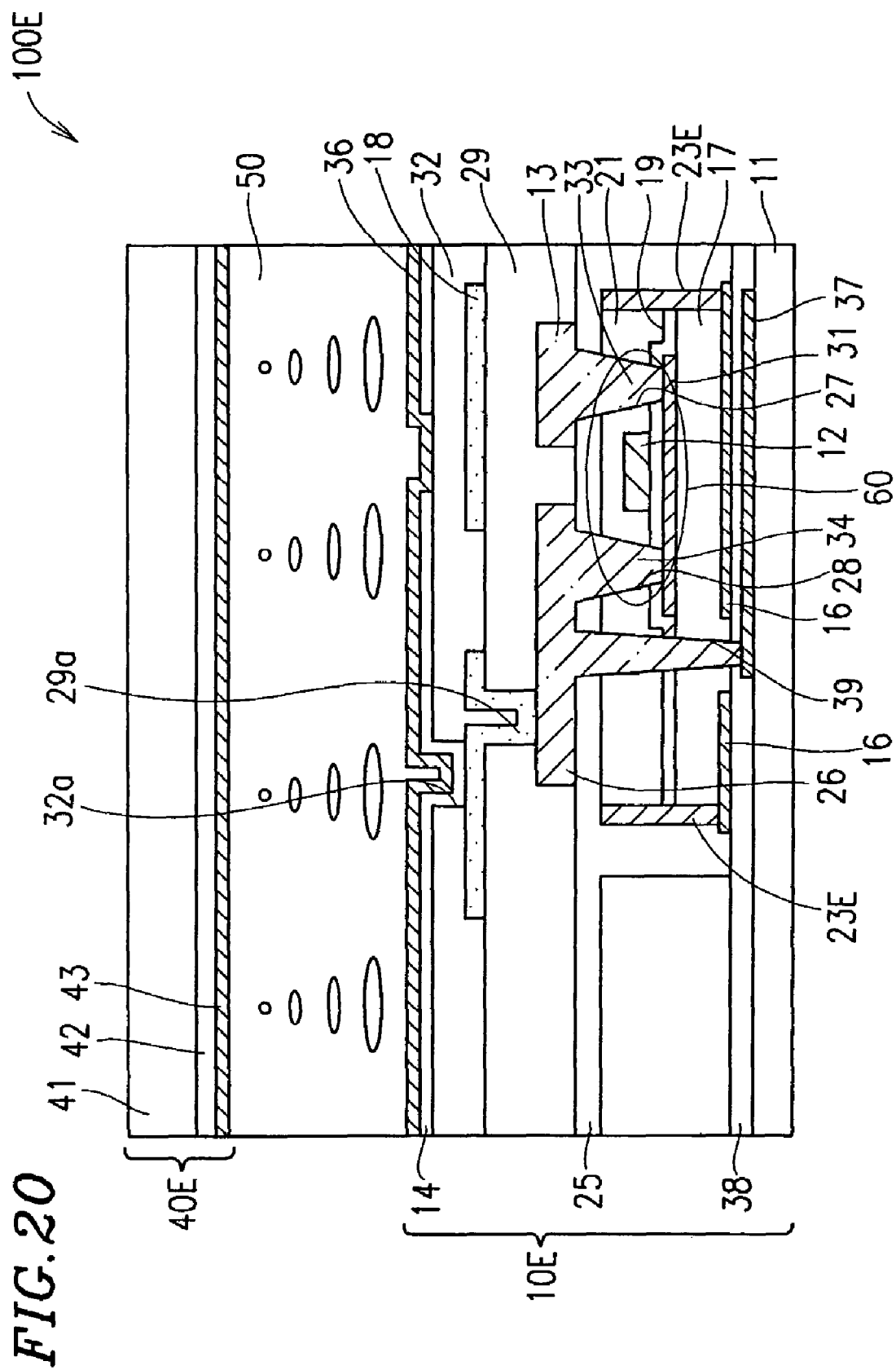
FIG. 20 is a schematic cross-sectional view of the liquid crystal display device shown in FIG. 19.

FIG. 19 is a schematic cross-sectional view of a liquid crystal display device 100E as a modification of the third example of the present invention. FIG. 19 corresponds to FIG. 16. FIG. 20 is a schematic cross-sectional view of the liquid crystal display device 100E shown in FIG. 19. FIG. 20 corresponds to FIG. 17.

As shown in FIGS. 19 and 20, in the liquid crystal display device 100E, side light shielding layers 23E are in contact with side edges of the lower light shielding layer 16 and are substantially perpendicular to the transparent plate 11. Since at least one side light shielding layer 23E is in contact with the side edge(s) of the lower light shielding layer 16, the side light shielding layer 23E is electrically fixed to the same potential as the surface of the lower light shielding layer 16. As a result, change in the characteristics of the TFT 60, which may be caused by the parasitic capacitances in side light shielding layer 23E and areas in the vicinity thereof, is suppressed.

EXAMPLE 4

In the third example, the side light shielding layers are provided so as to cover the side surfaces of the polycrystalline silicon layer and the gate line above the polycrystalline silicon layer. The present invention is not limited to such a structure. The side light shielding layers may be provided so as to also cover the side surfaces of the signal line provided above the polycrystalline silicon layer.

In a fourth example of the present invention, a liquid crystal display device in which the side light shielding layer for covering the side surfaces of the signal line provided above the polycrystalline silicon layer, in addition to the side surfaces of the polycrystalline silicon layer and the gate line provided above the polycrystalline silicon layer will be described.

Figure 21:
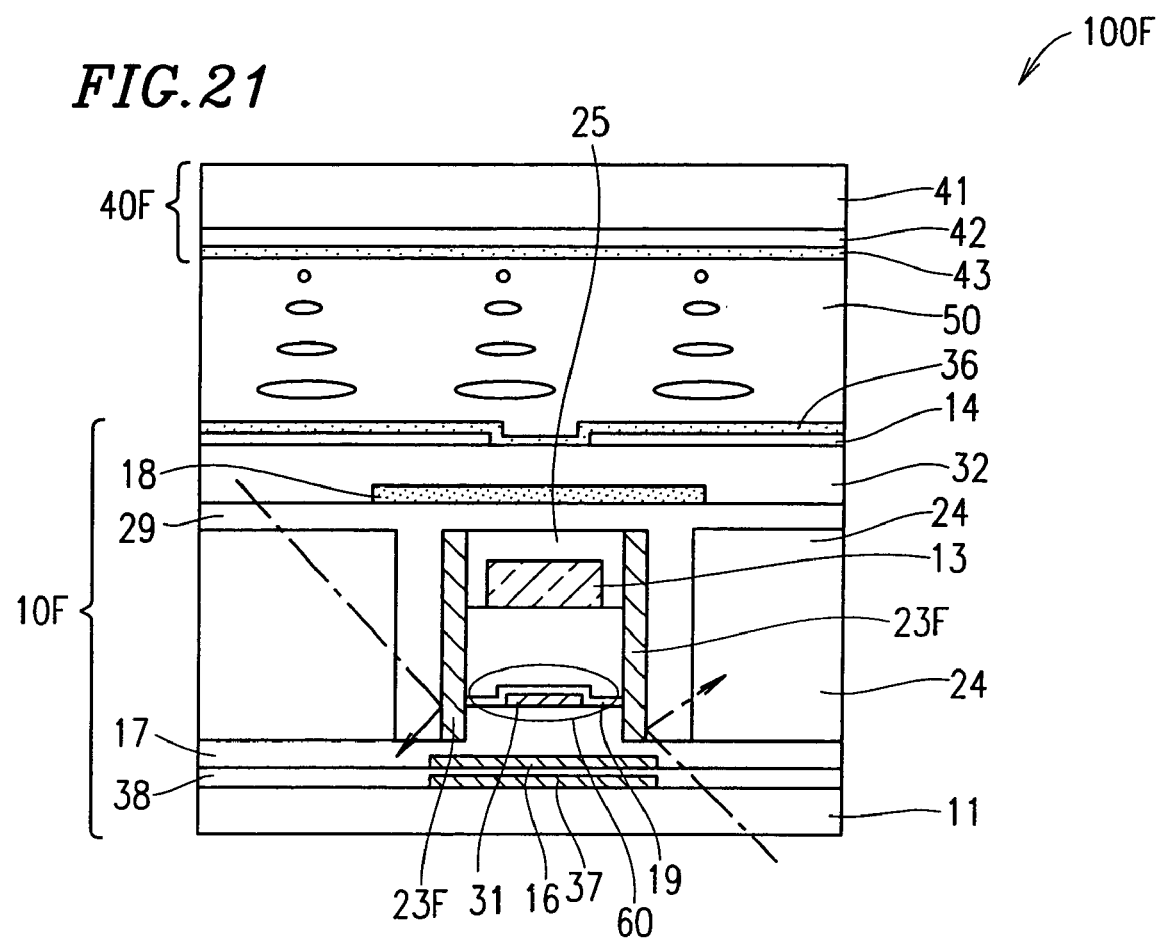
FIG. 21 is a schematic cross-sectional view of a liquid crystal display device according to a fourth example of the present invention.
Figure 22:
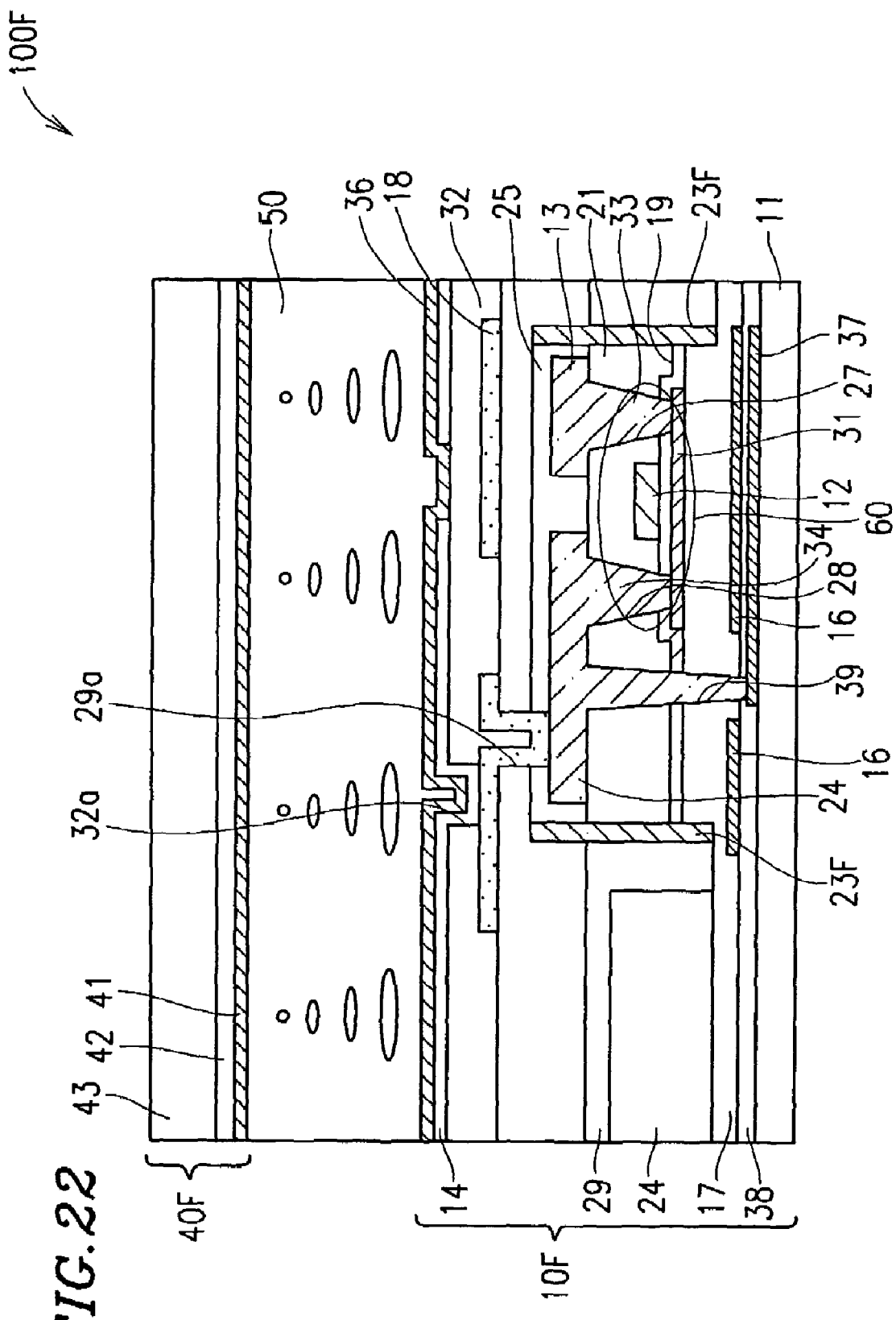
FIG. 22 is a schematic cross-sectional view of the liquid crystal display device shown in FIG. 21.

FIG. 21 is a schematic cross-sectional view of a liquid crystal display device 100F according to the fourth example of the present invention. FIG. 21 corresponds to FIG. 16. FIG. 22 is a schematic cross-sectional view of the liquid crystal display device 100F shown in FIG. 21. FIG. 22 corresponds to FIG. 17.

The liquid crystal display device 100F has substantially the same structure as that of the liquid crystal display device 100D described in the third example, except that side light shielding layers 23F cover the side surfaces of the signal line 13 provided above the polycrystalline silicon layer 31 in addition to the side surfaces of the polycrystalline silicon layer 31 and the gate line 12 provided above the polycrystalline silicon layer 31.

An active matrix substrate 10F of the liquid crystal display device 100F is produced in the following manner.

First, as the active matrix substrate 10D described in the third example, on the transparent plate 11, a polycrystalline silicon layer doped with P is formed to a thickness of 100 nm and patterned as prescribed, thereby forming the additional capacitance electrode 37. The capacitance insulating layer 38 formed of $SiO_2$ is formed by, for example, CVD on the entire surface of the transparent plate 11 to a thickness of, for example, 50 nm so as to cover the additional capacitance electrode 37.

Then, a polycrystalline silicon layer doped with P is formed thereon to a thickness of 50 nm, and a WSi layer is formed thereon to a thickness of 100 nm. These layers are patterned as prescribed, thereby forming the lower light shielding layer 16.

Next, the first interlayer insulating layer 17 formed of $SiO_2$ is formed by CVD on the entire surface of the resultant laminate to a thickness of, for example, 400 nm. Then the polycrystalline silicon layer 31 is formed thereon by CVD to a thickness of 50 nm in a prescribed pattern.

The steps thereafter are the same as those of producing the liquid crystal display device 100B in the second example shown in FIGS. 11A through 11I, except that the capacitance electrode 15 is not formed.

The other steps are the same as those shown in FIGS. 18D through 18G.

In the fourth example, the side light shielding layers 23F are provided to be substantially perpendicular to the transparent plate 11 above the side edges of the lower light shielding layer 16 with the first interlayer insulating layer 17 being interposed therebetween. Therefore, the side light shielding layers 23F are electrically floating. The present invention is not limited to such a structure.

Figure 23:
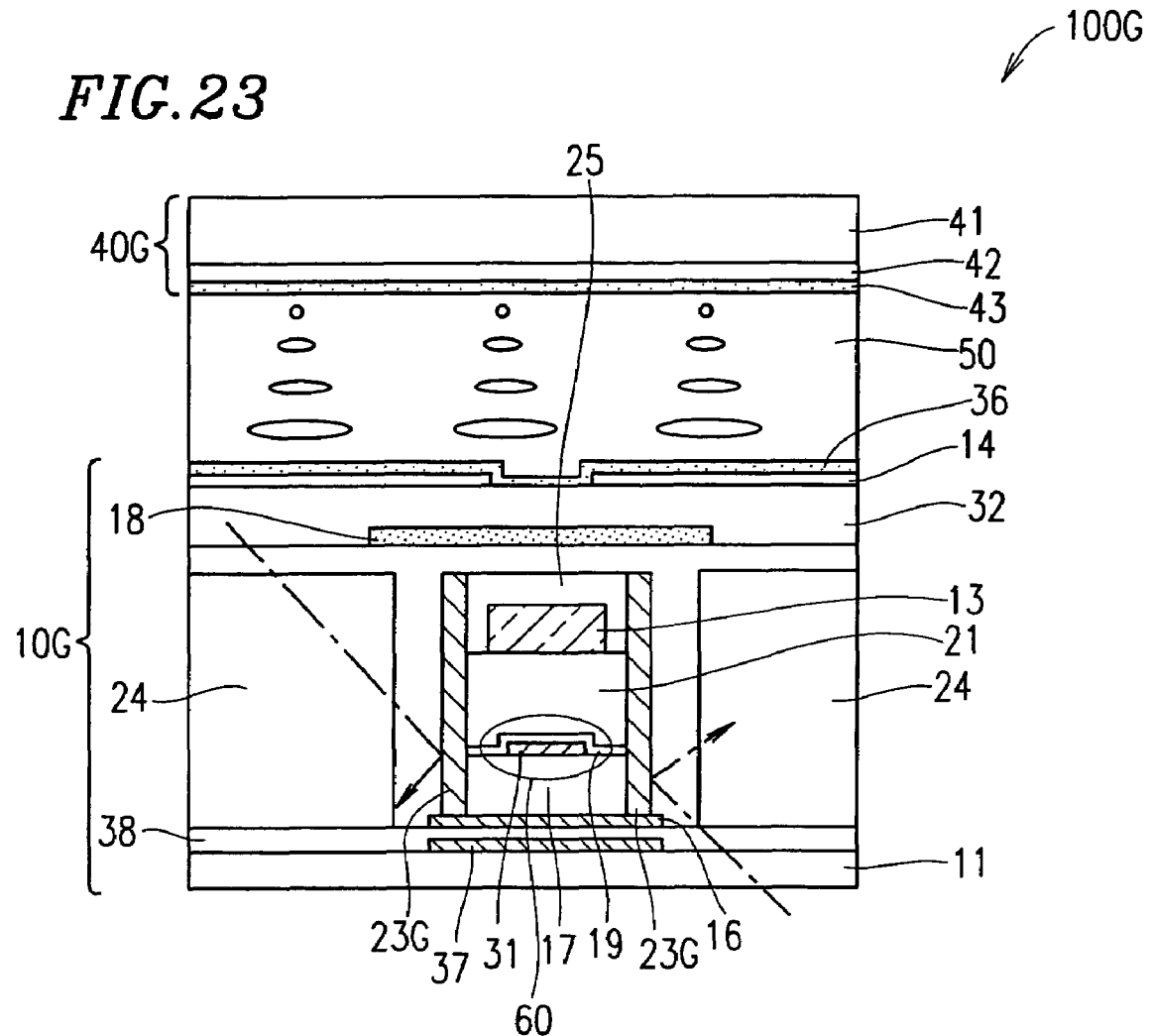
FIG. 23 is a schematic cross-sectional view of a liquid crystal display device as a modification of the fourth example of the present invention.
Figure 24:
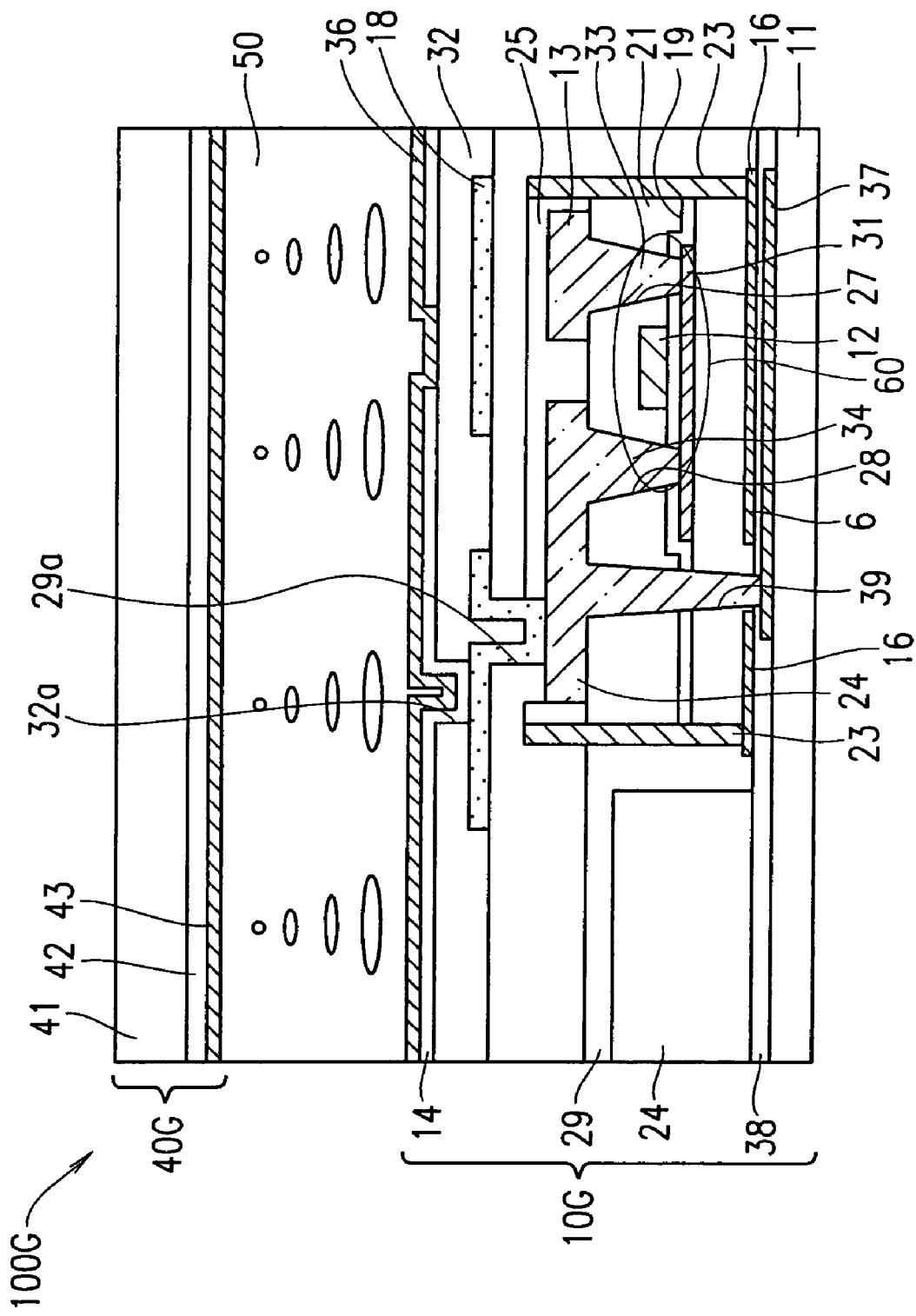
FIG. 24 is a schematic cross-sectional view of the liquid crystal display device shown in FIG. 23.

FIG. 23 is a schematic cross-sectional view of a liquid crystal display device 100G as a modification of the fourth example of the present invention. FIG. 23 corresponds to FIG. 16. FIG. 24 is a schematic cross-sectional view of the liquid crystal display device 100G shown in FIG. 23. FIG. 24 corresponds to FIG. 17.

As shown in FIGS. 23 and 24, in the liquid crystal display device 100G, side light shielding layers 23G are in contact with side edges of the lower light shielding layer 16 and are substantially perpendicular to the transparent plate 11. Since at least one side light shielding layer 23G is in contact with the side edge(s) of the lower light shielding layer 16, the side light shielding layer 23G is electrically fixed to the same potential as the surface of the lower light shielding layer 16. As a result, change in the characteristics of the TFT 60, which may be caused by the parasitic capacitances in the side light shielding layer 23G and areas in the vicinity thereof, is suppressed.

EXAMPLE 5

In the third and fourth examples, the additional capacitance electrode is provided below the lower light shielding layer. The present invention is not limited to such a structure. The additional capacitance electrode may be provided above the lower light shielding layer, i.e., between the lower light shielding layer and the TFT.

In a fifth example of the present invention, a liquid crystal display device in which the additional capacitance electrode is provided above the lower light shielding layer will be described.

Figure 25:
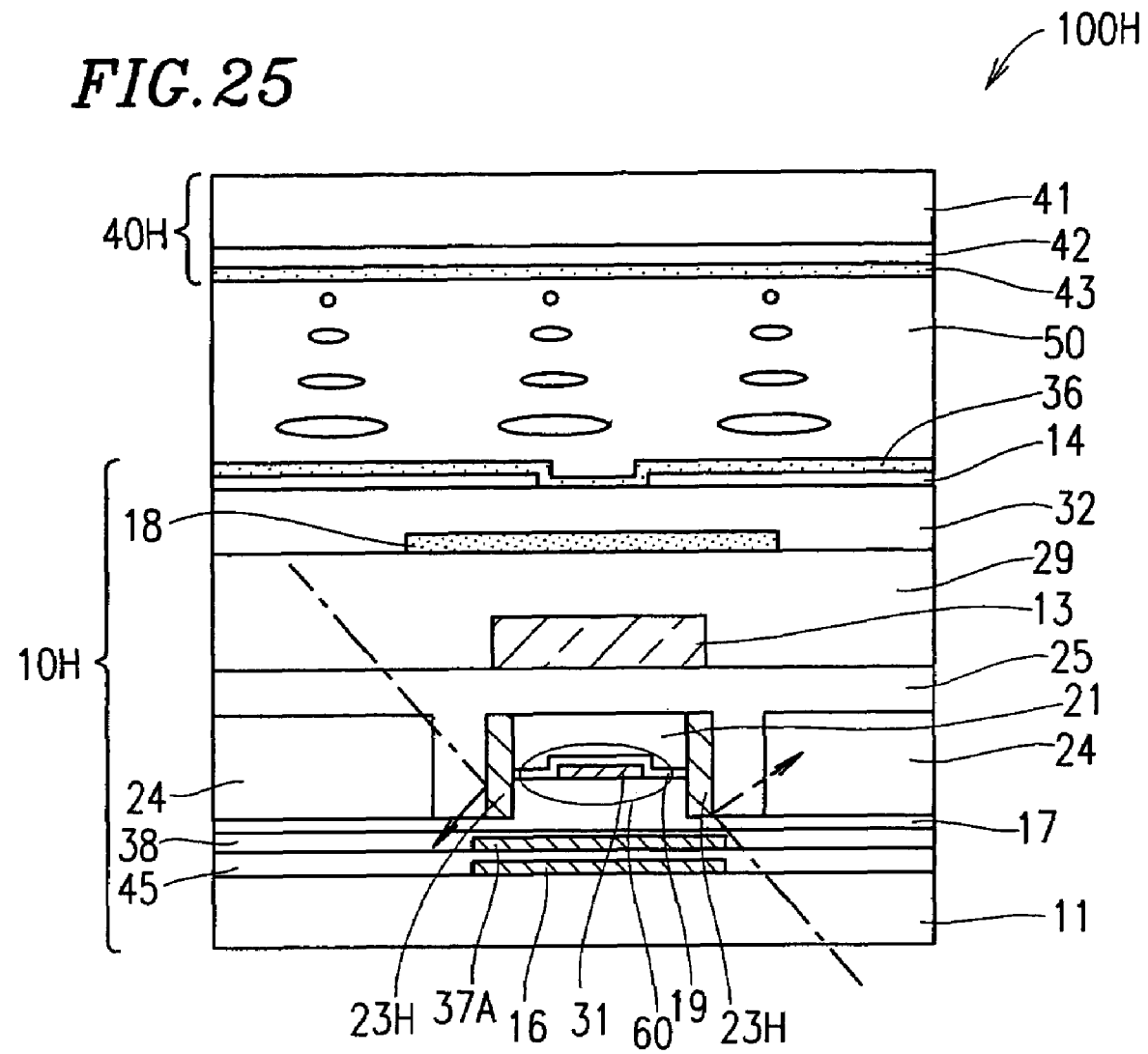
FIG. 25 is a schematic cross-sectional view of a liquid crystal display device according to a fifth example of the present invention.
Figure 26:
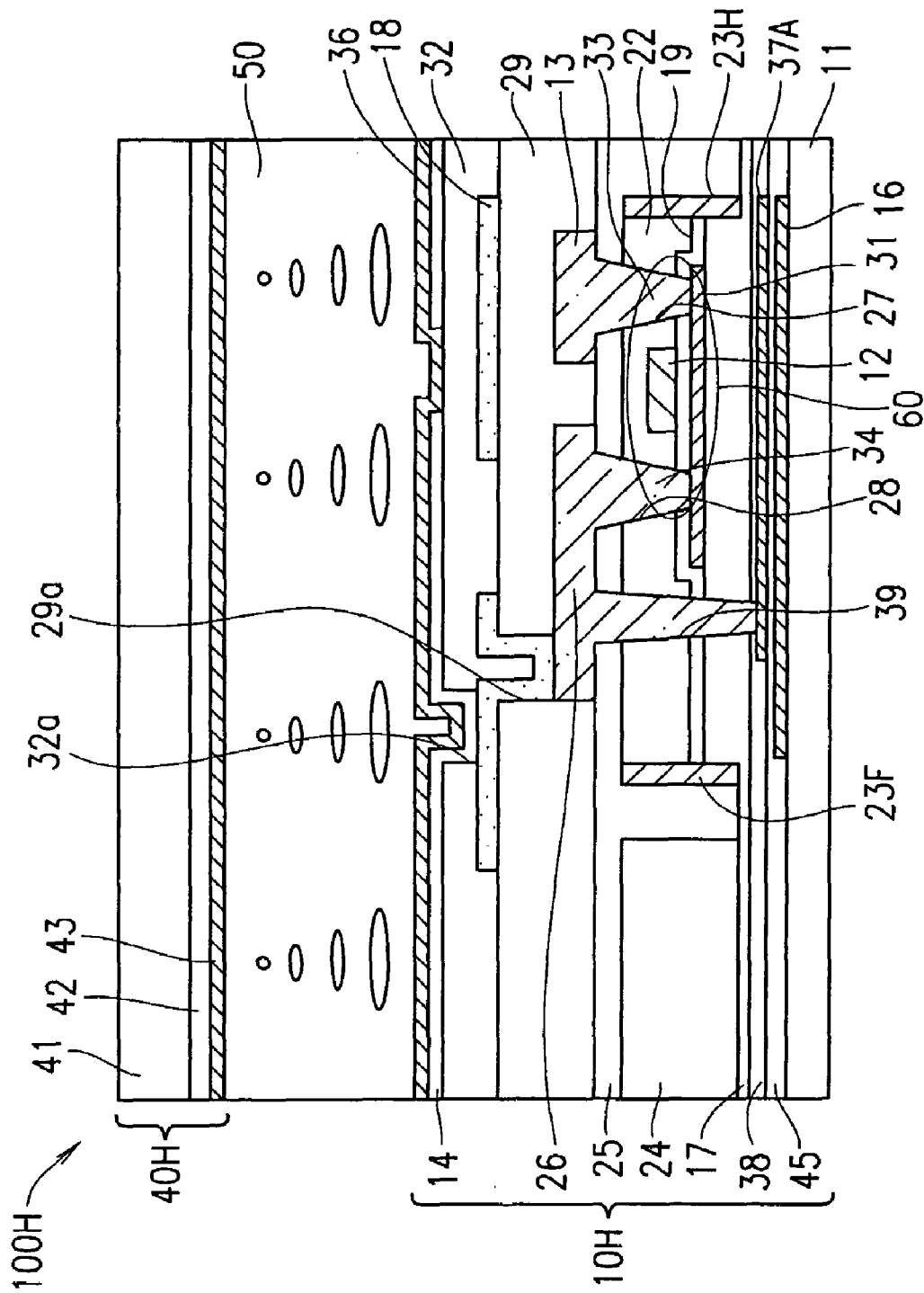
FIG. 26 is a schematic cross-sectional view of the liquid crystal display device shown in FIG. 25.

FIG. 25 is a schematic cross-sectional view of a liquid crystal display device 100H according to the fifth example of the present invention. FIG. 25 corresponds to FIG. 16. FIG. 26 is a schematic cross-sectional view of the liquid crystal display device 100H shown in FIG. 25. FIG. 26 corresponds to FIG. 17.

The liquid crystal display device 100H has substantially the same structure as that of the liquid crystal display device 100D described in the third example, except that the additional capacitance electrode 37A is provided above the lower light shielding layer 16.

The lower light shielding layer 16 is formed on the transparent plate 11 in a prescribed pattern and covered with an insulating layer 45. Then, an additional capacitance electrode 37A is formed on the insulating layer 45 in a prescribed pattern. The additional capacitance electrode 37A is covered with the capacitance insulating layer 38, which is in turn covered with the first interlayer insulating layer 17. The polycrystalline silicon layer 31 is formed on the first interlayer insulating layer 17 in a prescribed pattern.

The connecting electrode 26 provided above the polycrystalline silicon layer 31 is electrically connected to the additional capacitance electrode 37A above the lower light shielding layer 16 via the drain electrode 34 in the fifth contact hole 39.

An active matrix substrate 10H of the liquid crystal display device 100H is produced in the following manner.

A polycrystalline silicon layer doped with P is formed on the transparent plate 11 to a thickness of 50 nm, and a WSi layer is formed thereon to a thickness of, for example, 100 nm. These layers are patterned as prescribed, thereby forming the lower light shielding layer 16.

Next, the insulating layer 45 formed of SiO$_2$ is formed by, for example, CVD on the entire surface of the transparent plate 11 to a thickness of, for example, 50 nm so as to cover the lower light shielding layer 16.

A polycrystalline silicon layer doped with P is formed thereon to a thickness of 100 nm and patterned, thereby forming the additional capacitance electrode 37A.

An SiO$_2$ layer is formed by, for example, CVD on the resultant laminate to a thickness of 50 nm, thereby forming the capacitance insulating layer 38.

The first interlayer insulating layer 17 formed of SiO$_2$ is formed by CVD on the resultant laminate to a thickness of, for example, 400 nm.

The polycrystalline silicon layer 31 is formed by CVD on the first interlayer insulating layer 17 to a thickness of 50 nm in a prescribed pattern.

The steps thereafter are the same as those of producing the liquid crystal display device 100D in the third example, except that the fifth contact hole 39 is formed so as to reach the additional capacitance electrode 37A above the lower light shielding layer 16.

In the fifth example, the side light shielding layers 23H are provided to be substantially perpendicular to the transparent plate 11 above the side edges of the lower light shielding layer 16 with the first interlayer insulating layer 17 being interposed therebetween. Therefore, the side light shielding layers 23H are electrically floating. The present invention is not limited to such a structure.

Figure 27:
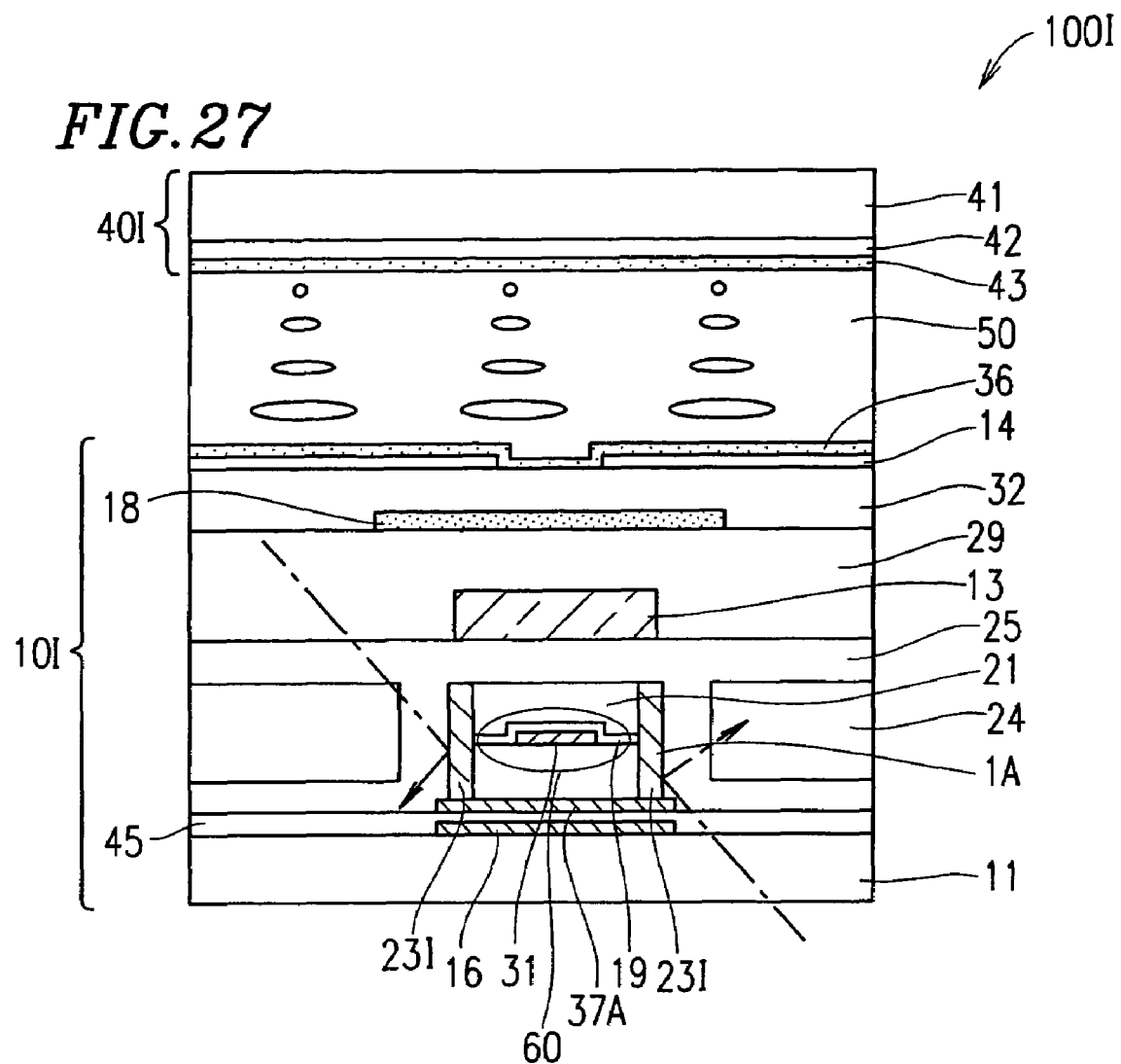
FIG. 27 is a schematic cross-sectional view of a liquid crystal display device as a modification of the fifth example of the present invention.
Figure 28:
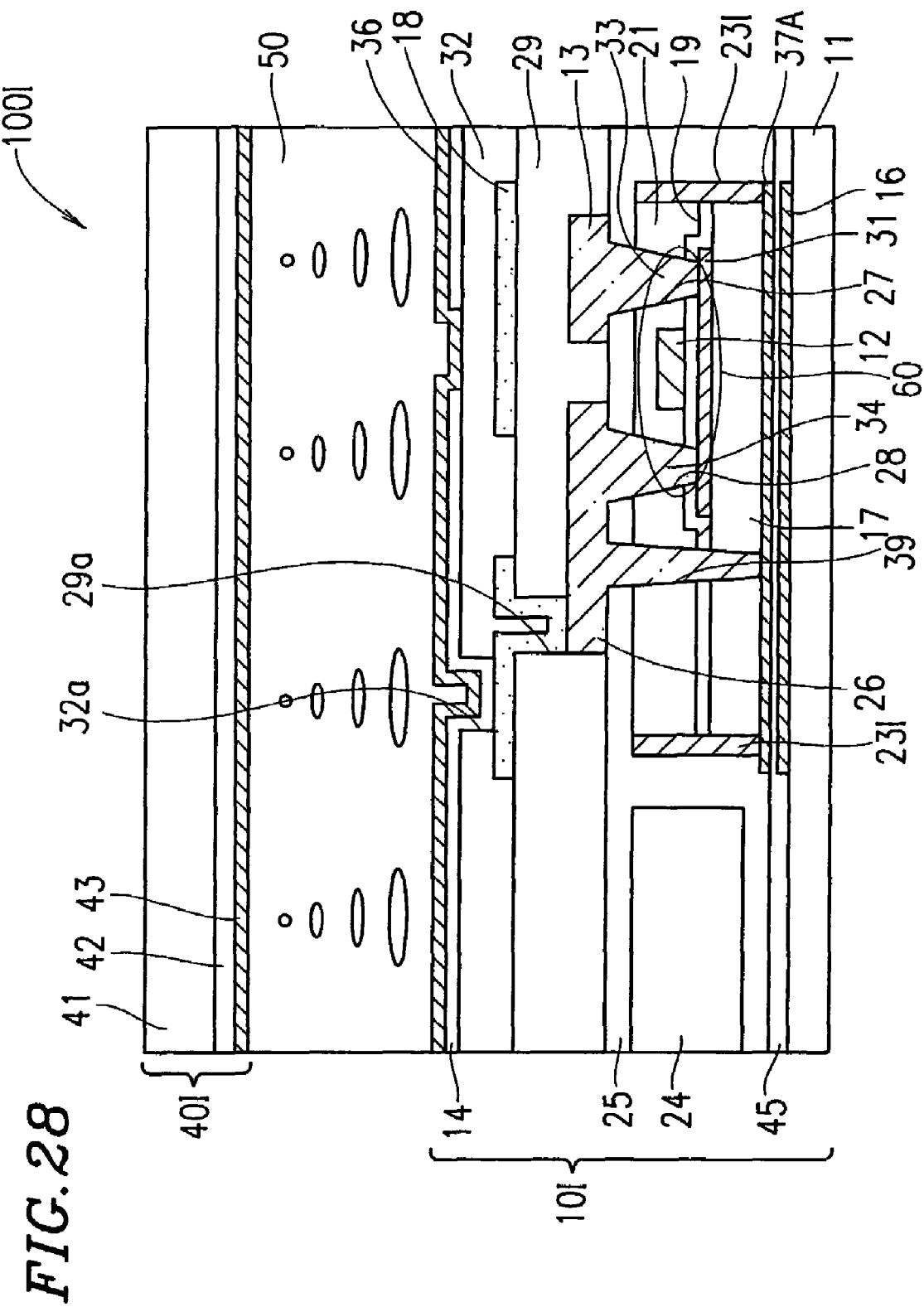
FIG. 28 is a schematic cross-sectional view of the liquid crystal display device shown in FIG. 27.

FIG. 27 is a schematic cross-sectional view of a liquid crystal display device 100I as a modification of the fifth example of the present invention. FIG. 27 corresponds to FIG. 16. FIG. 28 is a schematic cross-sectional view of the liquid crystal display device 100I shown in FIG. 27. FIG. 28 corresponds to FIG. 17.

As shown in FIGS. 27 and 28, in the liquid crystal display device 100I, side light shielding layers 23I are in contact with side edges of the additional capacitance electrode 37A and are substantially perpendicular to the transparent plate 11. Since at least one side light shielding layer 23I is in contact with the side edge(s) of the additional capacitance electrode 37A, the side light shielding layer 23I is electrically fixed to the same potential as the surface of the additional capacitance electrode 37A. As a result, change in the characteristics of the TFT 60, which may be caused by the parasitic capacitances in the side light shielding layer 23I and areas in the vicinity thereof, is suppressed.

EXAMPLE 6

In the fifth example, the side light shielding layers are provided so as to cover the side surfaces of the polycrystalline silicon layer and the gate line above the polycrystalline silicon layer. The present invention is not limited to such a structure. The side light shielding layer may be provided so as to also cover the side surfaces of the signal line provided above the polycrystalline silicon layer.

In a sixth example of the present invention, a liquid crystal display device in which the side light shielding layer for covering the side surfaces of the signal line provided above the polycrystalline silicon layer, in addition to the side surfaces of the polycrystalline silicon layer and the gate line provided above the polycrystalline silicon layer will be described.

Figure 29:
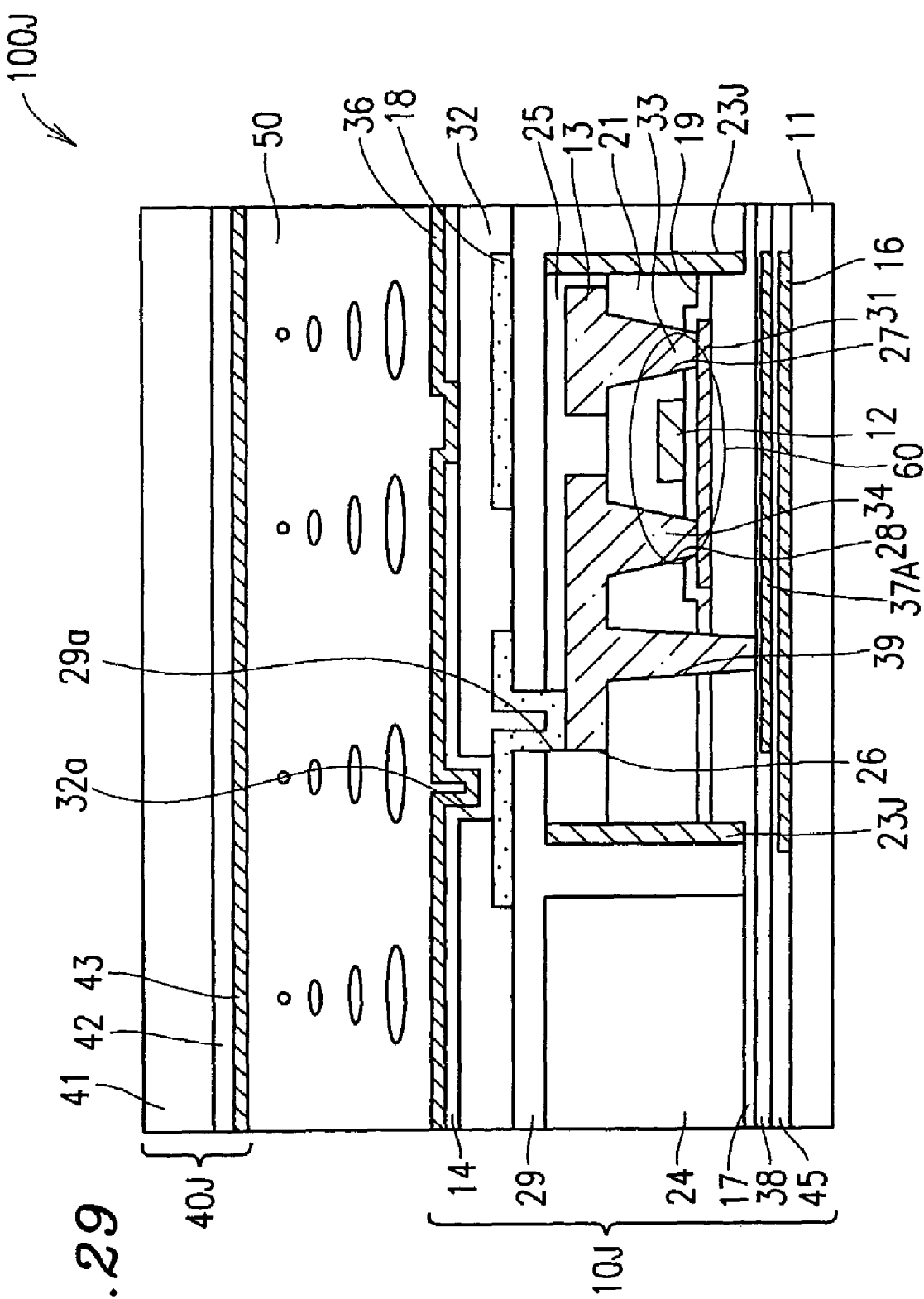
FIG. 29 is a schematic cross-sectional view of a liquid crystal display device according to a sixth example of the present invention.

FIG. 29 is a schematic cross-sectional view of a liquid crystal display device 100J according to the sixth example. FIG. 29 corresponds to FIG. 26.

The liquid crystal display device 100J has substantially the same structure as that of the liquid crystal display device 100H described in the fifth example, except that side light shielding layers 23J cover the side surfaces of the signal line 13 provided above the polycrystalline silicon layer 31 in addition to the side surfaces of the polycrystalline silicon layer 31 and the gate line 12 provided above the polycrystalline silicon layer 31.

An active matrix substrate 10J of the liquid crystal display device 100J is produced in the following manner.

On the transparent plate 11, a polycrystalline silicon layer doped with P is formed to a thickness of 50 nm, and a WSi layer is formed to a thickness of, for example, 100 nm. These layers are patterned as prescribed, thereby forming the lower light shielding layer 16.

The insulation layer 45 formed of SiO$_2$ is formed by, for example, CVD on the transparent plate 11 to a thickness of, for example, 50 nm, so as to cover the lower light shielding layer 16.

A polycrystalline silicon layer doped with P is formed thereon to a thickness of 100 nm and patterned as prescribed, thereby forming the additional capacitance electrode 37A.

The capacitance insulating layer 38 formed of SiO$_2$ is formed by, for example, CVD on the resultant laminate to a thickness of 50 nm and patterned as prescribed.

The first interlayer insulating layer 17 formed of SiO$_2$ is formed by CVD on the resultant laminate to a thickness of, for example, 400 nm.

Then, the polycrystalline silicon layer 31 is formed by CVD on the first interlayer insulating layer 17 to a thickness of 50 nm and patterned as prescribed.

The steps thereafter are the same as those of producing the liquid crystal display device 100B in the second example, except that the fifth contact hole 39 is formed so as to reach the additional capacitance electrode 37 above the lower light shielding layer 16.

In the sixth example, the side light shielding layers 23J are provided to be substantially perpendicular to the transparent plate 11 above the side edges of the lower light shielding layer 16 with the first interlayer insulating layer 17 being interposed therebetween. Therefore, the side light shielding layers 23J are electrically floating. The present invention is not limited to such a structure.

Figure 30:
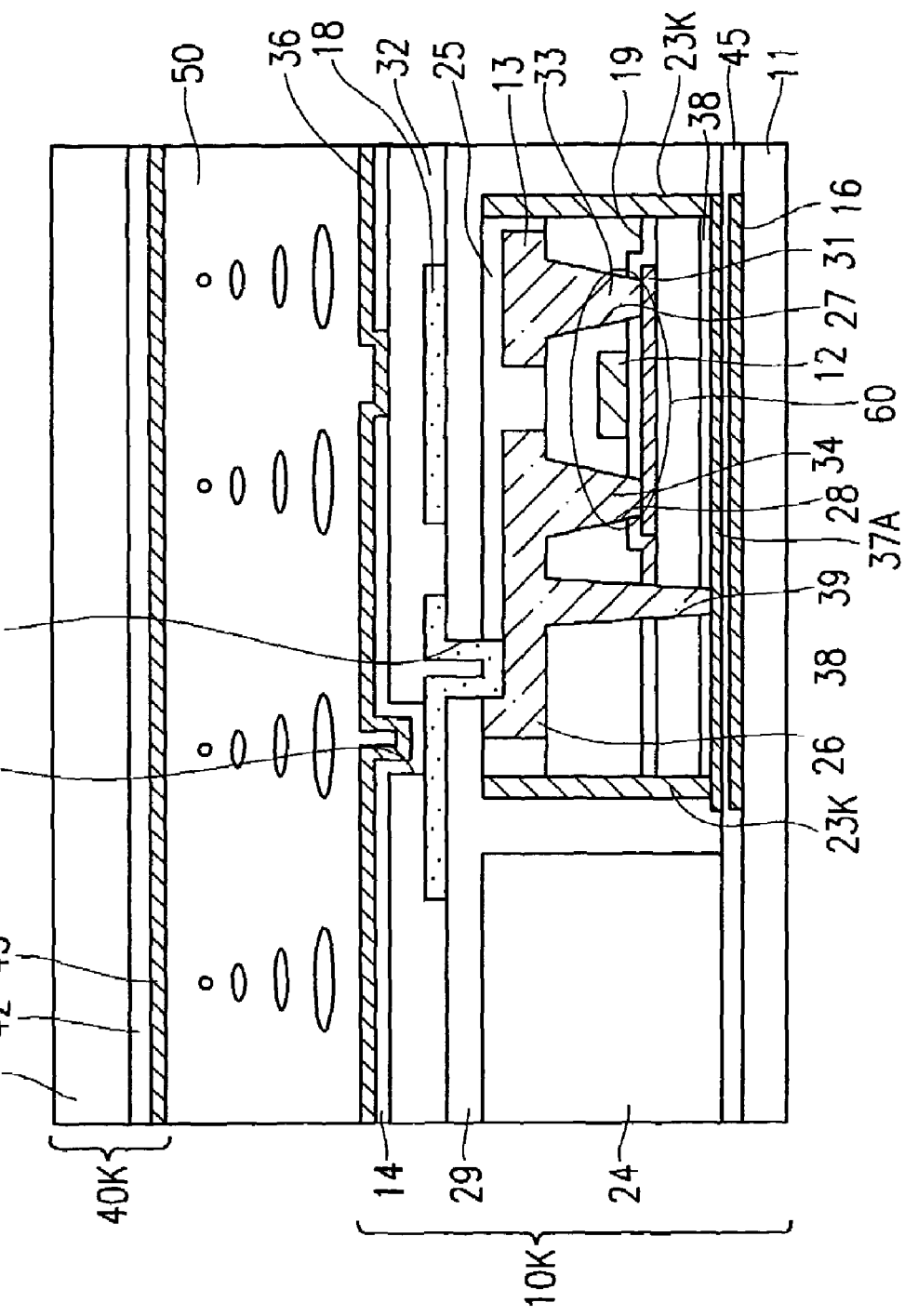
FIG. 30 is a schematic cross-sectional view of the liquid crystal display device shown in FIG. 29.

FIG. 30 is a schematic cross-sectional view of a liquid crystal display device 100K as a modification of the sixth example of the present invention. FIG. 30 corresponds to FIG. 17.

As shown in FIG. 30, in the liquid crystal display device 100K, side light shielding layers 23K are in contact with side edges of the additional capacitance electrode 37A and are substantially perpendicular to the transparent plate 11. Since at least one side light shielding layer 23K is in contact with the side edge(s) of the additional capacitance electrode 37A, the side light shielding layer 23K is electrically fixed to the same potential as the surface of the additional capacitance electrode 37A. As a result, change in the characteristics of the TFT 60, which may be caused by the parasitic capacitances in the side light shielding layer 23K and areas in the vicinity thereof, is suppressed.

EXAMPLE 7

In the fourth example, the additional capacitance electrode is provided below the lower light shielding layer, and the additional capacitance electrode and the connecting electrode are directly connected to each other. The present invention is not limited to such a structure. The additional capacitance electrode provided below the lower light shielding layer may be connected to the connecting electrode via a conductive portion, which is located at the same level as the gate line.

In a seventh example of the present invention, an liquid crystal display device including a conductive portion for electrically connecting the additional capacitance electrode and the connecting electrode will be described.

Figure 31A:
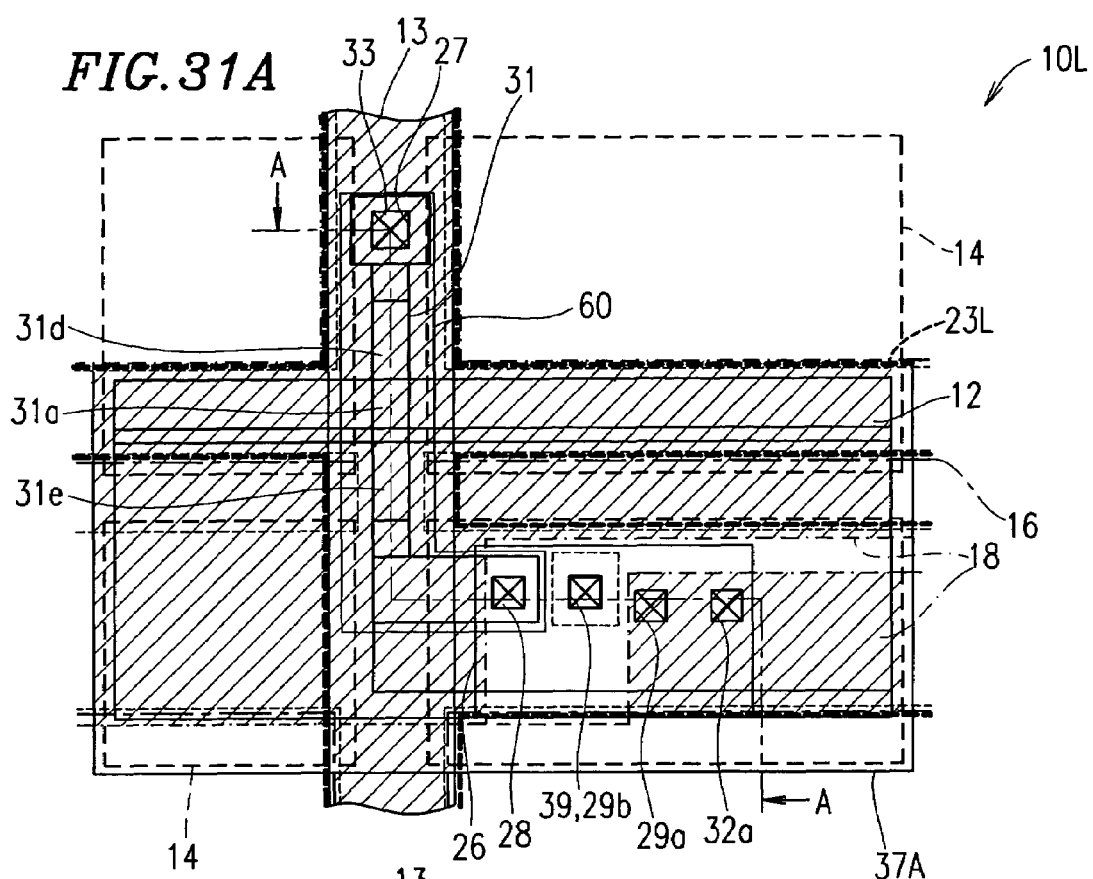
FIGS. 31A and 31B are each a schematic plan view of a portion of an active matrix substrate of a liquid crystal display device according to a seventh example of the present invention, where one gate line and one signal line cross each other.
Figure 31B:
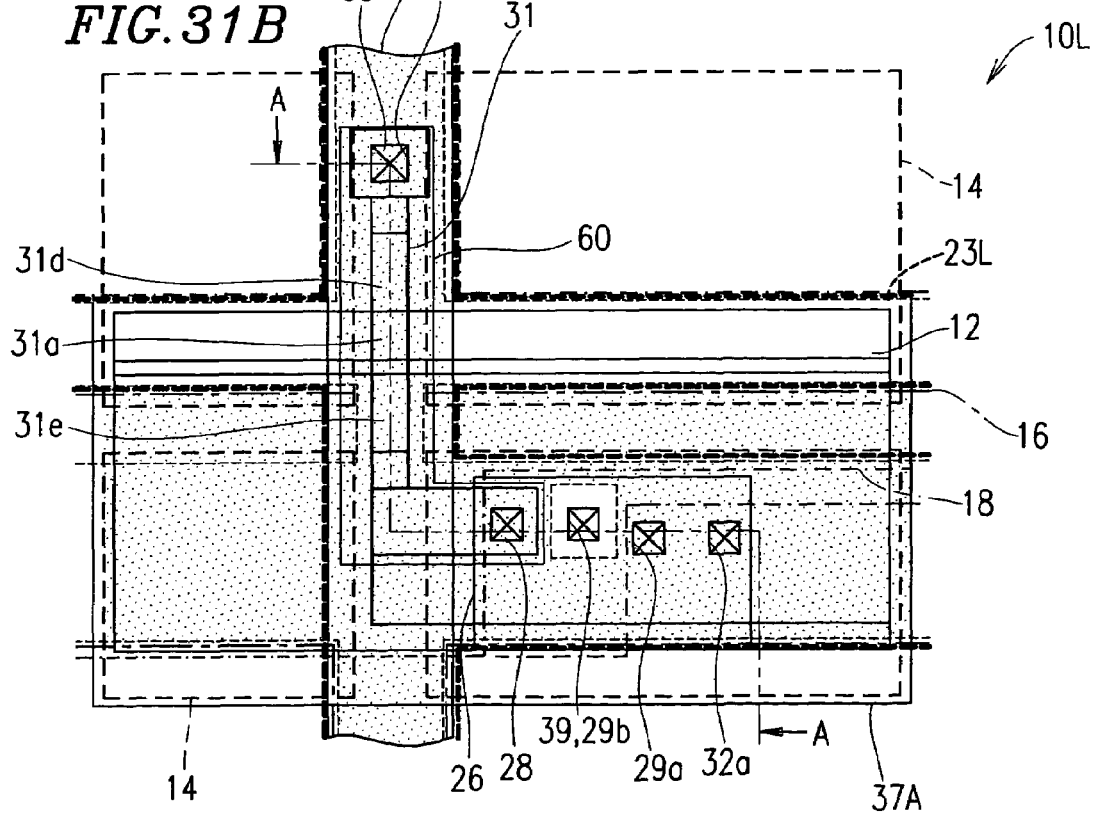

FIGS. 31A and 31B are each a schematic plan view of a portion of an active matrix substrate 10L of a liquid crystal display device 100L, according to the seventh example of the present invention, where one gate line 12 and one signal line 13 cross each other.

FIGS. 31A and 31B each show only one gate line 12 and one signal line 13, but the active matrix substrate 10L includes a plurality of gate lines 12 and a plurality of signal lines 13.

FIGS. 31A and 31B represent the same liquid crystal display device 100L such that the positions of light shielding layers are clear as explained below.

In FIG. 31A, an upper light shielding layer 18 provided above a TFT 60 is hatched so as to clearly show the position thereof. The upper light shielding layer 18 acts to prevent light from being incident on the TFT 60 from above the active matrix substrate 10L.

In FIG. 31B, a lower light shielding layer 16 provided below the TFT 60 is dotted so as to clearly show the position thereof. The lower light shielding layer 16 acts to prevent light from being incident on the TFT 60 from below the active matrix substrate 10L.

As shown in FIG. 31A, the upper light shielding layer 18 is provided so as to cover the first contact hole 27, the gate line 12, the signal line 13, a portion of the polycrystalline silicon (Si) layer 31, a portion of the additional capacitance electrode 37A, and a portion of the TFT 60.

As shown in FIG. 31B, the lower light shielding layer 16 is provided so as to cover a portion of the gate line 12, the signal line 13, the first contact hole 27, the second contact hole 28, the third contact hole 29a, the fourth contact hole 32a, the polycrystalline silicon (Si) layer 31, and the TFT 60.

Figure 32:
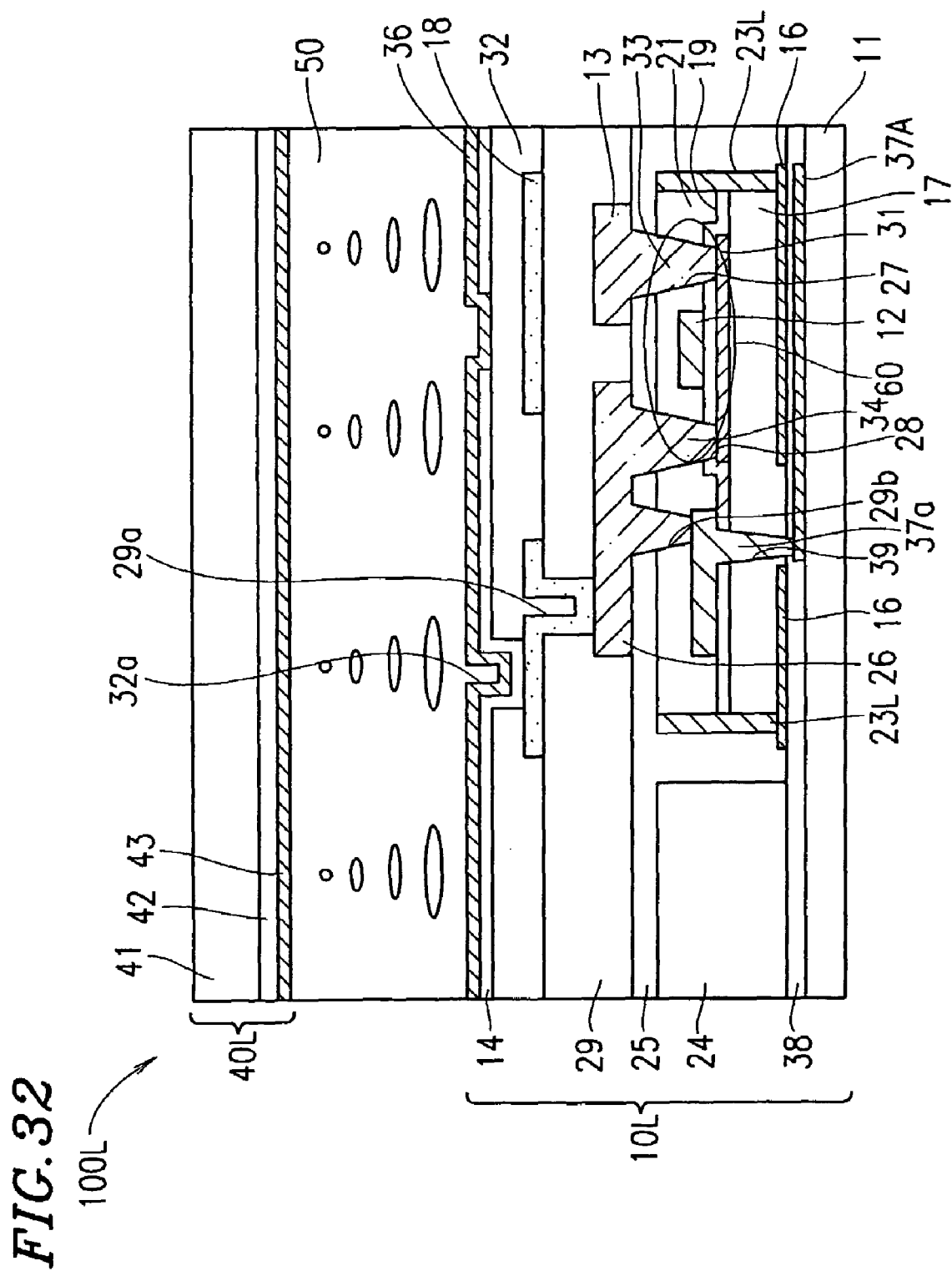
FIG. 32 is a schematic cross-sectional view of the liquid crystal display device shown in FIGS. 31A and 31B taken along line B—B of FIGS. 31A and 31B.

FIG. 32 is a schematic cross-sectional view of the liquid crystal display device 100L taken along line A—A of FIGS. 31A and 31B.

The liquid crystal display device 100L has substantially the same structure as that of the liquid crystal display device 100D described in the third example, except that a conductive portion 37a is provided in the fifth contact hole 39 and the connecting electrode 26 is connected to the additional capacitance electrode 37A via the conductive portion 37a.

FIGS. 33A through 33G are cross-sectional views illustrating steps for producing the active matrix substrate 10L of the liquid crystal display device 100L. The cross-sectional views of FIGS. 33A through 31G correspond to the cross-sectional view of FIG. 32.

The active matrix substrate 10L of the liquid crystal display device 100L is produced as follows.

First, on the transparent plate 11 formed of quartz glass (FIG. 33A), a polycrystalline silicon layer doped with P is formed to a thickness of, for example, 100 nm, and patterned as prescribed, thereby forming the additional capacitance electrode 37.

Then, the capacitance insulating layer 38 formed of SiO$_2$ is formed by, for example, CVD on the entire surface of the transparent plate 11 to a thickness of 50 nm so as to cover the additional capacitance electrode 37.

A polycrystalline silicon layer doped with P is formed thereon to a thickness of 50 nm, and a WSi layer is formed thereon to a thickness of 100 nm. These layers are patterned as prescribed, thereby forming the lower light shielding layer 16.

The first interlayer insulating layer 17 formed of SiO$_2$ is formed thereon by, for example, CVD to a thickness of 400 nm.

The polycrystalline silicon layer 31 is formed by, for example, CVD to a thickness of 50 nm on the resultant laminate in a prescribed pattern.

Figure 33A:
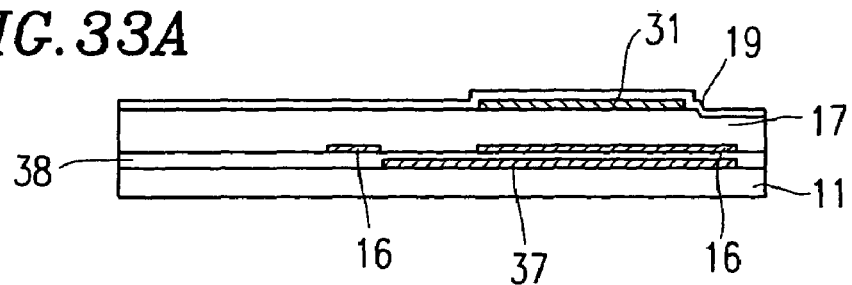

The second interlayer insulating layer (gate insulating layer) 19 formed of SiO$_2$ is formed by, for example, CVD on the resultant laminate to a thickness of 80 nm (FIG. 33A).

Figure 33B:
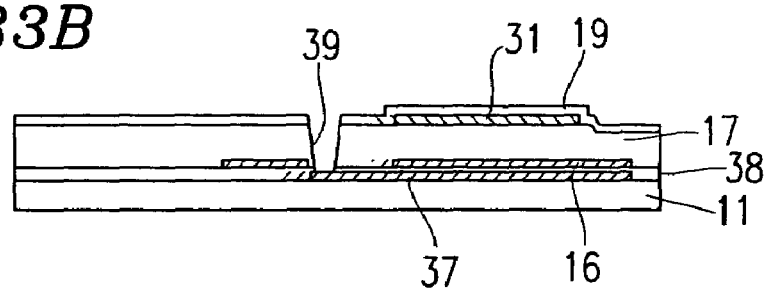

Then, as shown in FIG. 33B, the fifth contact hole 39 is formed in the second interlayer insulating layer 19, the first interlayer insulating layer 17, and the capacitance insulating layer 38, the fifth contact hole 39 reaching the additional capacitance electrode 37.

Figure 33C:
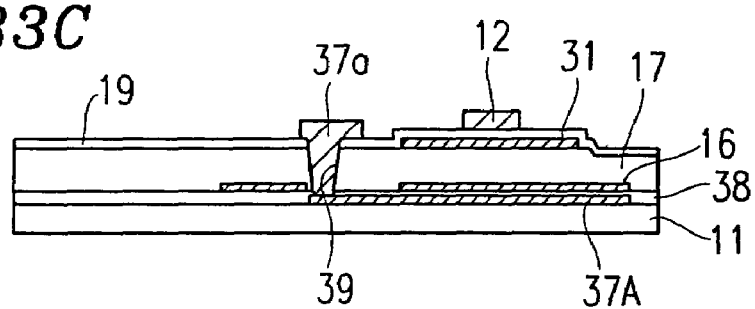

A polycrystalline silicon layer doped with P is formed on the resultant laminate to a thickness of 150 nm, and a WSi layer is formed to a thickness of 150 nm. These layers are patterned as prescribed. Thus, as shown in FIG. 33C, the gate line 12 is formed on the second interlayer insulating layer 19, and the conductive portion 37a is formed in the fifth contact hole 39. The conductive portion 37a is connected to the additional capacitance electrode 37.

Thereafter, the liquid crystal display device 100L is formed in the same manner as the liquid crystal display device 100 described in the first example.

More specifically, impurities are implanted into the polycrystalline silicon layer 31 used as a part of the TFT 60. Then, an $SiO_2$ layer is formed by plasma CVD on the resultant laminate and patterned as prescribed, thereby forming the third interlayer insulating layer 21.

Next, a polycrystalline silicon layer and a WSi layer are formed on the resultant laminate and patterned, thereby forming side light shielding layers 23L on the side edges of the lower light shielding layer 16.

The dummy insulating layers 24 are formed on the resultant laminate in a prescribed pattern.

Figure 33D:
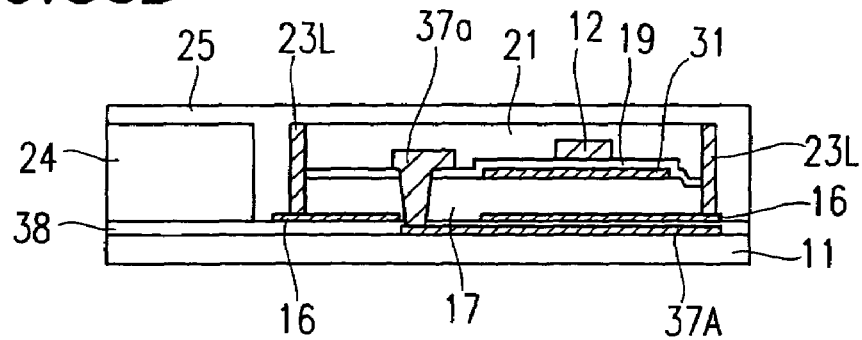

Then, the fourth interlayer insulating layer 25 having a flat surface is formed on the resultant laminate (FIG. 33D).

As shown in FIG. 33E, the first contact hole 27 and the second contact hole 28 are formed so as to expose the source region 31b and the drain region 31c of the polycrystalline silicon layer 31. The sixth contact hole 29b is formed so as to expose the conductive portion 37a connected to the additional capacitance electrode 37.

Then, as shown in FIG. 33F, a conductive layer is formed on the resultant laminate, thereby forming the source electrode 33 in the first contact hole 27 and the drain electrode 34 in the second contact hole 28. Then, a conductive layer is formed on the resultant laminate, thereby forming a conductive portion connected to the conductive portion 37a in the sixth contact hole 29b, the signal line 13 connected to the source electrode 33, and the connecting electrode 26 connected to the drain electrode 34 and the conductive portion in the sixth contact hole 29b.

As shown in FIG. 33G, the fifth interlayer insulating layer 29 is formed by plasma CVD, and the third contact hole 29a reaching the connecting electrode 26 is formed in the fifth interlayer insulating layer 29.

A conductive layer is formed by, for example, vapor deposition or sputtering on the resultant laminate and patterned, thereby forming the upper light shielding layer 18 connected to the connecting electrode 26. The upper light shielding layer 18 is conductive.

The sixth interlayer insulating layer 32 is formed by plasma CVD on the resultant laminate, and then the fourth contact hole 32a reaching the conductive upper light shielding layer 18 is formed in the sixth interlayer insulating layer 32.

An ITO layer is formed on the entire surface of the resultant laminate, and patterned as prescribed, thereby forming the plurality of pixel electrodes 14 which are arranged in a matrix.

Then, as in the first example, the alignment layer 36 is formed on the sixth interlayer insulating layer 32 so as to cover all the pixel electrodes 14. Thus, the active matrix substrate 10L is produced.

The active matrix substrate 10L and the counter substrate 40 are located such that the alignment layers 36 and 43 thereof are opposed to each other with a prescribed distance therebetween. The liquid crystal layer 50 is provided between the alignment layers 36 and 43. Thus, the liquid crystal display device 100L is produced.

In the seventh example, the side light shielding layers 23L are provided so as to cover the side surfaces of the polycrystalline silicon layer 31 and the gate line 12 provided above the polycrystalline silicon layer 31. The present invention is not limited to such a structure. The side light shielding layer may be provided so as to also cover the side surfaces of the signal line 13 provided above the polycrystalline silicon layer 31.

Figure 34:
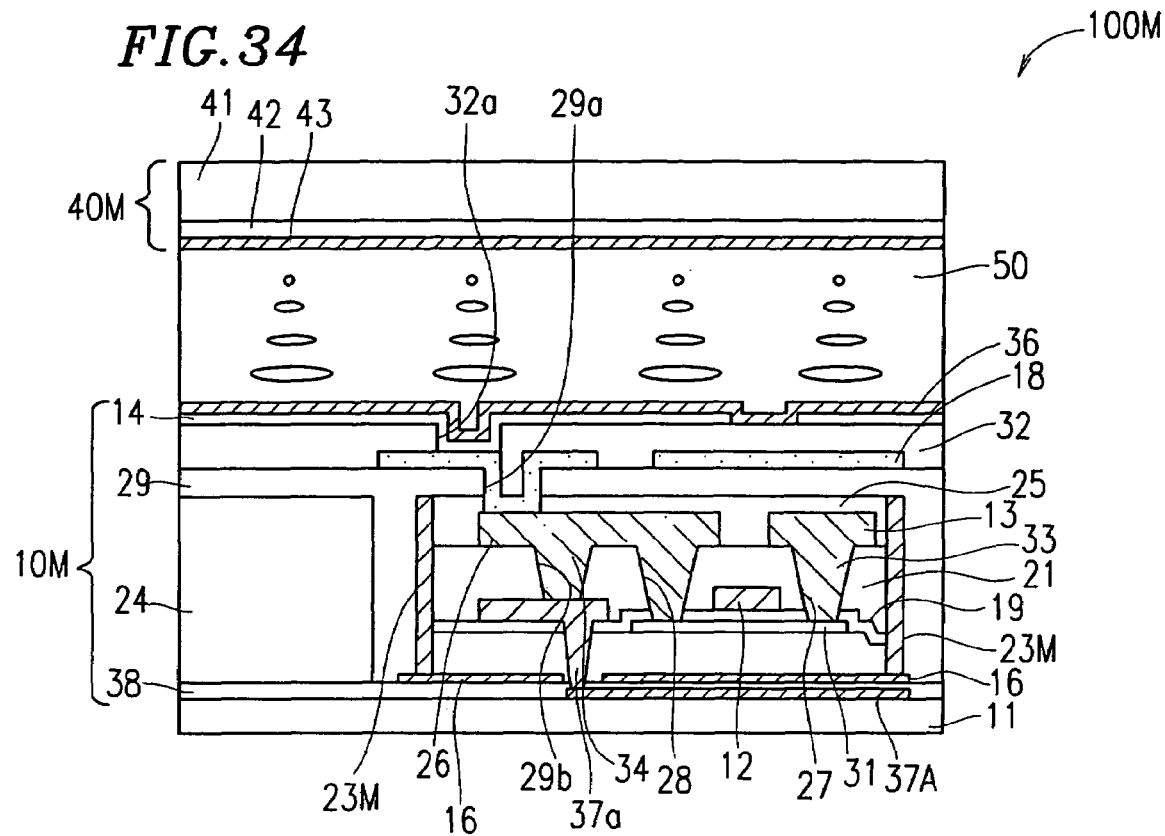
FIG. 34 is a schematic cross-sectional view of a liquid crystal display device as a modification of the seventh example of the present invention.

FIG. 34 is a schematic cross-sectional view of a liquid crystal display device 100M as a modification of the seventh example of the present invention. FIG. 34 corresponds to FIG. 32.

As shown in FIG. 34, the liquid crystal display device 100M has substantially the same structure as that of the liquid crystal display device 100L described with reference to FIGS. 31A through 33G, except that side light shielding layers 23M cover the side surfaces of the signal line 13 provided above the polycrystalline silicon layer 31 in addition to the side surfaces of the polycrystalline silicon layer 31 and the gate line provided above the polycrystalline silicon layer 31.

EXAMPLE 8

In the first through seventh examples, the upper light shielding layer is provided in the active matrix substrate. The present invention is not limited to such a structure. The upper light shielding layer may be provided in the counter substrate.

In an eight example of the present invention, a liquid crystal display device in which the upper light shielding layer is provided in the counter substrate will be described.

FIG. 35 is a schematic cross-sectional view of a liquid crystal display device 100N in the eighth example.

The liquid crystal display device 100N has substantially the same structure as that of the liquid crystal display device 100 described in the first example, except that an upper light shielding layer 44 is provided in a counter substrate 40N instead of in an active matrix substrate 10N.

The upper light shielding layer 44 is provided so as to cover the signal line 13, the gate line 12 and the capacitance electrode 15. The upper light shielding layer 44 does not need to be conductive.

Each of the pixel electrodes 14 provided on the sixth interlayer insulating layer 32 of the active matrix substrate 10N is directly connected to the connecting electrode 26 via the contact hole 32b formed in the sixth interlayer insulating layer 32 and the fifth interlayer insulating layer 29.

EXAMPLE 9

In the first through eighth examples, the TFT is n-type and has a general LDD structure as shown in FIG. 4. The present invention is not limited to such a structure.

The TFT may have a multi-gate LDD structure having at least two gate lines (gate electrodes).

Figure 36A:
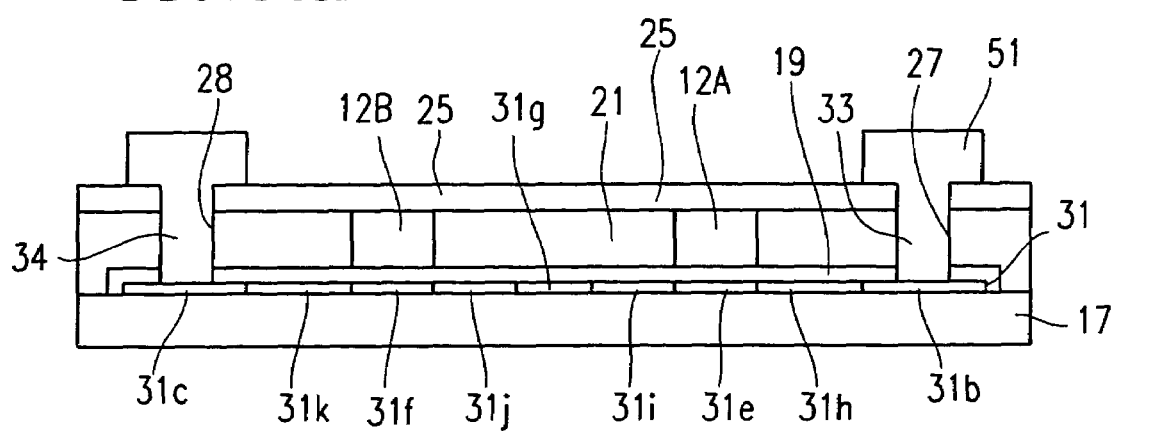
FIGS. 36A and 36B are schematic cross-sectional views illustrating a structure of a TFT included in a liquid crystal display device according to a ninth example of the present invention.

FIG. 36A is a schematic cross-sectional view of a TFT 60A of a multi-gate LDD structure having gate lines 12A and 12B in a ninth example of the present invention.

In the TFT 60A, the polycrystalline silicon layer 31 includes a source region 31b, a drain region 31c, a first channel region 31e located immediately below the gate line 12A, a second channel region 31f located immediately below the gate line 12B, a heavily doped drain region (N⁺) 31g located between the gate line 12A and the gate line 12B, an LDD region (N⁻) 31h located between the source region 31b and the first channel region 31e, an LDD region (N⁻) 31i located between the first channel region 31e and the heavily doped region (N⁺) 31g, an LDD region (N⁻) 31J located between the heavily doped region (N⁺) 31g and the second channel region 31f, and an LDD region (N⁻) 31k located between the second channel region 31f and the drain region 31c.

In the multi-gate type TFT 60A having such a structure, the leak current is reduced as compared to a TFT having one gate line.

Figure 36B:
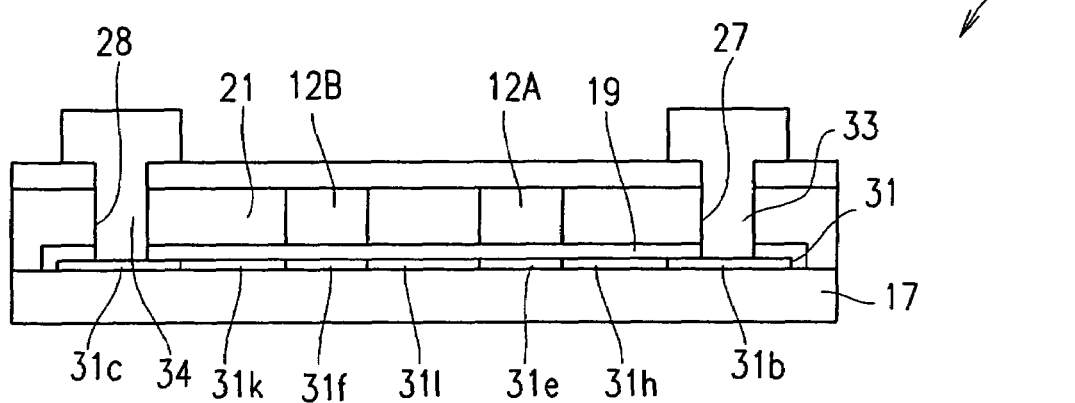
Figure 37A:
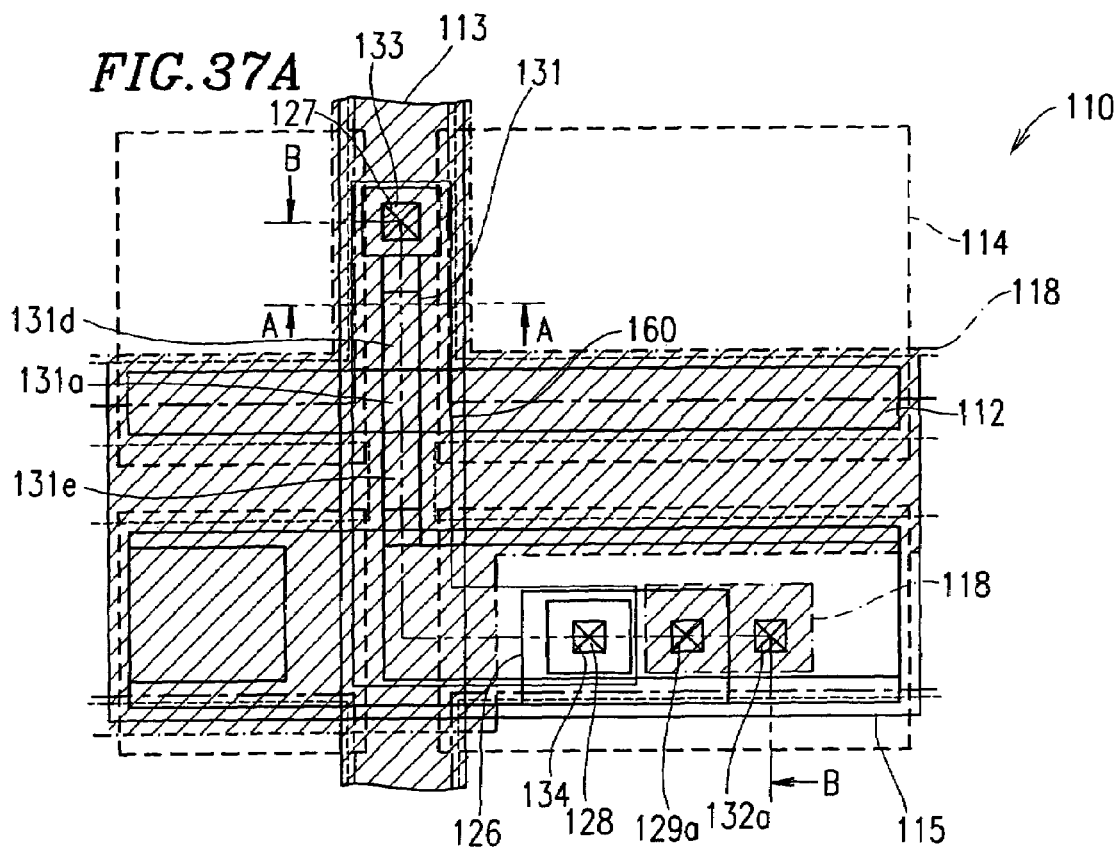
FIGS. 37A and 37B are each a schematic plan view of a portion of an active matrix substrate of a conventional liquid crystal display device, where one gate line and one signal line cross each other.
Figure 37B:
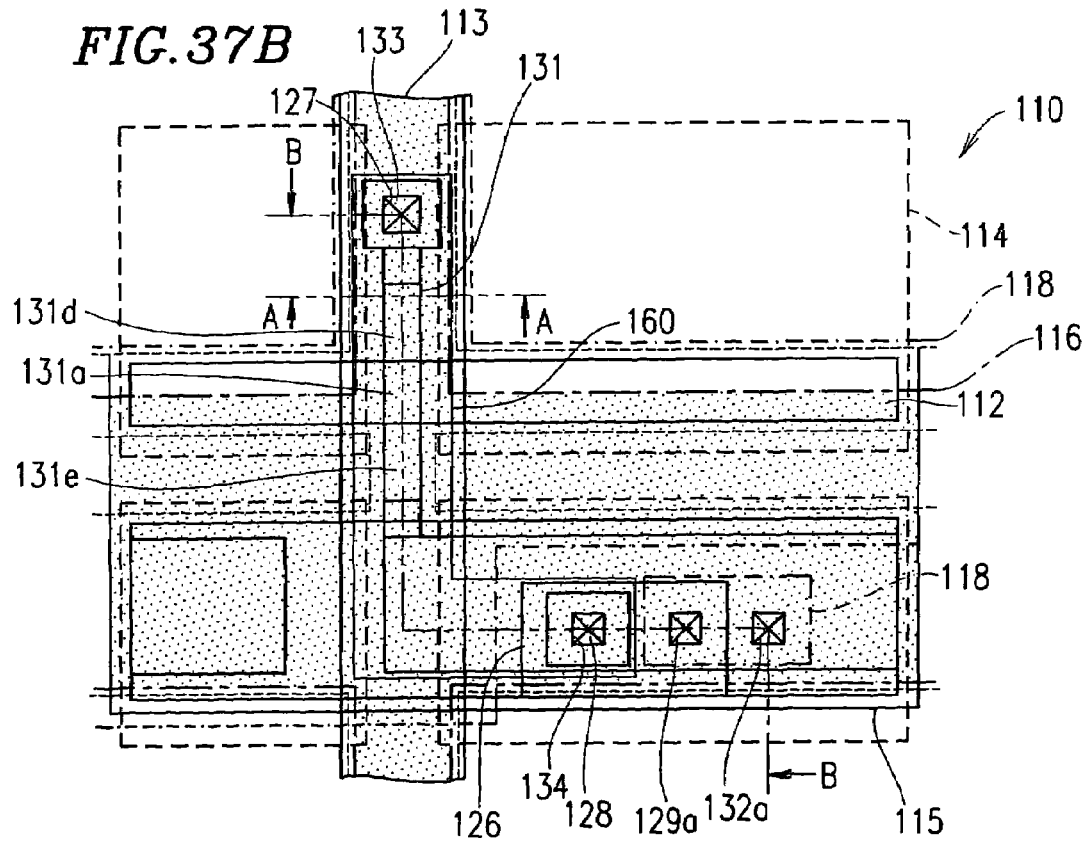
Figure 38:
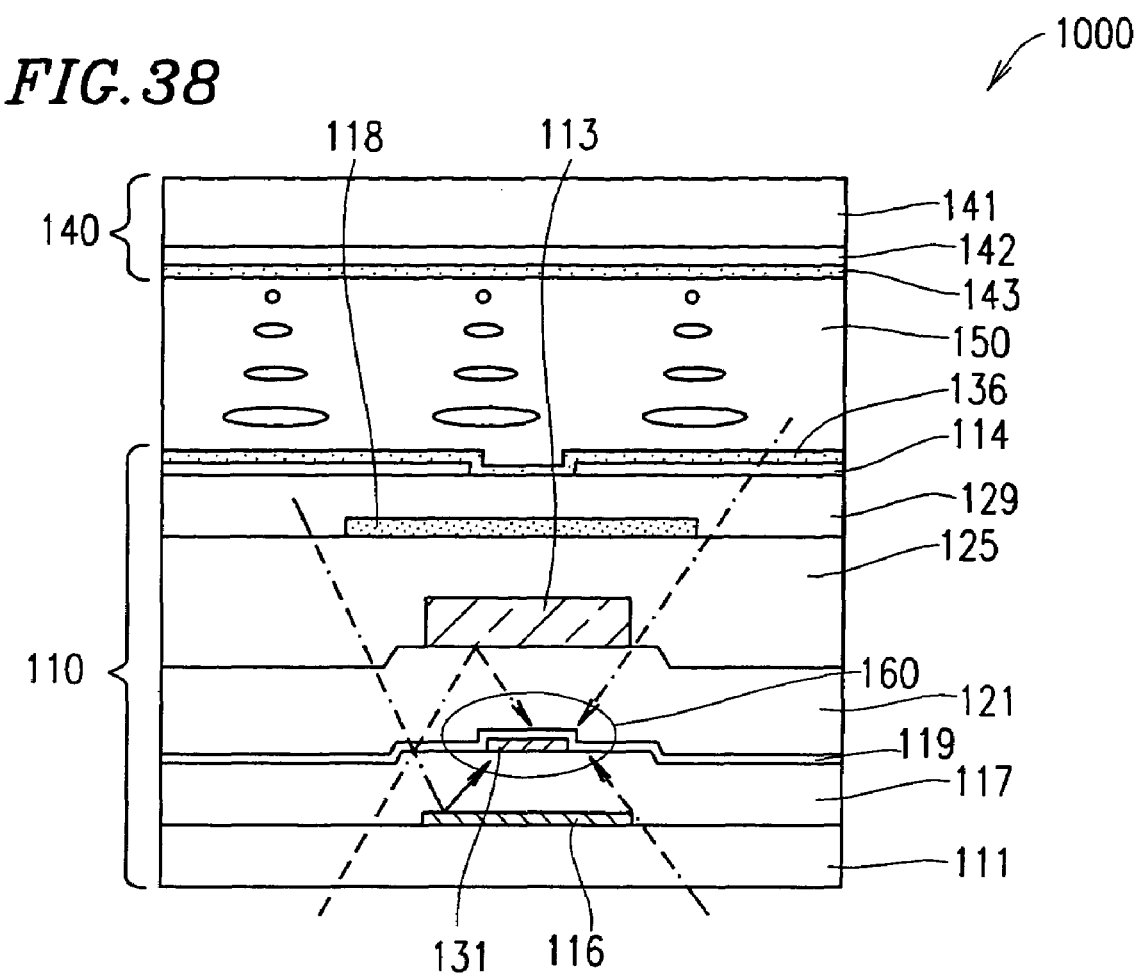
FIG. 38 is a schematic cross-sectional view of the liquid crystal display device shown in FIGS. 37A and 37B taken along line A—A of FIGS. 37A and 37B.
Figure 39:
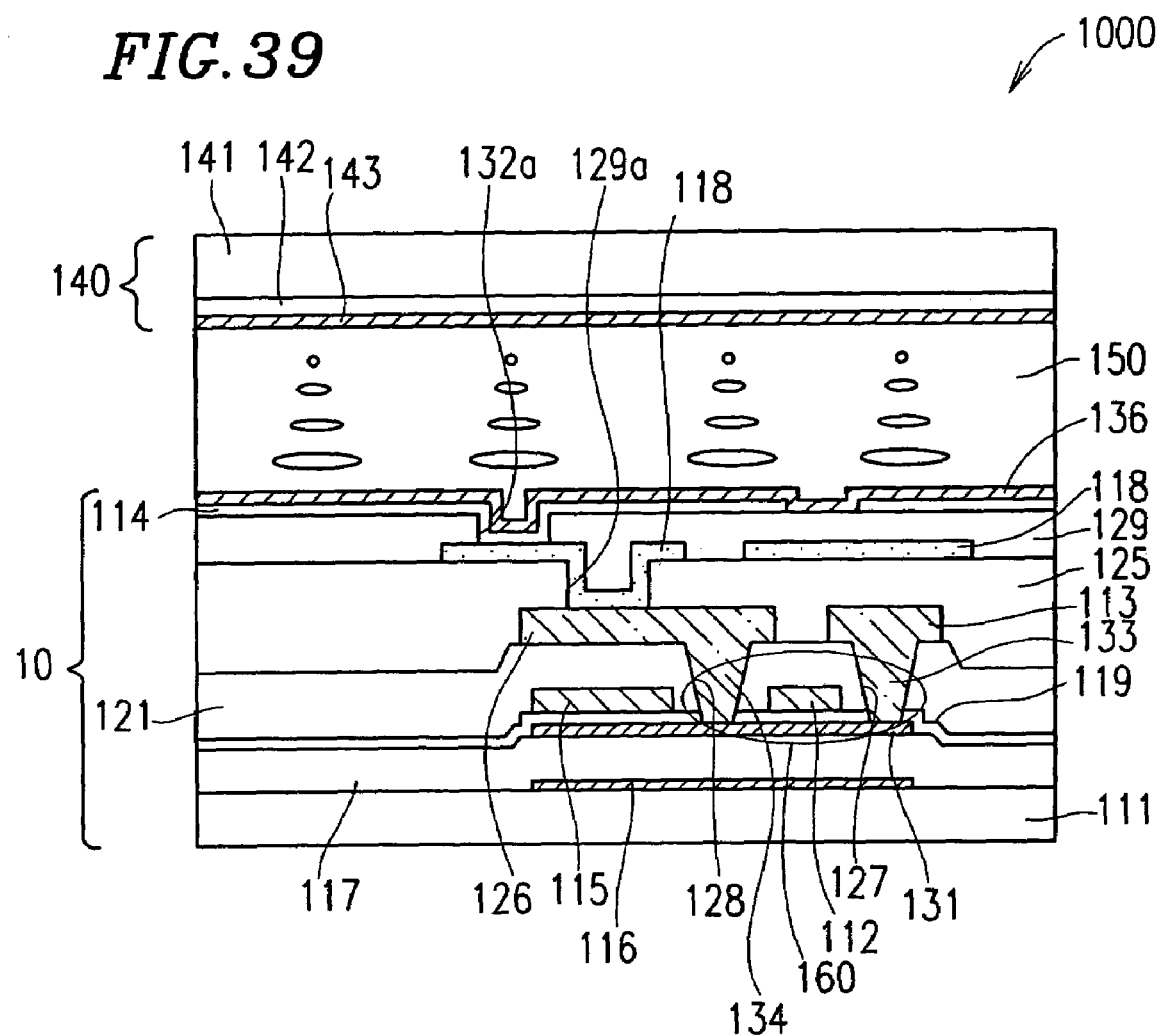
FIG. 39 is a schematic cross-sectional view of the liquid crystal display device shown in FIGS. 37A and 37B taken along line B—B of FIGS. 37A and 37B.

FIG. 36B is a schematic cross-sectional view of another TFT 60B of a multi-gate LDD structure having gate lines 12A and 12B according to the present invention.

In the TFT 60B, the polycrystalline silicon layer 31 includes a source region 31b, a drain region 31c, a first channel region 31e located immediately below the gate line 12A, a second channel region 31f located immediately below the gate line 12B, an LDD region (N⁻) 31h located between the source region 31b and the first channel region 31e, an LDD region (N⁻) 311 located between the first channel region 31e and the second channel region 31f, and an LDD region (N⁻) 31k located between the second channel region 31f and the drain region 31c.

In the multi-gate type TFT 60B having such a structure, the leak current is reduced as compared to a TFT having one gate line.

In either structure, the TFT of an LDD structure may be p-type instead of n-type.

In the first through ninth examples, the base plate of the active matrix substrate (for example, the plate 11) is transparent. The present invention is not limited to such a structure. In a liquid crystal display device of a reflection type, the base plate of the active matrix substrate does not need to be transparent.

As described above, a liquid crystal display device according to the present invention includes a side light shielding layer. Therefore, light is prevented from being obliquely or laterally incident on the TFT with certainty. As a result, the light leak current of the TFT can be significantly reduced. Especially in a liquid crystal display device used for a projector apparatus using a high intensity of light, superb display quality is provided without deterioration due to reduction in contrast, crosstalk or the like occurring by the light leak current.

The present invention also provides a method for producing such a liquid crystal display device easily and with certainty.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A liquid crystal display device, comprising:
   an active matrix substrate;
   a counter substrate; and
   a liquid crystal layer interposed between the active matrix substrate and the counter substrate, wherein the active matrix substrate includes:
   a plate;
   a thin film transistor provided on the plate; and
   a side light shielding layer for covering at least a portion of a side surface of the thin film transistor and side surfaces of first, second and third interlayer insulating layers,
   wherein the side light shielding layer is substantially vertically oriented,
   wherein a top surface of a dummy insulating layer is substantially at the same level as a top surface of the third interlayer insulating layer with a fourth interlayer insulating layer provided between the dummy insulating layer and the side light shielding layer.

2. A liquid crystal display device according to claim 1, wherein the active matrix substrate further includes a semiconductor layer, and the thin film transistor includes a part of the semiconductor layer.

3. A liquid crystal display device according to claim 2, wherein:
   the active matrix substrate further includes an insulating layer provided on the plate and having a stepped portion having a side wall substantially perpendicular to the plate;
   the semiconductor layer is provided on the stepped portion of the insulating layer; and
   the side light shielding layer is provided along the side wall of the stepped portion of the insulating layer.

4. A liquid crystal display device according to claim 1, wherein:
   the thin film transistor includes a gate electrode, a source electrode, and a drain electrode, and
   the active matrix substrate further includes a pixel electrode, a gate line acting as the gate electrode of the thin film transistor, and a signal line connected to the source electrode of the thin film transistor.

5. A liquid crystal display device according to claim 4, wherein the side light shielding layer is provided so as to cover a side surface of the gate line.

6. A liquid crystal display device according to claim 4, wherein the side light shielding layer is provided so as to cover a side surface of the signal line.

7. A liquid crystal display device according to claim 1, wherein the active matrix substrate further includes a lower light shielding layer provided below the thin film transistor.

8. A liquid crystal display device according to claim 7, wherein the side light shielding layer is in contact with the lower light shielding layer.

9. A liquid crystal display device according to claim 7, wherein the active matrix substrate further includes an additional capacitance electrode.

10. A liquid crystal display device according to claim 9, wherein the additional capacitance electrode is provided below the lower light shielding layer.

11. A liquid crystal display device according to claim 9, wherein the additional capacitance electrode is provided between the lower light shielding layer and the thin film transistor.

12. A liquid crystal display device according to claim 9, wherein the additional capacitance electrode is connected to the thin film transistor.

13. A liquid crystal display device according to claim 9, wherein the side light shielding layer is in contact with the additional capacitance electrode.

14. A liquid crystal display device according to claim 1, wherein the active matrix substrate further includes an upper light shielding layer provided on the thin film transistor.

15. A liquid crystal display device according to claim 1, wherein the thin film transistor has an LDD structure.

16. A liquid crystal display device according to claim 1, wherein the side light shielding layer is formed of polycrystalline silicon.

17. A liquid crystal display device according to claim 1, wherein the side light shielding layer is formed of metal or metal silicide.

18. A liquid crystal display device according to claim 1, wherein the side light shielding layer has a two-component structure including metal or metal silicide and polycrystalline silicon.

19. A method for producing a liquid crystal display device including an active matrix substrate, a counter substrate, and a liquid crystal layer interposed between the active matrix substrate and the counter substrate, the method comprising:
  forming a thin film transistor on a plate of the active matrix substrate;
  forming a side light shielding layer for covering at least a portion of a side surface of the thin film transistor and side surfaces of first, second and third interlayer insulating layers, wherein the side light shielding layer is substantially vertically oriented, and
  forming a top surface of a dummy insulating layer at substantially the same level as a top surface of the third interlayer insulating layer with a fourth interlayer insulating layer formed between the dummy insulating layer and the side light shielding layer.

20. A method according to claim 19, wherein the step of forming the thin film transistor includes the step of forming a semiconductor layer used as a part of the thin film transistor.

21. A method according to claim 20, further comprising the step of forming a first insulating layer on the plate, the first insulating layer having a stepped portion having a side wall substantially perpendicular to the plate, wherein:
  the step of forming the semiconductor layer includes the step of forming the semiconductor layer on the stepped portion of the first insulating layer, and
  the step of forming the side light shielding layer includes the step of forming the side light shielding layer along the side wall of the stepped portion of the first insulating layer.

22. A method according to claim 21, wherein the step of forming the side light shielding layer includes the steps of forming a layer of a material of the side light shielding layer so as to cover the stepped portion of the first insulating layer, and partially removing the layer by dry etching.

23. A method according to claim 21, further comprising the steps of forming a second insulating layer on the semiconductor layer, and flattening a surface of the second insulating layer before the stepped portion of the first insulating layer is formed.

24. A method according to claim 23, wherein the step of flattening the surface of the second insulating layer includes the step of flattening the second insulating layer by chemical mechanical polishing.

25. A liquid crystal display device, comprising:
  an active matrix substrate;
  a counter substrate; and
  a liquid crystal layer interposed between the active matrix substrate and the counter substrate, wherein the active matrix substrate includes:
  a plate;
  a thin film transistor provided on the plate; and
  a side light shielding layer for covering at least a portion of a side surface of the thin film transistor, wherein in an area of the transistor the side light shielding layer is provided along and directly contacts sidewalls of first, second and third insulating films which are deposited in different steps;
  wherein a top surface of a dummy insulating layer is substantially at the same level as a top surface of the third interlayer insulating film, with a fourth interlayer insulating film provided between the dummy insulating layer and the side light shielding film.

26. The display device of claim 25, wherein the side light shielding layer is substantially vertically oriented.

* * * * *